(12) United States Patent
Nickerson et al.

(10) Patent No.: US 12,056,571 B2
(45) Date of Patent: Aug. 6, 2024

(54) METHODS AND DEVICES FOR OBTAINING QUANTUM CLUSTER STATES WITH HIGH FAULT TOLERANCE BASED ON NON-CUBICAL UNIT CELLS

(71) Applicant: PSIQUANTUM CORP., Palo Alto, CA (US)

(72) Inventors: Naomi Nickerson, Palo Alto, CA (US); Hector Bombin Palomo, Palo Alto, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 882 days.

(21) Appl. No.: 16/979,829

(22) PCT Filed: Mar. 11, 2019

(86) PCT No.: PCT/US2019/021711
§ 371 (c)(1),
(2) Date: Sep. 10, 2020

(87) PCT Pub. No.: WO2019/178009
PCT Pub. Date: Sep. 19, 2019

(65) Prior Publication Data
US 2021/0027188 A1 Jan. 28, 2021

Related U.S. Application Data

(60) Provisional application No. 62/641,404, filed on Mar. 11, 2018, provisional application No. 62/739,021, (Continued)

(51) Int. Cl.
*G06N 10/00* (2022.01)
*B82Y 10/00* (2011.01)
*G06F 18/232* (2023.01)

(52) U.S. Cl.
CPC .............. *G06N 10/00* (2019.01); *B82Y 10/00* (2013.01); *G06F 18/232* (2023.01)

(58) Field of Classification Search
CPC ....... G06N 10/00; B82Y 10/00; G06F 18/232; H10N 60/12; H01L 29/66977
See application file for complete search history.

(56) References Cited

U.S. PATENT DOCUMENTS 6,437,413 B1    8/2002   Yamaguchi et al.
6,472,681 B1   10/2002   Kane
(Continued)

FOREIGN PATENT DOCUMENTS

JP            5437634 B2    3/2014
WO   WO 2017/189053 A1   11/2017

OTHER PUBLICATIONS

Kubica, Aleksander Marek. "The ABCs of the color code: A study of topological quantum codes as toy models for fault-tolerant quantum computation and quantum phases of matter." PhD diss., California Institute of Technology, 2018. (Year: 2018).*
(Continued)

*Primary Examiner* — Oluwatosin Alabi
(74) *Attorney, Agent, or Firm* — Morgan, Lewis & Bockius LLP

(57) ABSTRACT

A method includes obtaining a first qubit entangled with second, third, fourth, fifth, sixth, and seventh qubits and one or more of: an eighth qubit entangled with the second qubit and the seventh qubit; a ninth qubit entangled with the third qubit and the fourth qubit; a tenth qubit entangled with the fifth qubit and the sixth qubit; an eleventh qubit entangled with the eighth qubit and the ninth qubit; a twelfth qubit entangled with the eighth qubit and the ninth qubit; a thirteenth qubit entangled with the eighth qubit and the tenth qubit; a fourteenth qubit entangled with the eighth qubit and the tenth qubit; a fifteenth qubit entangled with the ninth
(Continued)

qubit and the tenth qubit; and a sixteenth qubit entangled with the ninth qubit and the tenth qubit. Also disclosed are additional methods of obtaining a plurality of entangled qubits.

16 Claims, 39 Drawing Sheets

Related U.S. Application Data filed on Sep. 28, 2018, provisional application No. 62/748,220, filed on Oct. 19, 2018.

(56) References Cited

U.S. PATENT DOCUMENTS

| | | | |
|---|---|---|---|
| 7,346,246 | B2 | 3/2008 | Munro |
| 7,554,080 | B2 | 6/2009 | Munro et al. |
| 7,667,995 | B1 | 2/2010 | Leuenberger |
| 9,178,154 | B2 | 11/2015 | Bunyk |
| 10,248,491 | B1 * | 4/2019 | Zeng ..................... G06N 10/00 |
| 10,352,992 | B1 * | 7/2019 | Zeng ..................... G06N 10/00 |
| 10,578,891 | B1 | 3/2020 | Schmeing et al. |
| 11,126,062 | B1 | 9/2021 | Kieling et al. |
| 11,475,347 | B1 | 10/2022 | Rudolph et al. |
| 11,501,198 | B1 | 11/2022 | Birchall et al. |
| 11,543,731 | B1 | 1/2023 | Kieling et al. |
| 2003/0055513 | A1 | 3/2003 | Raussendorf et al. |
| 2005/0133780 | A1 | 6/2005 | Azuma |
| 2007/0252081 | A1 | 11/2007 | Munro et al. |
| 2008/0218519 | A1 * | 9/2008 | Coury .................. G06T 11/206 |
| | | | 345/440 |
| 2014/0126030 | A1 | 5/2014 | Crespi et al. |
| 2015/0214984 | A1 | 7/2015 | Ahn et al. |
| 2016/0292586 | A1 | 10/2016 | Rigetti et al. |
| 2017/0061317 | A1 | 3/2017 | Chow et al. |
| 2017/0082494 | A1 | 3/2017 | Hughes et al. |
| 2018/0114138 | A1 * | 4/2018 | Monroe ................. G06F 15/76 |
| 2019/0244128 | A1 | 8/2019 | Choi |
| 2020/0044749 | A1 | 2/2020 | Rauschenbach et al. |
| 2020/0134502 | A1 | 4/2020 | Anschuetz et al. |
| 2020/0160204 | A1 | 5/2020 | Johnson et al. |
| 2020/0401927 | A1 | 12/2020 | Nickerson et al. |
| 2021/0105135 | A1 | 4/2021 | Figueroa et al. |
| 2021/0295196 | A1 | 9/2021 | Gimeno-Segovia et al. |

OTHER PUBLICATIONS

Campbell ET, Terhal BM, Vuillot C. Roads towards fault-tolerant universal quantum computation. Nature. Sep. 14, 2017;549(7671):172-9. (Year: 2017).*
Nautrup HP, Wei TC. Symmetry-protected topologically ordered states for universal quantum computation. Physical Review A. Nov. 9, 2015;92(5):052309. (Year: 2015).*
Kieling, Notice of Allowance, U.S. Appl. No. 16/691,459, May 3, 2021, 9 pgs.
PSIQuantum Corp., International Preliminary Report on Patentability, PCT/US2019/023756, Sep. 29, 2020, 8 pgs.
PSIQuantum Corp., International Preliminary Report on Patentability, PCT/US2019/045563, Feb. 9, 2021, 9 pgs.
PSIQuantum Corp., International Search Report and Written Opinion, PCT/US2019/023756, Jul. 29, 2019, 11 pgs.
Ying, "Entangled Many-body States as Resources of Quantum Information Processing." Jul. 23, 2013 (Jul. 23, 2013) Retrieved on Jun. 9, 2019 (Jun. 9, 2019) from http://www.nsx0.quantumlah.org/media/thesis/CQT_130723_LiYing.pdf entire document.
PSIQuantum Corp., International Search Report and Written Opinion, PCT/US2019/021241, Jul. 2, 2019, 13 pgs.
Fowler, A.G. and Goyal, "Topological cluster state quantum computing." arXiv:0805.3202v2 (quant-ph), available online: Feb. 25, 2009 (Feb. 25, 2009), Fig 1, 1a, section 1, 11 (online) URL https://pdfs.semanticscholar.org/f1d0/5ccb2ad6d3a61e20c0888c49fca3c8a50a4c.pdf.
PSIQuantum Corp., International Search Report and Written Opinion, PCT/US2019/21711, Jul. 22, 2019, 17 pgs.
Browne, Resource-efficient linear optical quantum computation, QOLS, Blackett Laboratory, Imperial College London, Feb. 9, 2005, 5 pgs.
Gimeno-Segovia, Mercedes, From three-photon GHZ states to ballistic universal quantum computation, Phys. Rev. Lett. 115, 020502, Jul. 8, 2015, 6 pgs.
Pant, Percolation Thresholds for Photonic Quantum, Computing, Cornell University, Quantum Physics, Jan. 13, 2017, 14 pgs.
PSIQuantum Corp., International Preliminary Report on Patentability, PCT/US2019/021711, Sep. 15, 2020, 14 pgs.
PSIQuantum Corp., International Preliminary Report on Patentability, PCT/US2019/021241, Sep. 8, 2020, 10 pgs.
PSIQuantum Corp., International Search Report / Written Opinion, PCT/US2019/045563, Oct. 25, 2019, 3 pgs.
Caspani et al. "Integrated Sources of Photon Quantum States Based on Nonlinear Optics." In:Light; Science & Applications 6.11.Nov. 17, 2017 (Nov. 17, 2017) Retrieved on Oct. 7, 2019 (Oct. 7, 2019) from <https://www.nature.com/articles/lsa2017100.pdf> entire document.
Dusek. "Discrimination of the Bell States of Qudits by means of linear optics." In: Optics Communications 199. 1-4, Jul. 23, 2001 (Jul. 23, 2001) Retrieved on Oct. 7, 2019 (Oct. 7, 2019) from <https://arxiv.org/pdf/quant-ph/0107119.pdf> entire document.
Cao et al., "Generation of Atomic Entangled States Using Linear Optics." In: arXiv, Preprint quant-ph/0311086, Nov. 13, 2003 (Nov. 13, 2003) Retrieved on Oct. 7, 2019 (Oct. 7, 2019) from <https://arxiv.org/ftp/quant-ph/papers/0311/0311086.pdf> entire document.
Schon et al. "Sequential Generation of Entangled Multiqubit States." In: Physical Review Letter, Jan. 18, 2005, (Jan. 18, 2005) Retrieved on Oct. 7, 2019, (Oct. 7, 2019) from <https://arxiv.org/pdf/quant-ph/0501096.pdf> entire document.
Fowler, A.G., Topological cluster state quantum computing, Physics, Computer Science, Mathematics, Quantum Inf. Comput., Feb. 25, 2009, https://www.semanticscholar.org/paper/Topological-cluster-state-quantum-computing-Fowler-Goyal/f1d05ccb2ad6d3a61e20c0888c49fca3c8a50a4c?p2df, 12 pgs.
PSIQuantum Corp., International Search Report and Written Opinion, PCT/US2019/021711, Jul. 22, 2019,17 pgs.
Nickerson et al., Non-Final Office Action, U.S. Appl. No. 17/266,076, Dec. 20, 2023, 22 pgs.
Gimeno-Segovia, Notice of Allowance, U.S. Appl. No. 16/621,994, Mar. 30, 2022, 11 pgs.
Rudolph, Notice of Allowance, U.S. Appl. No. 16/689,964, May 12, 2022, 10 pgs.
Kieling et al., Notice of Allowance, U.S. Appl. No. 16/691,450, Jun. 15, 2022, 12 pgs.
Gimeno-Segovia et al., Notice of Allowance, U.S. Appl. No. 17/849,440, Apr. 7, 2023, 11 pgs.
Nickerson et al., Non-Final Office Action, U.S. Appl. No. 17/013,192, Aug. 31, 2023, 86 pgs.
Paler et al., "Mapping of Topological Quantum Circuits to Physical Hardware", Scientific Reports, University of Passau, Innstr. 43, 94032 Passau, Germany; National Institute of Informatics, 2-1-2 Hitotsubashi, Chiyoda-ku, Tokyo, 101-8430, Japan, Accepted Mar. 18, 2014, Published Apr. 11, 2014, 10 pgs. https://doi.org/10.1038/srep04657.
Héctor Bombín, "An Introduction to Topological Quantum Codes", Quantum Physics, Perimeter Institute for Theoretical Physics, 31 Caroline St. N., Waterloo, ON, N2L 2Y5, Canada, Nov. 1, 2013, 35 pgs. https://doi.org/10.48550/arXiv.1311.0277.
Stephen S Bullock et al., "Qudit surface codes and gauge theory with finite cyclic groups", Journal of Physics A: Mathematical and Theoretical, vol. 40, No. 13, Published Mar. 14, 2007, 26 pgs. DOI 10.1088/1751-8113/40/13/013.
Nikolas P Breuckmann et al., "Hyperbolic and semi-hyperbolic surface codes for quantum storage", Quantum Science and Technology, vol. 2, No. 3, Published Aug. 2, 2017, 21 pgs. DOI 10.1088/2058-9565/aa7d3b.

(56) References Cited

OTHER PUBLICATIONS

R Raussendorf et al., "Topological fault-tolerance in cluster state quantum computation", New Journal of Physics, The open-access journal for physics, Published Jun. 29, 2007, 25 pgs. doi:10.1088/1367-2630/9/6/199.
Aleksander Kubica et al., "Three-Dimensional Color Code Thresholds via StatisticalMechanical Mapping", Phys. Rev. Lett. 120, 180501—Published May 4, 2018, 7 pgs. DOI: 10.1103/PhysRevLett.120.180501.
Nickerson et al., Non-Final Office Action, U.S. Appl. No. 17/971,368, Sep. 1, 2023, 9 pgs.

\* cited by examiner

1000

1010 Obtain a plurality of entangled qubits represented by a lattice structure.

1020 Obtaining the plurality of entangled qubits includes fusing (i) at least one qubit of a first set of multiple entangled qubits and (ii) at least one qubit of a second set of multiple entangled qubits. The second set of multiple entangled qubits is mutually exclusive to the first set of multiple entangled qubits.

1030 Receive a first set of entangled qubits, including a first center qubit entangled with three or more peripheral qubits. Receive a second set of entangled qubits, including a second center qubits entangled with three or more peripheral qubits. The second set of entangled qubits is mutually exclusive to the first set of entangled qubits. Fuse each peripheral qubit of the first set of entangled qubits with a respective peripheral qubit of the second set of entangled qubits.

1110 Obtain a plurality of entangled qubits represented by a lattice structure. The lattice structure includes a plurality of contiguous lattice cells.

1120 A particular lattice cell includes ten distinct vertices

1130 A particular lattice cell includes fourteen distinct vertices

1140 A respective set of contiguous lattice cells having eight sets of vertices. Each set of vertices of the eight sets of vertices has one or more vertices.

1150 At least one set of vertices of the eight sets of vertices has two or more vertices.

1152 At least one set of vertices of the eight sets of vertices has three or more vertices.

1154 At least one set of vertices of the eight sets of vertices has four or more vertices.

1160 The eight sets of vertices define one or more additional faces that are distinct from six faces 1162 The eight sets of vertices define a seventh face distinct from the six faces 1164 The eight sets of vertices also define an eighth face and a ninth face that are distinct from the seven faces 1166 The eight sets of vertices define four or more additional faces distinct from the six faces

1210 Obtain a plurality of qubits, including a first qubit entangled with second, third, fourth, fifth, sixth, and seventh qubits. The plurality of qubits also includes one or more of: an eighth qubit entangled with at least one of the second qubit and the seventh qubit; a ninth qubit entangled with at least one of the third qubit and the fourth qubit; a tenth qubit entangled with at least one of the fifth qubit and the sixth qubit; an eleventh qubit entangled with at least one of the eighth qubit and the ninth qubit; a twelfth qubit entangled with at least one of the eighth qubit and the ninth qubit; a thirteenth qubit entangled with at least one of the eighth qubit and the tenth qubit; a fourteenth qubit entangled with at least one of the eighth qubit and the tenth qubit; a fifteenth qubit entangled with at least one of the ninth qubit and the tenth qubit; and a sixteenth qubit entangled with at least one of the ninth qubit and the tenth qubit.

1212 Entangle the first qubit with the second qubit; entangle the first qubit with the third qubit; entangle the first qubit with the fourth qubit; entangle the first qubit with the fifth qubit; entangle the first qubit with the sixth qubit; entangle the first qubit with the seventh qubit; entangle the eighth qubit with the second qubit; entangle the eighth qubit with the seventh qubit; entangle the ninth qubit with the third qubit; entangle the ninth qubit with the fourth qubit; entangle the tenth qubit with the fifth qubit; entangle the tenth qubit with the sixth qubit; entangle the eleventh qubit with the eighth qubit; entangle the eleventh qubit with the ninth qubit; entangle the twelfth qubit with the eighth qubit; entangle the twelfth qubit with the ninth qubit; entangle the thirteenth qubit with the eighth qubit; entangle the thirteenth qubit with the tenth qubit; entangle the fourteenth qubit with the eighth qubit; entangle the fourteenth qubit with the tenth qubit; entangle the fifteenth qubit with the ninth qubit; entangle the fifteenth qubit with the tenth qubit; entangle the sixteenth qubit with the ninth qubit; or entangle the sixteenth qubit with the tenth qubit.

1214 Entangling two qubits includes performing a Bell state measurement on a first ancillary qubit entangled with one qubit of the two qubits and a second ancillary qubit entangled with the other qubit of the two qubits

1230 Obtain a plurality of qubits, including a first qubit entangled with second, third, fourth, fifth, and sixth qubits. The first qubit is also entangled with one or more of: seventh, eighth, ninth, tenth, and eleventh qubits. The plurality of qubits also includes one or more of: a twelfth qubit entangled with at least one of the second qubit, the third qubit, the fourth qubit, the fifth qubit, and the eleventh qubit; a thirteenth qubit entangled with at least one of the seventh qubit, the eighth qubit, the ninth qubit, and the tenth qubit; a fourteenth qubit entangled with at least one of the twelfth qubit and the thirteenth qubit; a fifteenth qubit entangled with at least one of the twelfth qubit and the thirteenth qubit; a sixteenth qubit entangled with at least one of the twelfth qubit and the thirteenth qubit; a seventeenth qubit entangled with at least one of the twelfth qubit and the thirteenth qubit; and an eighteenth qubit entangled with at least one of the twelfth qubit and the thirteenth qubit.

1232 Entangle the first qubit with the second qubit; entangle the first qubit with third qubit; entangle the first qubit with fourth qubit; entangle the first qubit with fifth qubit; entangle the first qubit with sixth qubit; entangle the first qubit with the seventh qubit; entangle the first qubit with the eighth qubit; entangle the first qubit with the ninth qubit; entangle the first qubit with the tenth qubit; entangle the first qubit with the eleventh qubit; entangle the twelfth qubit with the second qubit; entangle the twelfth qubit with the third qubit; entangle the twelfth qubit with the fourth qubit; entangle the twelfth qubit with the fifth qubit; entangle the twelfth qubit with the eleventh qubit; entangle the thirteenth qubit with the seventh qubit; entangle the thirteenth qubit with the eighth qubit; entangle the thirteenth qubit with the ninth qubit; entangle the thirteenth qubit with the tenth qubit; entangle the fourteenth qubit with the twelfth qubit; entangle the fourteenth qubit with the thirteenth qubit; entangle the fifteenth qubit with the twelfth qubit; entangle the fifteenth qubit with the thirteenth qubit; entangle the sixteenth qubit with the twelfth qubit; entangle the sixteenth qubit with the thirteenth qubit; entangle the seventeenth qubit with the twelfth qubit; entangle the seventeenth qubit with the thirteenth qubit; entangle the eighteenth qubit with the twelfth qubit; or entangle the eighteenth qubit with the thirteenth qubit.

Figure 12B

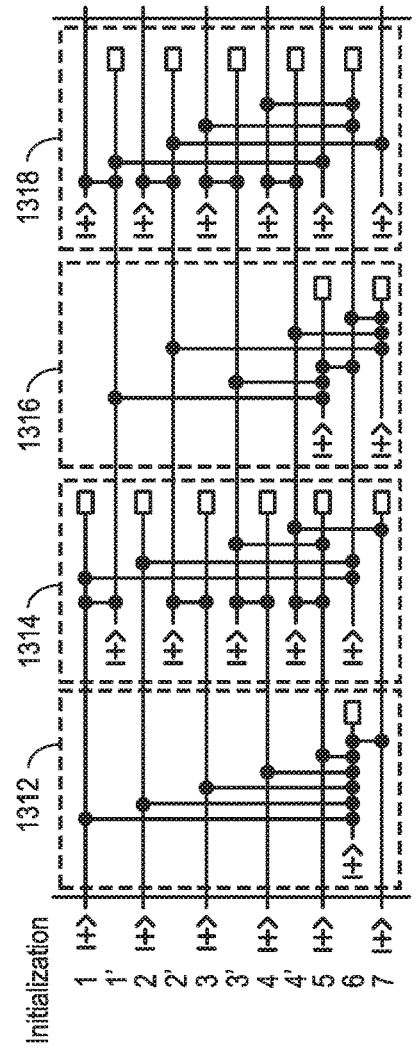
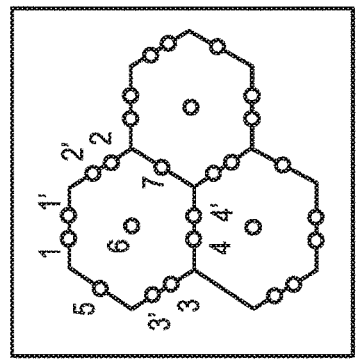
Figure 13B
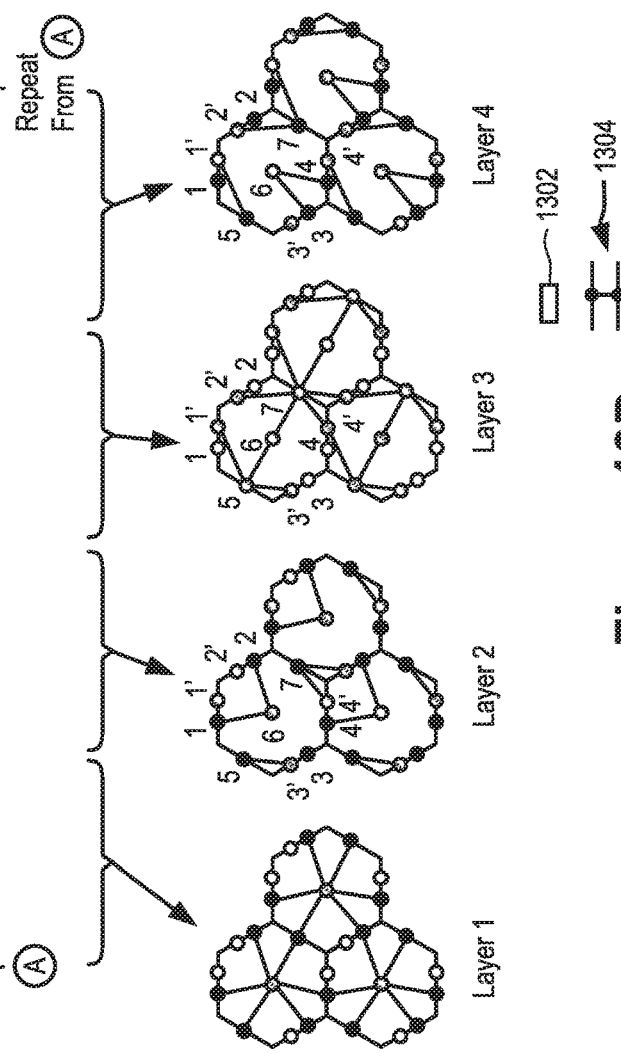
Figure 13D
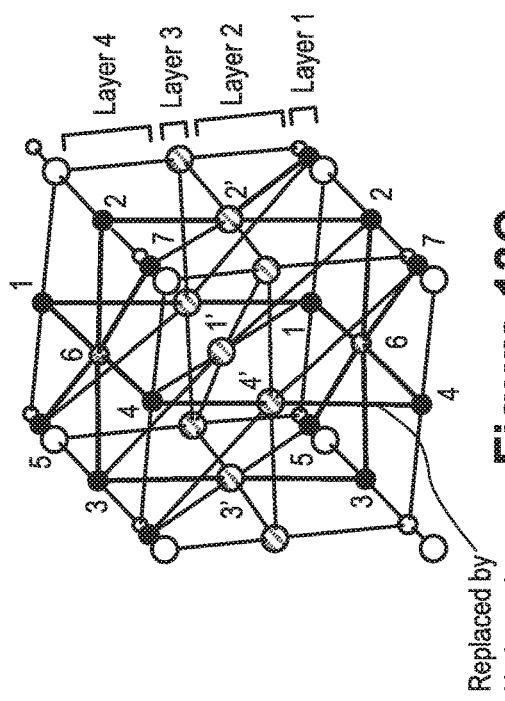
Figure 13C

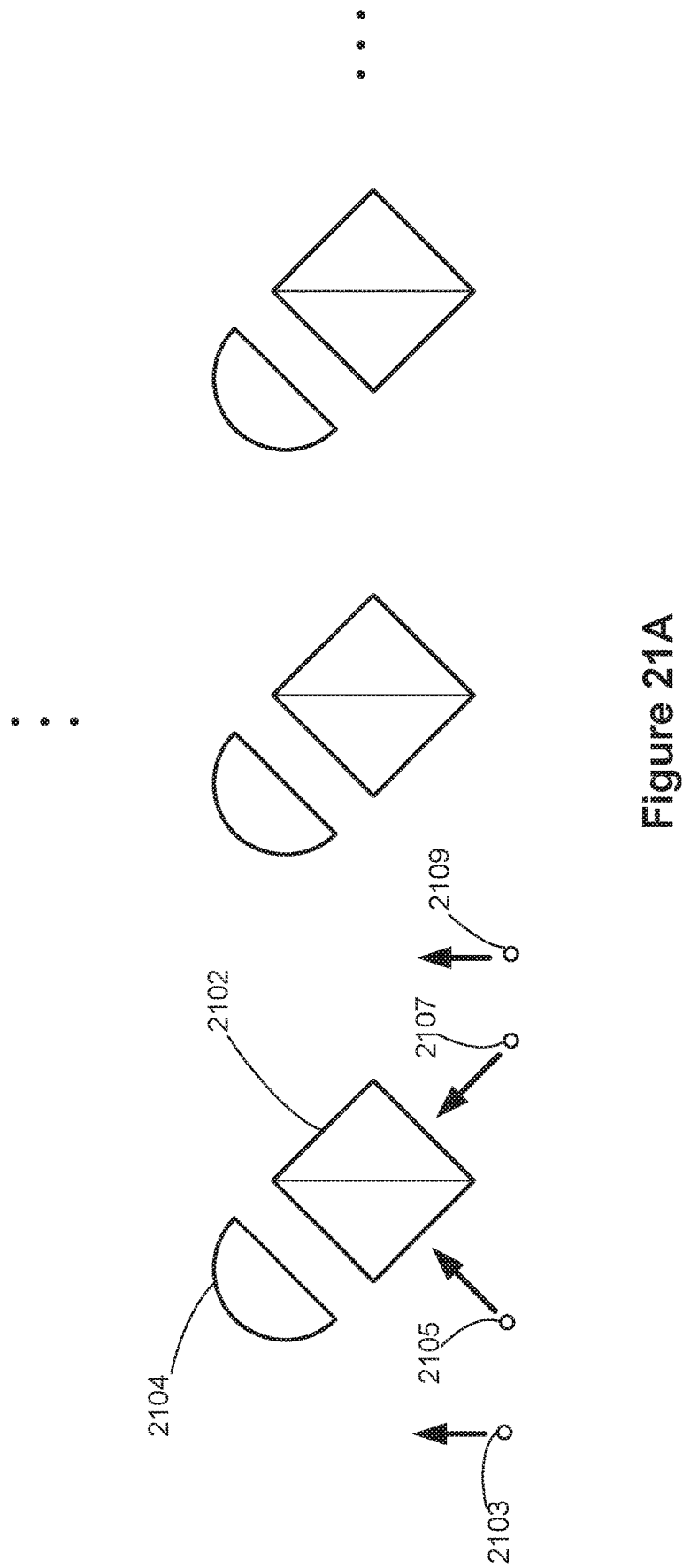

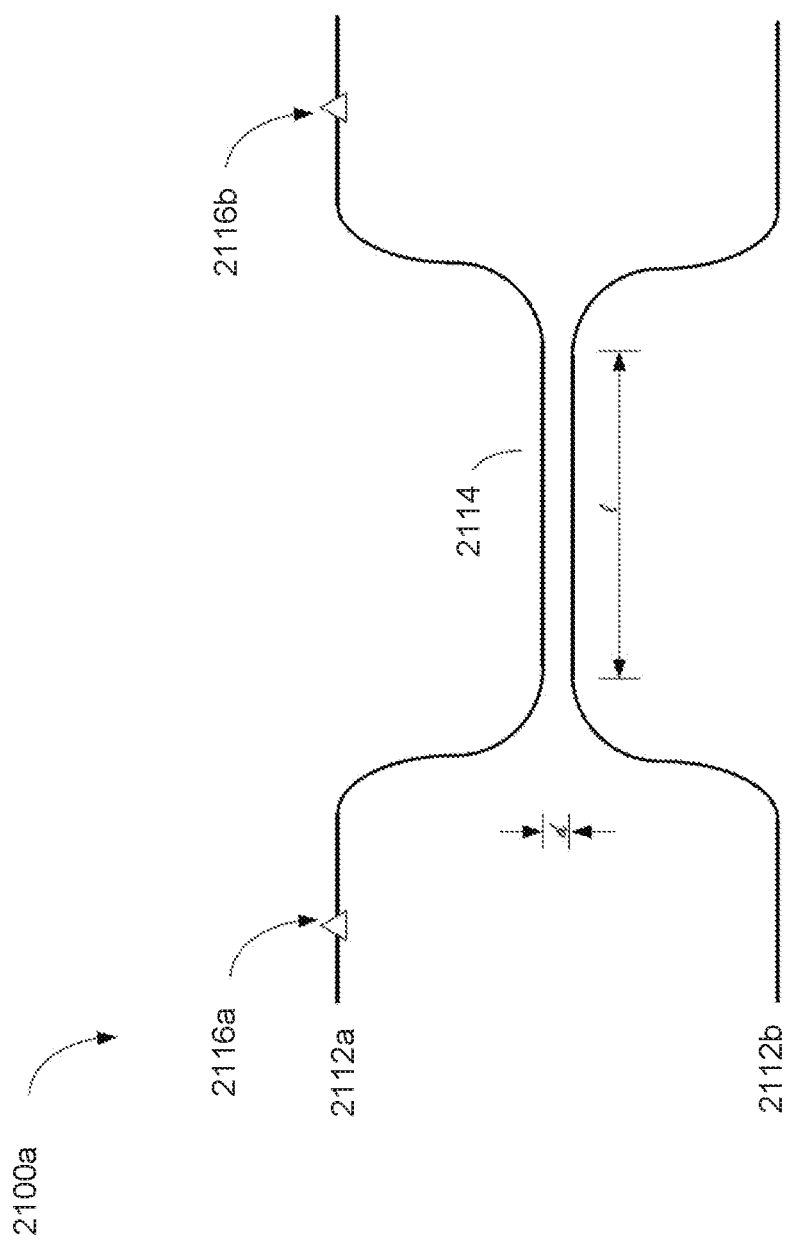

METHODS AND DEVICES FOR OBTAINING QUANTUM CLUSTER STATES WITH HIGH FAULT TOLERANCE BASED ON NON-CUBICAL UNIT CELLS

CROSS REFERENCE TO RELATED APPLICATIONS

This Application is a United States National Stage Application filed under 35 U.S.C. § 371 of PCT Patent Application Serial No. PCT/US2019/021711 filed on Mar. 11, 2019, which claims the benefit of and priority to U.S. Patent Application Ser. No. 62/641,404 filed on Mar. 11, 2018, U.S. Patent Application Ser. No. 62/739,021 filed on Sep. 28, 2018, and U.S. Patent Application Ser. No. 62/748,220 filed on Oct. 19, 2018, each of which is hereby incorporated by reference in its entirety.

TECHNICAL FIELD

This relates generally to methods and devices for obtaining quantum cluster states, including but not limited to, methods and devices for obtaining quantum cluster states with high fault tolerance.

BACKGROUND

In quantum computing, quantum error correction is required to reduce errors in qubits. Topological codes are widely used for having relatively high fault tolerance.

SUMMARY

There is a need for quantum computers with high fault tolerance. Methods and devices for obtaining (e.g., generating) novel quantum cluster states with high fault tolerance are described herein. Such methods and devices improve efficiency, accuracy, and operation speed of quantum computers. Such methods and devices optionally complement or replace conventional methods and devices for obtaining quantum cluster states.

In accordance with some embodiments, a method includes obtaining a plurality of entangled qubits represented by a lattice structure. The lattice structure includes a plurality of contiguous lattice cells. A particular lattice cell includes ten distinct vertices that include a first vertex, a second vertex, a third vertex, a fourth vertex, a fifth vertex, a sixth vertex, a seventh vertex, an eighth vertex, a ninth vertex, and a tenth vertex. The first vertex and the second vertex are coupled by a first edge of the lattice cell. The second vertex and the third vertex are coupled by a second edge of the lattice cell. The fifth vertex and the sixth vertex are coupled by a third edge of the lattice cell. The sixth vertex and the seventh vertex are coupled by a fourth edge of the lattice cell. The eighth vertex and the ninth vertex are coupled by a fifth edge of the lattice cell. The ninth vertex and the tenth vertex are coupled by a sixth edge of the lattice cell. The first vertex and the fifth vertex are coupled by a seventh edge of the lattice cell. The third vertex and the seventh vertex are coupled by an eighth edge of the lattice cell. The fourth vertex and the ninth vertex are coupled by a ninth edge of the lattice cell. The second vertex and the fourth vertex are coupled by a tenth edge of the lattice cell. The fifth vertex and the eighth vertex are coupled by an eleventh edge of the lattice cell. The seventh vertex and the tenth vertex are coupled by a twelfth edge of the lattice cell. The first edge, the second edge, the third edge, the fourth edge, the fifth edge, the sixth edge, the seventh edge, the eighth edge, the ninth edge, the tenth edge, the eleventh edge, and the twelfth edge are distinct from one another. The first vertex, the second vertex, the fourth vertex, the ninth vertex, the eighth vertex, and the fifth vertex define a first face. The second vertex, the third vertex, the seventh vertex, the tenth vertex, the ninth vertex, and the fourth vertex define a second face. The first vertex, the second vertex, the third vertex, the seventh vertex, the sixth vertex, and the fifth vertex define a third face. The fifth vertex, the sixth vertex, the seventh vertex, the tenth vertex, the ninth vertex, and the eighth vertex define a fourth face. The first face, the second face, the third face, and the fourth face are distinct from one another.

In some embodiments, each lattice cell of the plurality of contiguous lattice cells has a shape that corresponds to the particular lattice cell.

In some embodiments, a first subset of the plurality of contiguous lattice cells has multiple lattice cells each having a shape that corresponds to the particular lattice cell; and a second subset of the plurality of contiguous lattice cells has multiple lattice cells that do not have a shape that corresponds to the particular lattice cell.

In some embodiments, the particular lattice cell does not have a shape of a convex polyhedron.

In accordance with some embodiments, a method includes obtaining a plurality of entangled qubits represented by a lattice structure. The lattice structure includes a plurality of contiguous lattice cells. A respective lattice cell includes ten vertices that include: a first vertex; a second vertex that is distinct from the first vertex; a third vertex that is distinct from the first vertex and the second vertex; a fourth vertex that is distinct from the first vertex, the second vertex, and the third vertex; a fifth vertex that is distinct from the first vertex, the second vertex, the third vertex, and the fourth vertex; a sixth vertex that is distinct from the first vertex, the second vertex, the third vertex, the fourth vertex, and the fifth vertex; a seventh vertex that is distinct from the first vertex, the second vertex, the third vertex, the fourth vertex, the fifth vertex and the sixth vertex; an eighth vertex that is distinct from the first vertex, the second vertex, the third vertex, the fourth vertex, the fifth vertex, the sixth vertex, and the seventh vertex; a ninth vertex that is distinct from the first vertex, the second vertex, the third vertex, the fourth vertex, the fifth vertex, the sixth vertex, the seventh vertex, and the eighth vertex; and a tenth vertex that is distinct from the first vertex, the second vertex, the third vertex, the fourth vertex, the fifth vertex, the sixth vertex, the seventh vertex, the eighth vertex, and the ninth vertex. The first vertex and the second vertex are coupled by a first edge of the lattice cell. The second vertex and the third vertex are coupled by a second edge of the lattice cell that is distinct from the first edge. The fifth vertex and the sixth vertex are coupled by a third edge of the lattice cell that is distinct from the first edge and the second edge. The sixth vertex and the seventh vertex are coupled by a fourth edge of the lattice cell that is distinct from the first edge, the second edge, and the third edge. The eighth vertex and the ninth vertex are coupled by a fifth edge of the lattice cell that is distinct from the first edge, the second edge, the third edge, and the fourth edge. The ninth vertex and the tenth vertex are coupled by a sixth edge of the lattice cell that is distinct from the first edge, the second edge, the third edge, the fourth edge and the fifth edge. The first vertex and the fifth vertex are coupled by a seventh edge of the lattice cell that is distinct from the first edge, the second edge, the third edge, the fourth edge, the fifth edge, and the sixth edge. The third vertex and the seventh vertex are coupled by an eighth edge of the lattice cell that is distinct from the first edge, the second edge, the third edge, the fourth edge, the fifth edge, the sixth edge, and the seventh edge. The fourth vertex and the ninth vertex are coupled by a ninth edge of the lattice cell that is distinct from the first edge, the second edge, the third edge, the fourth edge, the fifth edge, the sixth edge, the seventh edge, and the eighth edge. The second vertex and the fourth vertex are coupled by a tenth edge of the lattice cell that is distinct from the first edge, the second edge, the third edge, the fourth edge, the fifth edge, the sixth edge, the seventh edge, the eighth edge, and the ninth edge. The fifth vertex and the eighth vertex are coupled by an eleventh edge of the lattice cell that is distinct from the first edge, the second edge, the third edge, the fourth edge, the fifth edge, the sixth edge, the seventh edge, the eighth edge, the ninth edge, and the tenth edge. The seventh vertex and the tenth vertex are coupled by a twelfth edge of the lattice cell that is distinct from the first edge, the second edge, the third edge, the fourth edge, the fifth edge, the sixth edge, the seventh edge, the eighth edge, the ninth edge, the tenth edge, and the eleventh edge. The first vertex, the second vertex, the fourth vertex, the ninth vertex, the eighth vertex, and the fifth vertex define a first face. The second vertex, the third vertex, the seventh vertex, the tenth vertex, the ninth vertex, and the fourth vertex define a second face that is distinct from the first face. The first vertex, the second vertex, the third vertex, the seventh vertex, the sixth vertex, and the fifth vertex define a third face that is distinct from the first face and the second face. The fifth vertex, the sixth vertex, the seventh vertex, the tenth vertex, the ninth vertex, and the eighth vertex define a fourth face that is distinct from the first face, the second face, and the third face.

In accordance with some embodiments, a method includes obtaining a plurality of entangled qubits represented by a lattice structure. The lattice structure includes a plurality of contiguous lattice cells. A particular pair of adjacent lattice cells has fourteen distinct vertices that include a first vertex, a second vertex, a third vertex, a fourth vertex, a fifth vertex, a sixth vertex, a seventh vertex, an eighth vertex, a ninth vertex, a tenth vertex, an eleventh vertex, a twelfth vertex, a thirteenth vertex, and a fourteenth vertex. The first vertex and the second vertex are coupled by a first edge. The second vertex and the third vertex are coupled by a second edge. The fifth vertex and the sixth vertex are coupled by a third edge. The sixth vertex and the seventh vertex are coupled by a fourth edge. The eighth vertex and the ninth vertex are coupled by a fifth edge. The ninth vertex and the tenth vertex are coupled by a sixth edge. The first vertex and the fifth vertex are coupled by a seventh edge. The third vertex and the seventh vertex are coupled by an eighth edge. The fourth vertex and the ninth vertex are coupled by a ninth edge. The second vertex and the fourth vertex are coupled by a tenth edge. The fifth vertex and the eighth vertex are coupled by an eleventh edge. The seventh vertex and the tenth vertex are coupled by a twelfth edge. The third vertex and the eleventh vertex are coupled by a thirteenth edge. The fourth vertex and the twelfth vertex are coupled by a fourteenth edge. The twelfth vertex and the thirteenth tenth vertex are coupled by a fifteenth edge. The tenth vertex and the fourteenth vertex are coupled by a sixteenth edge. The thirteenth vertex and the fourteenth vertex are coupled by a seventeenth edge. The eleventh vertex and the thirteenth vertex are coupled by an eighteenth edge. The first edge, the second edge, the third edge, the fourth edge, the fifth edge, the sixth edge, the seventh edge, the eighth edge, the ninth edge, the tenth edge, the eleventh edge, the twelfth edge, the thirteenth edge, and the fourteenth edge are distinct from one another. The first vertex, the second vertex, the fourth vertex, the ninth vertex, the eighth vertex, and the fifth vertex define a first face. The second vertex, the third vertex, the seventh vertex, the tenth vertex, the ninth vertex, and the fourth vertex define a second face. The first vertex, the second vertex, the third vertex, the seventh vertex, the sixth vertex, and the fifth vertex define a third face. The fifth vertex, the sixth vertex, the seventh vertex, the tenth vertex, the ninth vertex, and the eighth vertex define a fourth face. The second vertex, the third vertex, the eleventh vertex, the thirteenth vertex, the twelfth vertex, and the fourth vertex define a sixth face. The fourth vertex, the twelfth vertex, the thirteenth vertex, the fourteenth vertex, the tenth vertex, and the ninth vertex define a sixth face. The third vertex, the eleventh vertex, the thirteenth vertex, the fourteenth vertex, the tenth vertex, and the seventh vertex define a seventh face. The first face, the second face, the third face, the fourth face, the fifth face, the sixth face, and the seventh face are distinct from one another.

In some embodiments, a respective pair of vertices of the fourteen vertices corresponds to a respective vertex of a cube.

In some embodiments, a method includes obtaining a plurality of entangled qubits represented by a lattice structure, the lattice structure including a plurality of contiguous lattice cells, a particular lattice cell including fourteen distinct vertices that include a first vertex, a second vertex, a third vertex, a fourth vertex, a fifth vertex, a sixth vertex, a seventh vertex, an eighth vertex, a ninth vertex, a tenth vertex, an eleventh vertex, a twelfth vertex, a thirteenth vertex, and a fourteenth vertex. The first vertex and the second vertex are coupled by a first edge of the lattice cell. The second vertex and the third vertex are coupled by a second edge of the lattice cell. The third vertex and the fourth vertex are coupled by a third edge of the lattice cell. The fourth vertex and the fifth vertex are coupled by a fourth edge of the lattice cell. The fifth vertex and the sixth vertex are coupled by a fifth edge of the lattice cell. The sixth vertex and the seventh vertex are coupled by a sixth edge of the lattice cell. The seventh vertex and the eighth vertex are coupled by a seventh edge of the lattice cell. The eighth vertex and the ninth vertex are coupled by an eighth edge of the lattice cell. The ninth vertex and the tenth vertex are coupled by a ninth edge of the lattice cell. The tenth vertex and the first vertex are coupled by a tenth edge of the lattice cell. The first vertex and the eleventh vertex are coupled by an eleventh edge of the lattice cell. The eleventh vertex and the twelfth vertex are coupled by a twelfth edge of the lattice cell. The twelfth vertex and the thirteenth vertex are coupled by a thirteenth edge of the lattice cell. The thirteenth vertex and the fourteenth vertex are coupled by a fourteenth edge of the lattice cell. The fourteenth vertex and the sixth vertex are coupled by a fifteenth edge of the lattice cell. The first edge, the second edge, the third edge, the fourth edge, the fifth edge, the sixth edge, the seventh edge, the eighth edge, the ninth edge, the tenth edge, the eleventh edge, the twelfth edge, the thirteenth edge, the fourteenth edge, and the fifteenth edge are distinct from one another. The first vertex, the second vertex, the third vertex, the fourth vertex, the fifth vertex, the sixth vertex, the seventh vertex, the eighth vertex, the ninth vertex, and the tenth vertex define a first face. The first vertex, the second vertex, the third vertex, the fourth vertex, the fifth vertex, the sixth vertex, the fourteenth vertex, the thirteenth vertex, the twelfth vertex, and the eleventh vertex define a second face that is distinct from the first face. The first vertex, the tenth vertex, the ninth vertex, the eighth vertex, the seventh vertex, the sixth vertex, the fourteenth vertex, the thirteenth vertex, the twelfth vertex, and the eleventh vertex define a third face that is distinct from the first face and the second face.

In some embodiments, each lattice cell of the plurality of contiguous lattice cells has a shape that corresponds to the particular lattice cell.

In some embodiments, a first subset of the plurality of contiguous lattice cells has multiple lattice cells each having a shape that corresponds to the particular lattice cell, and a second subset of the plurality of contiguous lattice cells has multiple lattice cells that do not have a shape that corresponds to the particular lattice cell.

In some embodiments, the particular lattice cell does not have a shape of a convex polyhedron.

In accordance with some embodiments, a method includes obtaining a plurality of entangled qubits represented by a lattice structure, the lattice structure including a plurality of contiguous lattice cells, a respective set of contiguous lattice cells having (at least) eight sets of vertices, each set of vertices of the eight sets of vertices having one or more vertices. A first set of vertices of the eight sets of vertices is coupled to a second set of vertices of the eight sets of vertices. The second set of vertices is coupled to a third set of vertices of the eight sets of vertices. The third set of vertices is coupled to a fourth set of vertices of the eight sets of vertices. The fourth set of vertices is coupled to the first set of vertices. A fifth set of vertices of the eight sets of vertices coupled to a sixth set of vertices of the eight sets of vertices. The sixth set of vertices is coupled to a seventh set of vertices of the eight sets of vertices. The seventh set of vertices is coupled to an eighth set of vertices of the eight sets of vertices. The eighth set of vertices is coupled to the fifth set of vertices. The first set of vertices is coupled to the fifth set of vertices. The second set of vertices is coupled to the sixth set of vertices. The third set of vertices is coupled to the seventh set of vertices. The fourth set of vertices is coupled to the eighth set of vertices. The first set of vertices, the second set of vertices, the third set of vertices, and the fourth set of vertices defining a first face. The fifth set of vertices, the sixth set of vertices, the seventh set of vertices, and the eighth set of vertices defining a second face that is distinct from the first face. The first set of vertices, the second set of vertices, the sixth set of vertices, and the fifth set of vertices defining a third face that is distinct from the first face and the second face. The second set of vertices, the third set of vertices, the seventh set of vertices, and the sixth set of vertices defining a fourth face that is distinct from the first face, the second face, and the third face. The third set of vertices, the fourth set of vertices, the eighth set of vertices, and the seventh set of vertices defining a fifth face that is distinct from the first face, the second face, the third face, and the fourth face. The fourth set of vertices, the first set of vertices, the fifth set of vertices, and the eighth set of vertices defining a sixth face that is distinct from the first face, the second face, the third face, the fourth face, and the fifth face. In some embodiments, at least one set of vertices of the eight sets of vertices has two or more vertices. In some embodiments, the eight sets of vertices define one or more additional faces that are distinct from the first face, the second face, the third face, the fourth face, the fifth face, and the sixth face.

In some embodiments, the eight sets of vertices define a seventh face that is distinct from the first face, the second face, the third face, the fourth face, the fifth face, and the sixth face. At least one set of vertices of the eight sets of vertices has two or more vertices.

In some embodiments, the seventh face is defined by the first set of vertices, the second set of vertices, the fourth set of vertices, the sixth set of vertices, the seventh set of vertices, and the eighth set of vertices.

In some embodiments, each set of vertices of the eight sets of vertices has two or more vertices.

In some embodiments, the eight sets of vertices define: a seventh face that is distinct from the first face, the second face, the third face, the fourth face, the fifth face, and the sixth face; an eighth face that is distinct from the first face, the second face, the third face, the fourth face, the fifth face, the sixth face, and the seventh face; and a ninth face that is distinct from the first face, the second face, the third face, the fourth face, the fifth face, the sixth face, the seventh face, and the eighth face. At least one set of vertices of the eight sets of vertices has two or more vertices.

In some embodiments, at least one set of vertices of the eight sets of vertices has three or more vertices.

In some embodiments, each set of vertices of the eight sets of vertices has two or more vertices.

In some embodiments, each set of vertices of the eight sets of vertices has three or more vertices.

In some embodiments, the eight sets of vertices define four or more additional faces that are distinct from the first face, the second face, the third face, the fourth face, the fifth face, and the sixth face. In some embodiments, at least one set of vertices of the eight sets of vertices has four or more vertices.

In accordance with some embodiments, a method includes obtaining a plurality of qubits, including a first qubit entangled with second, third, fourth, fifth, sixth, and seventh qubits. The plurality of qubits also includes one or more of: an eighth qubit entangled with at least one of the second qubit and the seventh qubit; a ninth qubit entangled with at least one of the third qubit and the fourth qubit; a tenth qubit entangled with at least one of the fifth qubit and the sixth qubit; an eleventh qubit entangled with at least one of the eighth qubit and the ninth qubit; a twelfth qubit entangled with at least one of the eighth qubit and the ninth qubit; a thirteenth qubit entangled with at least one of the eighth qubit and the tenth qubit; a fourteenth qubit entangled with at least one of the eighth qubit and the tenth qubit; a fifteenth qubit entangled with at least one of the ninth qubit and the tenth qubit; and a sixteenth qubit entangled with at least one of the ninth qubit and the tenth qubit.

In some embodiments, the eighth qubit is entangled with both the second qubit and the seventh qubit. The ninth qubit is entangled with both the third qubit and the fourth qubit. The tenth qubit is entangled with both the fifth qubit and the sixth qubit. The eleventh qubit is entangled with both the eighth qubit and the ninth qubit. The twelfth qubit is entangled with both the eighth qubit and the ninth qubit. The thirteenth qubit is entangled with both the eighth qubit and the tenth qubit. The fourteenth qubit is entangled with both the eighth qubit and the tenth qubit. The fifteenth qubit is entangled with both the ninth qubit and the tenth qubit. The sixteenth qubit is entangled with both the ninth qubit and the tenth qubit.

In some embodiments, the method includes one or more of: entangling the first qubit with the second qubit; entangling the first qubit with the third qubit; entangling the first qubit with the fourth qubit; entangling the first qubit with the fifth qubit; entangling the first qubit with the sixth qubit; entangling the first qubit with the seventh qubit; entangling the eighth qubit with the second qubit; entangling the eighth qubit with the seventh qubit; entangling the ninth qubit with the third qubit; entangling the ninth qubit with the fourth qubit; entangling the tenth qubit with the fifth qubit; entangling the tenth qubit with the sixth qubit; entangling the eleventh qubit with the eighth qubit; entangling the eleventh qubit with the ninth qubit; entangling the twelfth qubit with the eighth qubit; entangling the twelfth qubit with the ninth qubit; entangling the thirteenth qubit with the eighth qubit; entangling the thirteenth qubit with the tenth qubit; entangling the fourteenth qubit with the eighth qubit; entangling the fourteenth qubit with the tenth qubit; entangling the fifteenth qubit with the ninth qubit; entangling the fifteenth qubit with the tenth qubit; entangling the sixteenth qubit with the ninth qubit; and entangling the sixteenth qubit with the tenth qubit.

In some embodiments, entangling two qubits includes performing a Bell state measurement on a first ancillary qubit entangled with one qubit of the two qubits and a second ancillary qubit entangled with the other qubit of the two qubits.

In accordance with some embodiments, a method includes obtaining a first set of multiple entangled qubits, and obtaining a second set of multiple entangled qubits. The second set of multiple entangled qubits is mutually exclusive from the first set of multiple entangled qubits. The method also includes fusing (i) at least one qubit of the first set of multiple entangled qubits and (ii) at least one qubit of the second set of multiple entangled qubits, thereby obtaining a plurality of entangled qubits, including a first qubit entangled with second, third, fourth, fifth, sixth, and seventh qubits. The plurality of qubits also includes one or more of: an eighth qubit entangled with at least one of the second qubit and the seventh qubit; a ninth qubit entangled with at least one of the third qubit and the fourth qubit; a tenth qubit entangled with at least one of the fifth qubit and the sixth qubit; an eleventh qubit entangled with at least one of the eighth qubit and the ninth qubit; a twelfth qubit entangled with at least one of the eighth qubit and the ninth qubit; a thirteenth qubit entangled with at least one of the eighth qubit and the tenth qubit; a fourteenth qubit entangled with at least one of the eighth qubit and the tenth qubit; a fifteenth qubit entangled with at least one of the ninth qubit and the tenth qubit; and a sixteenth qubit entangled with at least one of the ninth qubit and the tenth qubit.

In accordance with some embodiments, a method includes obtaining a plurality of qubits, including a first qubit entangled with second, third, fourth, fifth, and sixth qubits. The first qubit is also entangled with one or more of: seventh, eighth, ninth, tenth, and eleventh qubits. The plurality of qubits also includes one or more of: a twelfth qubit entangled with at least one of the second qubit, the third qubit, the fourth qubit, the fifth qubit, and the eleventh qubit; a thirteenth qubit entangled with at least one of the seventh qubit, the eighth qubit, the ninth qubit, and the tenth qubit; a fourteenth qubit entangled with at least one of the twelfth qubit and the thirteenth qubit; a fifteenth qubit entangled with at least one of the twelfth qubit and the thirteenth qubit; a sixteenth qubit entangled with at least one of the twelfth qubit and the thirteenth qubit; a seventeenth qubit entangled with at least one of the twelfth qubit and the thirteenth qubit; and an eighteenth qubit entangled with at least one of the twelfth qubit and the thirteenth qubit.

In some embodiments, the first qubit is entangled with all of the seventh, eighth, ninth, tenth, and eleventh qubits. The twelfth qubit is entangled with all of the second, third, fourth, fifth, and eleventh qubits. The thirteenth qubit is entangled with all of the seventh, eighth, ninth, and tenth qubits. The fourteenth qubit is entangled with both the twelfth qubit and the thirteenth qubit. The fifteenth qubit is entangled with both the twelfth qubit and the thirteenth qubit. The sixteenth qubit is entangled with both the twelfth qubit and the thirteenth qubit. The seventeenth qubit is entangled with both the twelfth qubit and the thirteenth qubit. The eighteenth qubit is entangled with both the twelfth qubit and the thirteenth qubit.

In some embodiments, the method includes one or more of: entangling the first qubit with the second qubit; entangling the first qubit with third qubit; entangling the first qubit with fourth qubit; entangling the first qubit with fifth qubit; entangling the first qubit with sixth qubit; entangling the first qubit with the seventh qubit; entangling the first qubit with the eighth qubit; entangling the first qubit with the ninth qubit; entangling the first qubit with the tenth qubit; entangling the first qubit with the eleventh qubit; entangling the twelfth qubit with the second qubit; entangling the twelfth qubit with the third qubit; entangling the twelfth qubit with the fourth qubit; entangling the twelfth qubit with the fifth qubit; entangling the twelfth qubit with the eleventh qubit; entangling the thirteenth qubit with the seventh qubit; entangling the thirteenth qubit with the eighth qubit; entangling the thirteenth qubit with the ninth qubit; entangling the thirteenth qubit with the tenth qubit; entangling the fourteenth qubit with the twelfth qubit; entangling the fourteenth qubit with the thirteenth qubit; entangling the fifteenth qubit with the twelfth qubit; entangling the fifteenth qubit with the thirteenth qubit; entangling the sixteenth qubit with the twelfth qubit; entangling the sixteenth qubit with the thirteenth qubit; entangling the seventeenth qubit with the twelfth qubit; entangling the seventeenth qubit with the thirteenth qubit; entangling the eighteenth qubit with the twelfth qubit; and entangling the eighteenth qubit with the thirteenth qubit.

In some embodiments, entangling two qubits includes performing a Bell state measurement on a first ancillary qubit entangled with one qubit of the two qubits and a second ancillary qubit entangled with the other qubit of the two qubits.

In accordance with some embodiments, a method includes obtaining a first set of multiple entangled qubits, and obtaining a second set of multiple entangled qubits. The second set of multiple entangled qubits is mutually exclusive from the first set of multiple entangled qubits. The method also includes fusing (i) at least one qubit of the first set of multiple entangled qubits and (ii) at least one qubit of the second set of multiple entangled qubits, thereby obtaining a plurality of entangled qubits, including a first qubit entangled with second, third, fourth, fifth, and sixth qubits. The first qubit is also entangled with one or more of: seventh, eighth, ninth, tenth, and eleventh qubits. The plurality of qubits also includes one or more of: a twelfth qubit entangled with at least one of the second qubit, the third qubit, the fourth qubit, the fifth qubit, and the eleventh qubit; a thirteenth qubit entangled with at least one of the seventh qubit, the eighth qubit, the ninth qubit, and the tenth qubit; a fourteenth qubit entangled with at least one of the twelfth qubit and the thirteenth qubit; a fifteenth qubit entangled with at least one of the twelfth qubit and the thirteenth qubit; a sixteenth qubit entangled with at least one of the twelfth qubit and the thirteenth qubit; a seventeenth qubit entangled with at least one of the twelfth qubit and the thirteenth qubit; and an eighteenth qubit entangled with at least one of the twelfth qubit and the thirteenth qubit.

In accordance with some embodiments, a computing system includes one or more processors, and memory storing one or more programs. The one or more programs include instructions, which, when executed by the one or more processors, cause the computing system to perform any method described herein.

In accordance with some embodiments, a computer readable storage medium stores one or more programs for execution by one or more processors of a computing system. The one or more programs include instructions for performing any method described herein.

In accordance with some embodiments, a photonic device includes one or more gates configured to perform any method described herein. In some embodiments, each gate includes one or more beam splitters.

In accordance with some embodiments, a method includes providing a first cluster state. The first cluster state of qubits comprises a plurality of first cluster state qubits. The method also includes providing a second cluster state. The second cluster state of qubits comprises a plurality of second cluster state qubits. The method further includes selecting a first cluster state qubit of the plurality of first cluster state qubits, and generating a modified first cluster state that includes the first cluster state qubit by entangling a subset of leaf qubits from the second cluster state of qubits with a subset of nearest neighbor qubits of the first cluster state qubit.

In some embodiments, entangling the subset of the leaf qubits comprises applying a boosted fusion gate between the subset of the leaf qubits and the subset of the nearest neighbor qubits from of the first cluster state qubit.

In some embodiments, the method also includes performing a stabilizer measurement on the modified first cluster state by measuring the first cluster state qubit.

In some embodiments, the method includes selecting a second cluster state qubit of the plurality of first cluster state qubits. The second cluster state qubit is a nearest neighbor of the first cluster state qubit. The method also includes providing a third cluster state of qubits. The third cluster state of qubits comprises a plurality of third cluster state qubits. Generating the modified first cluster further includes entangling leaf qubits from the third cluster state of qubits with the nearest neighbors of the second cluster state qubit.

In accordance with some embodiments, a system includes a first cluster state of qubits comprising: a central qubit; a first nearest neighbor qubit; a second nearest neighbor qubit; and a third nearest neighbor qubit. The central qubit is pairwise entangled with each of the first, second, and third nearest neighbor qubits. The system also includes a qubit that is separate and distinct from the central qubit. The qubit is pairwise entangled with each of the first, second, and third nearest neighbor qubits.

In some embodiments, the first cluster state of qubits comprises a plurality of matter-based qubits disposed on a substrate, and the qubit that is separate and distinct form the central qubit is a matter-based qubit disposed on the substrate.

In some embodiments, the first cluster state of qubits comprises a plurality of photonic qubits localized in a waveguide, and the qubit that is separate and distinct form the central qubit is a photonic qubit localized in a waveguide.

In accordance with some embodiments, a device includes one or more gates for performing any method described herein. In some embodiments, the one or more gates include one or more fusion gates. In some embodiments, each gate includes one or more beam splitters.

Thus, systems and devices are configured to operate with novel quantum clusters, thereby increasing the speed, effectiveness, efficiency, accuracy, and precision of such systems and devices.

Thus, systems and devices are configured to operate with novel quantum clusters, thereby increasing the speed, effectiveness, efficiency, accuracy, and precision of such systems and devices.

BRIEF DESCRIPTION OF THE DRAWINGS

For a better understanding of the various described implementations, reference should be made to the Detailed Description below, in conjunction with the following drawings in which like reference numerals refer to corresponding parts throughout the figures.

FIG. 10 is a flowchart representing a method of obtaining a plurality of entangled qubits in accordance with some embodiments.

FIG. 11 is a flowchart representing a method of obtaining a plurality of entangled qubits in accordance with some embodiments.

FIG. 12A is a flowchart representing a method of obtaining a plurality of entangled qubits in accordance with some embodiments.

FIG. 12B is a flowchart representing a method of obtaining a plurality of entangled qubits in accordance with some embodiments.

FIG. 13B illustrates matter-based qubits located on a combination of a qubit entangling system and a qubit readout system in accordance with some embodiments.

FIGS. 13C-13F illustrate operations of FIG. 13A with respect to the qubits shown in FIG. 13B.

FIG. 21A is a block diagram illustrating components of an example quantum entanglement generator in accordance with some embodiments.

FIGS. 21B-21D illustrate schematic diagrams of waveguide beam splitters, in accordance with some embodiments.

Like reference numerals refer to corresponding parts throughout the several views of the drawings.

DETAILED DESCRIPTION

Figure 1:
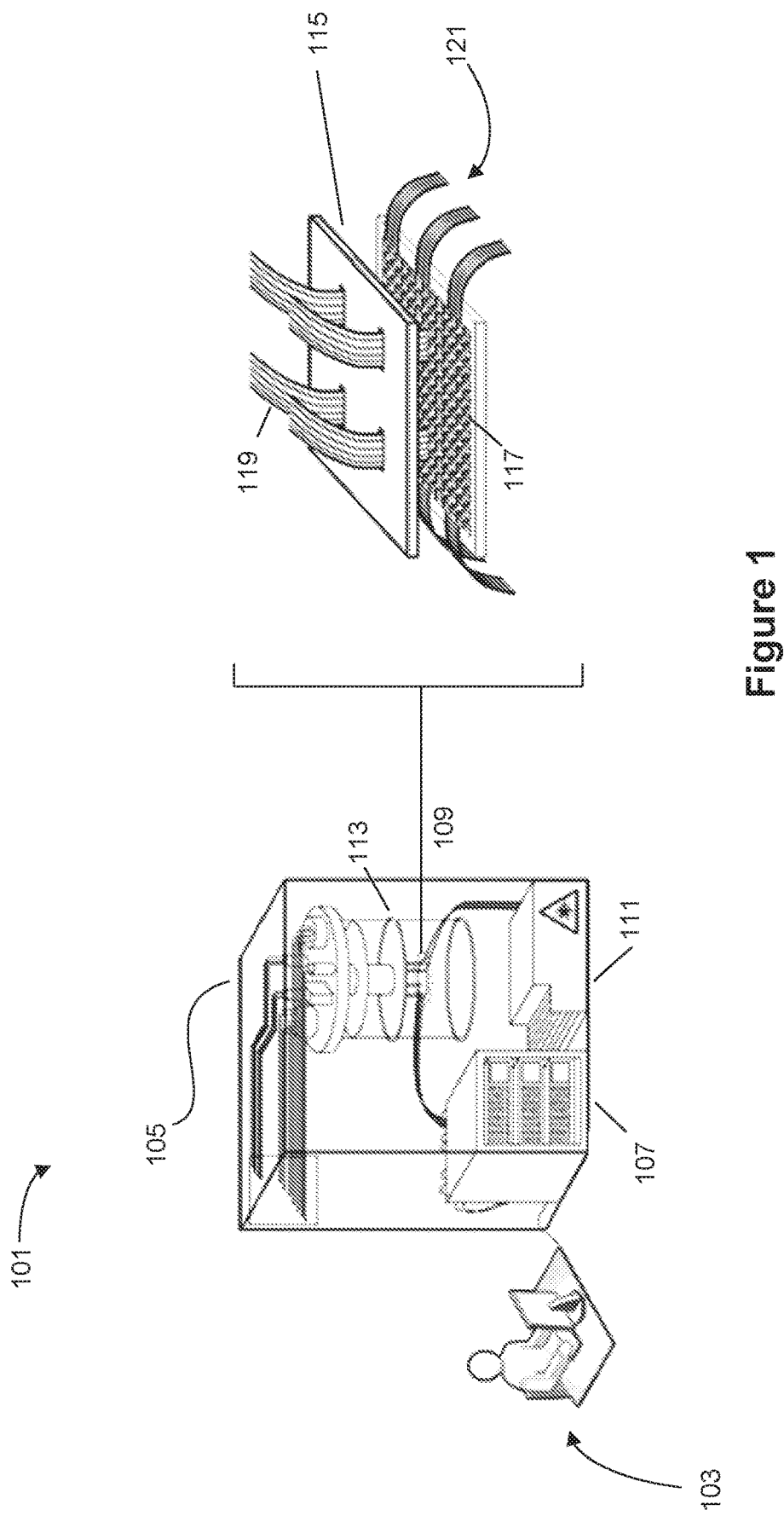
FIG. 1 shows a hybrid computing system in accordance with one or more embodiments.

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

Many modifications and variations of this disclosure can be made without departing from its spirit and scope, as will be apparent to those skilled in the art. The specific implementations described herein are offered by way of example only, and the disclosure is to be limited only by the terms of the appended claims, along with the full scope of equivalents to which such claims are entitled.

I. Introduction to Qubits and Path Encoding

The dynamics of quantum objects, e.g., photons, electrons, atoms, ions, molecules, nanostructures, and the like, follow the rules of quantum theory. More specifically, in quantum theory, the quantum state of a quantum object, e.g., a photon, is described by a set of physical properties, the complete set of which is referred to as a mode. In some embodiments, a mode is defined by specifying the value (or distribution of values) of one or more properties of the quantum object. For example, again for photons, modes can be defined by the frequency of the photon, the position in space of the photon (e.g., which waveguide or superposition of waveguides the photon is propagating within), the associated direction of propagation (e.g., the k-vector for a photon in free space), the polarization state of the photon (e.g., the direction (horizontal or vertical) of the photon's electric and/or magnetic fields) and the like.

For the case of photons propagating in a waveguide, it is convenient to express the state of the photon as one of a set of discrete spatio-temporal modes. For example, the spatial mode $k_i$ of the photon is determined according to which one of a finite set of discrete waveguides the photon can be propagating in. Furthermore, the temporal mode $t_j$ is determined by which one of a set of discrete time periods (referred to herein as "bins") the photon can be present in. In some embodiments, the temporal discretization of the system can be provided by the timing of a pulsed laser which is responsible for generating the photons. In the examples below, spatial modes will be used primarily to avoid complication of the description. However, one of ordinary skill will appreciate that the systems and methods can apply to any type of mode, e.g., temporal modes, polarization modes, and any other mode or set of modes that serves to specify the quantum state. Furthermore, in the description that follows, embodiments will be described that employ photonic waveguides to define the spatial modes of the photon. However, one of ordinary skill having the benefit of this disclosure will appreciate that any type of mode, e.g., polarization modes, temporal modes, and the like, can be used without departing from the scope of the present disclosure.

For quantum systems of multiple indistinguishable particles, rather than describing the quantum state of each particle in the system, it is useful to describe the quantum state of the entire many-body system using the formalism of Fock states (sometimes referred to as the occupation number representation). In the Fock state description, the many-body quantum state is specified by how many particles there are in each mode of the system. Because modes are the complete set of properties, this description is sufficient. For example, a multi-mode, two particle Fock state $|1001\rangle_{1,2,3,4}$ specifies a two-particle quantum state with one photon in mode 1, zero photons in mode 2, zero photons in mode three, and 1 photon in mode four. Again, as introduced above, a mode can be any set of properties of the quantum object (and can depend on the single particle basis states being used to define the quantum state). For the case of the photon, any two modes of the electromagnetic field can be used, e.g., one may design the system to use modes that are related to a degree of freedom that can be manipulated passively with linear optics. For example, polarization, spatial degree of freedom, or angular momentum, could be used. For example, the four-mode system represented by the two particle Fock state $|1001\rangle_{1,2,3,4}$ can be physically implemented as four distinct waveguides with two of the four waveguides (representing mode 1 and mode 4, respectively) having one photon travelling within them. Other examples of a state of such a many-body quantum system are the four photon Fock state $|1111\rangle_{1,2,3,4}$ that represents each waveguide containing one photon and the four photon Fock state $|2200\rangle_{1,2,3,4}$ that represents waveguides one and two respectively housing two photons and waveguides three and four housing zero photons. For modes having zero photons present, the term "vacuum mode" is used. For example, for the four photon Fock state $|2200\rangle_{1,2,3,4}$ modes 3 and 4 are referred to herein as "vacuum modes" (also referred to as "ancilla modes").

As used herein, a "qubit" (or quantum bit) is a physical quantum system with an associated quantum state that can be used to encode information. Qubits, in contrast to classical bits, can have a state that is a superposition of logical values such as 0 and 1. In some embodiments, a qubit is "dual-rail encoded" such that the logical value of the qubit is encoded by occupation of one of two modes by exactly one photon (a single photon). For example, consider the two spatial modes of a photonic system associated with two distinct waveguides. In some embodiments, the logical 0 and 1 values can be encoded as follows:

$$|0\rangle_L = |10\rangle_{1,2} \tag{1}$$

$$|1\rangle_L = |01\rangle_{1,2} \tag{2}$$

where the subscript "L" indicates that the ket represents a logical value (e.g., a qubit value) and, as before, the notation $|ij\rangle_{1,2}$ on the right-hand side of the Equations (1)-(2) above indicates that there are i photons in a first waveguide and j photons in a second waveguide, respectively (e.g., where i and j are integers). In this notation, a two qubit state having a logical value $|01\rangle_L$ (representing a state of two qubits, the first qubit being in a '0' logical state and the second qubit being in a '1' logical state) may be represented using photon occupations across four distinct waveguides by $|1001\rangle_{1,2,3,4}$ (i.e., one photon in a first waveguide, zero photons in a second waveguide, zero photons in a third waveguide, and one photon in a fourth waveguide). In some instances, throughout this disclosure, the various subscripts are omitted to avoid unnecessary mathematical clutter.

A Bell pair is a pair of qubits in any type of maximally entangled state referred to as a Bell state. For dual rail encoded qubits, examples of Bell states include:

$$|\Phi^+\rangle = \frac{|0\rangle_L|0\rangle_L + |1\rangle_L|1\rangle_L}{\sqrt{2}} = \frac{|1010\rangle + |0101\rangle}{\sqrt{2}} \tag{3}$$

$$|\Phi^-\rangle = \frac{|0\rangle_L|0\rangle_L - |1\rangle_L|1\rangle_L}{\sqrt{2}} = \frac{|1010\rangle - |0101\rangle}{\sqrt{2}} \tag{4}$$

$$|\Psi^+\rangle = \frac{|0\rangle_L|1\rangle_L + |1\rangle_L|0\rangle_L}{\sqrt{2}} = \frac{|1001\rangle + |0110\rangle}{\sqrt{2}} \tag{5}$$

$$|\Psi^-\rangle = \frac{|0\rangle_L|1\rangle_L - |1\rangle_L|0\rangle_L}{\sqrt{2}} = \frac{|1001\rangle - |0110\rangle}{\sqrt{2}} \tag{6}$$

In a computational basis (e.g., logical basis) with two states, a Greenberger-Horne-Zeilinger state is a quantum superposition of all qubits being in a first state of the two states superposed with all of qubits being in a second state. Using logical basis described above, the general M-qubit GHZ state can be written as:

$$|GHZ\rangle = \frac{|0\rangle^{\otimes M} + |1\rangle^{\otimes M}}{\sqrt{2}} \tag{7}$$

II. A Hybrid Classical-Quantum Computing System

FIG. 1 shows a hybrid computing system in accordance with one or more embodiments. The hybrid computing system 101 includes a user interface device 103 that is communicatively coupled to a hybrid quantum computing (QC) sub-system 105, described in more detail below in FIG. 2. The user interface device 103 can be any type of user interface device, e.g., a terminal including a display, keyboard, mouse, touchscreen and the like. In addition, the user interface device can itself be a computer such as a personal computer (PC), laptop, tablet computer and the like. In some embodiments, the user interface device 103 provides an interface with which a user can interact with the hybrid QC subsystem 105. For example, the user interface device 103 may run software, such as a text editor, an interactive development environment (IDE), command prompt, graphical user interface, and the like so that the user can program, or otherwise interact with, the QC subsystem to run one or more quantum algorithms. In other embodiments, the hybrid QC subsystem 105 may be pre-programmed and the user interface device 103 may simply be an interface where a user can initiate a quantum computation, monitor the progress, and receive results from the hybrid QC subsystem 105. Hybrid QC subsystem 105 further includes a classical computing system 107 coupled to one or more quantum computing chips 109. In some examples, the classical computing system 107 and the quantum computing chips 109 can be coupled to other electronic components 111, e.g., pulsed pump lasers, microwave oscillators, power supplies, networking hardware, etc. In some embodiments that require cryogenic operation, the quantum computing chips 109 can be housed within a cryostat, e.g., cryostat 113. In some embodiments, the quantum computing chips 109 can include one or more constituent chips, e.g., hybrid control electronics 115 and integrated photonics chip 117. Signals can be routed on- and off-chip any number of ways, e.g., via optical interconnects 119 and via other electronic interconnects 121. In addition, the hybrid computing system 101 may employ a quantum computing process, e.g., measurement-based quantum computing (MBQC), circuit-based quantum computing (CBQC, or any other quantum computing scheme.

Figure 2:
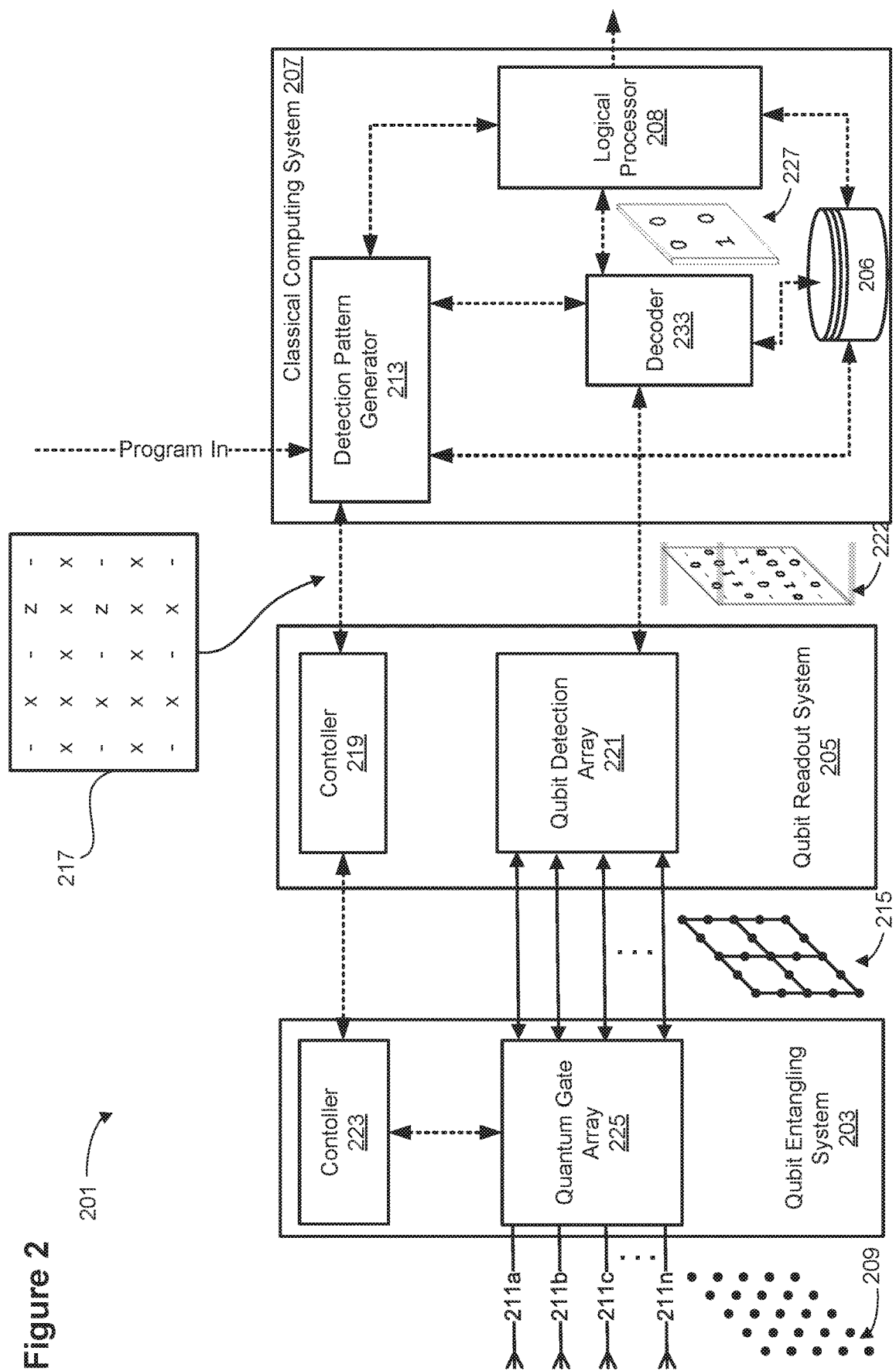
FIG. 2 shows a hybrid quantum computing system in accordance with some embodiments.

FIG. 2 shows a block diagram of a hybrid QC system 201 in accordance with some embodiments. Such a system can be associated with the hybrid computing system 101 introduced above in reference to FIG. 1. In FIG. 2, solid lines represent quantum information channels and dashed represent classical information channels. The hybrid QC system 201 includes a qubit entangling system 203, qubit readout system 205, and classical computing system 207. In some embodiments, the qubit entangling system 203 takes as input a collection of N physical qubits, e.g., physical qubits 209 (also represented schematically as inputs 211a, 211b, 211c, . . . , 211n) and generates quantum entanglement between two or more of them to generate an entangled state 215. For example, in the case of photonic qubits, the qubit entangling system 203 can be a linear optical system such as an integrated photonic circuit that includes waveguides, beam splitters, photon detectors, delay lines, and the like. In some examples, the entangled state 215 can be a lattice, cluster, or graph state, or one part of a larger lattice, cluster, or graph state that is created over the course of several clock cycles of the quantum computer. In some embodiments, the input qubits 209 can be a collection of quantum systems and/or particles and can be formed using any qubit architecture. For example, the quantum systems can be particles, such as atoms, ions, and nuclei. In another example, the quantum systems can be photons. In yet other examples, the quantum systems can be other engineered quantum systems such as flux qubits, phase qubits, or charge qubits (e.g., formed from a superconducting Josephson junction), topological qubits (e.g., Majorana fermions), or spin qubits formed from vacancy centers (e.g., nitrogen vacancies in diamond). Furthermore, for the sake of clarity of description, the term "qubit" is used herein although the system can also employ quantum information carriers that encode information in a manner that is not necessarily associated with a binary bit. For example, qudits can be used, i.e., quantum systems that can encode information in more than two quantum states in accordance with some embodiments.

In accordance with some embodiments, the hybrid QC system 201 can be a quantum circuit-based quantum computer or a measurement-based quantum computer. In either case, a software program (e.g., a set of machine-readable instructions) that represents the quantum algorithm to be run on the hybrid QC system 201 can be passed to a classical computing system 207 (e.g., corresponding to system 107 in FIG. 1 above). The classical computing system 207 can be any type of computing device such as a PC, one or more blade servers, and the like, or even a high-performance computing system such as a supercomputer, server farm, and the like. Such a system can include one or more processors (not shown) coupled to one or more computer memories, e.g., memory 206. Such a computing system will be referred to herein as a "classical computer." In some examples, the software program can be received by a classical computing module, referred to herein as a detection pattern generator 213. One function of the detection pattern generator 213 is to generate a set of machine-level instructions from the input software program (which may originate as code that can be more easily written by a user to program the quantum computer), i.e., the detection pattern generator 213 can operate as a compiler, logic processor, and/or encoder to allow software programs to be run on the quantum computer. Detection pattern generator 213 can be implemented as pure hardware, pure software, or any combination of one or more hardware or software components or modules. In some examples, the compiled machine-level instructions take the form of one or more data frames that instruct the qubit readout circuit to make one or more quantum measurements on the entangled state 215. Measurement pattern 217 (e.g., a data frame) is one example of the set of measurements that should be applied to the individual qubits of entangled state 215 during a certain clock cycle as the program is executed. In other examples, e.g., the measurement pattern 217 can include instructions for applying multi-qubit measurements and/or multi-qubit gates, e.g., in the case where a fusion gate is desired to be applied to two or more qubits. In some embodiments, several measurement patterns 217 can be stored in memory 206 as classical data. Generally, the measurement patterns 217 can dictate whether or not a detector from the qubit detection array 221 of the qubit readout circuit 205 should make a measurement on a given qubit that makes up the entangled state 215. In addition, the measurement pattern 217 can also store which basis (e.g., Pauli X, Y, Z, etc.) the measurement should be made in order to execute the program. In some examples, the measurement pattern 217 can also include a set of gates that should be applied by the qubit entangling circuit to the next set of physical qubits 209 that are to be processed at some future clock cycle of the hybrid QC system 201.

A controller circuit 219 of the qubit readout circuit 205 can receive data that encodes the measurement pattern 217 and generate the configuration signals necessary to drive a set of detectors within the qubit detection array 221. The detectors can be any detector that can detect the quantum states of one or more of the qubits in the entangled state 215. For example, for the case of photonic qubits, the detectors can be single photon detectors that are coupled to one or more waveguides, beam splitters, interferometers, switches, polarizers, polarization rotators and the like. One of ordinary skill will appreciate that many types of detectors may be used depending on the particular qubit architecture.

In some embodiments, the result of applying the detection pattern 217 to the qubit detection array is a readout operation that "reads out" the quantum states of the qubits in the entangled state 215. Once this measurement is accomplished, the quantum information stored within the entangled state 215 is converted to classical information that corresponds to a set of eigenvalues that are measured by the detectors, referred to herein as "measurement outcomes." These measurement outcomes can be stored in a measurement outcome data frame, e.g., data frame 222 and passed back to the classical computing system for further processing.

In some embodiments, any of the submodules in the hybrid QC system 201, e.g., controller 223, quantum gate array 225, detection array 221, controller 219, detection pattern generator 213, decoder 233, and logical processor 208 can include any number of classical computing components such as processors (CPUs, GPUs, TPUs) memory (any form of RAM, ROM), hard coded logic components (classical logic gates such as AND, OR, XOR, etc.) and/or programmable logic components such as field programmable gate arrays (FPGAs and the like). These modules can also include any number of application specific integrated circuits (ASICs), microcontrollers (MCUs), systems on a chip (SOCs), and other similar microelectronics.

In some embodiments, the entangled state 215 can be any cluster state described herein. Most generally, a cluster state of highly entangled qubits can be described by an undirected graph $G=(V, E)$ with V and E denoting the sets of vertices and edges, respectively. Each vertex of the graph corresponds to a physical qubit in the cluster state. The physical qubits are initialized in the |+⟩ state, where |+⟩=(|0⟩+|1⟩)/√2. On each edge of the graph, a controlled-phase gate CZ is applied to the qubits that terminate that edge. Accordingly, any cluster state, which physically corresponds to a large entangled state of physical qubits can be described as $$|\Psi\rangle_{graph} = \prod_{(i,j) \in E} CZ_{i,j} |+\rangle^{\otimes |V|}$$

where the $Z_{i_j}$ is the controlled phase gate operator. Thus, any cluster state (and the quantum circuit operations to generate the corresponding cluster state) can be graphically represented by a graph that includes vertices that represent physical qubits and edges that represent entanglement between them.

One useful feature of the generalized graph state written above is that it is a +1 eigenstate of a special class of operators K called stabilizers. More specifically the stabilizers of a graph state $|\Psi\rangle_{graph}$ are $$K_G^{(a)} = X^{(a)} \prod_{b \in N_a} Z^{(b)}$$

where α is any qubit in the state and $N_\alpha$ is the neighborhood of α, i.e., the set of qubits that are connected to it by an edge. X and Z are the Pauli operators. Thus, if no errors are present a measurement of the observable associated with the stabilizer will return a +1 eigenvalue.

$$K_G^{(a)} |\Psi\rangle_{graph} = +1 |\Psi\rangle_{graph}$$

On the contrary, if an error is present, measurement of the observable associated with the stabilizer will return a −1 eigenvalue. Thus, graph states can be useful states for quantum error correction.

As described herein, the logical qubit measurement outcomes 227 can be fault tolerantly recovered, e.g., via decoder 233, from the measurement outcomes 222 of the physical qubits. In the case of a cluster state that is also a stabilizer state, the error syndrome generated by the measurement of joint parity measurements (formed from the combination of one or more stabilizer measurements) are used by the decoder to identify and correct errors so that the correct logical qubit measurement outcome can be determined. Logical processor 208 can then process the logical outcomes as part of the running of the program. As shown, the logical processor 208 can feed back information to the detection pattern generator 213 to affect downstream gates and/or measurements to ensure that the computation proceeds fault tolerantly.

In the description that follows, embodiments will be described that employ spatial modes of photons as the qubit system, but one of ordinary skill will appreciate that any type of qubit described by any type of mode can be employed without departing from the scope of the present disclosure. Furthermore, in what follows, photonic waveguides are used to define the spatial modes of the photon. However, one of ordinary skill having the benefit of this disclosure will appreciate that any type of mode, e.g., polarization modes, temporal modes, and the like, can be used without departing from the scope of the present disclosure. The diagrams shown in the remaining figures are schematic diagrams with each horizontal line representing a mode of a quantum system, e.g., a waveguide.

III. Quantum Cluster States with High Fault Tolerance

Figure 3A:
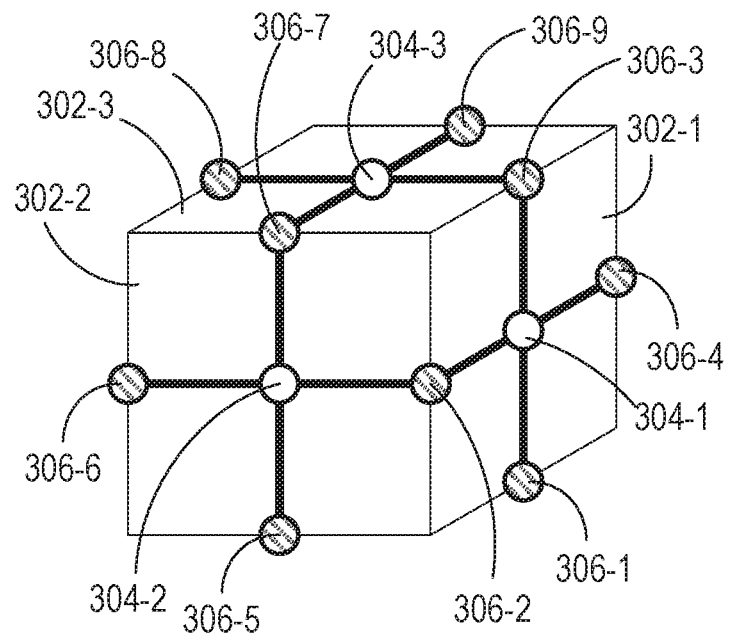
FIG. 3A is a schematic diagram illustrating a solid representation of an example unit cell in accordance with some embodiments.

FIG. 3A is a schematic diagram illustrating a solid representation of an example unit cell in accordance with some embodiments.

The unit cell shown in FIG. 3A has a shape of a convex hexahedron (e.g., a cuboid, such as a rectangular cuboid, and in particular, a cube).

The unit cell in FIG. 3A has six faces (of which three faces 302-1, 302-2, and 302-3 are shown in FIG. 3A). In FIG. 3A, each face of the unit cell has a corresponding qubit (also called herein a face qubit). For example, in FIG. 3A, face 302-1 corresponds to qubit 304-1, face 302-2 corresponds to qubit 304-2, and face 302-3 corresponds to qubit 304-3.

The unit cell in FIG. 3A has twelve edges (of which nine edges are shown in FIG. 3A). In FIG. 3A, each edge of the unit cell has a corresponding qubit (also called herein an edge qubit). For example, in FIG. 3A, each of edge qubits 306-1, 306-2, 306-3, 306-4, 306-5, 306-7, 306-8, 306-9 corresponds to a distinct edge.

Figure 3B:
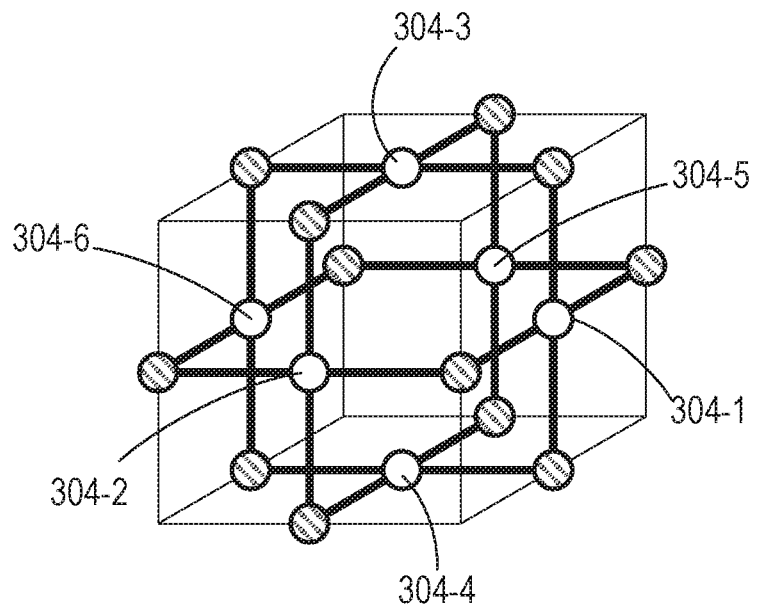
FIG. 3B is a schematic diagram illustrating a wireframe representation of the unit cell shown in FIG. 3A.

FIG. 3B is a schematic diagram illustrating a wireframe representation of the unit cell shown in FIG. 3A. Faces and edges and their corresponding qubits, masked by faces 302-1, 302-2, and 302-3 in FIG. 3A, are visible in FIG. 3B. For example, qubits 304-4, 304-5, and 304-6, which are not shown in FIG. 3A, are illustrated in FIG. 3B.

Figure 3C:
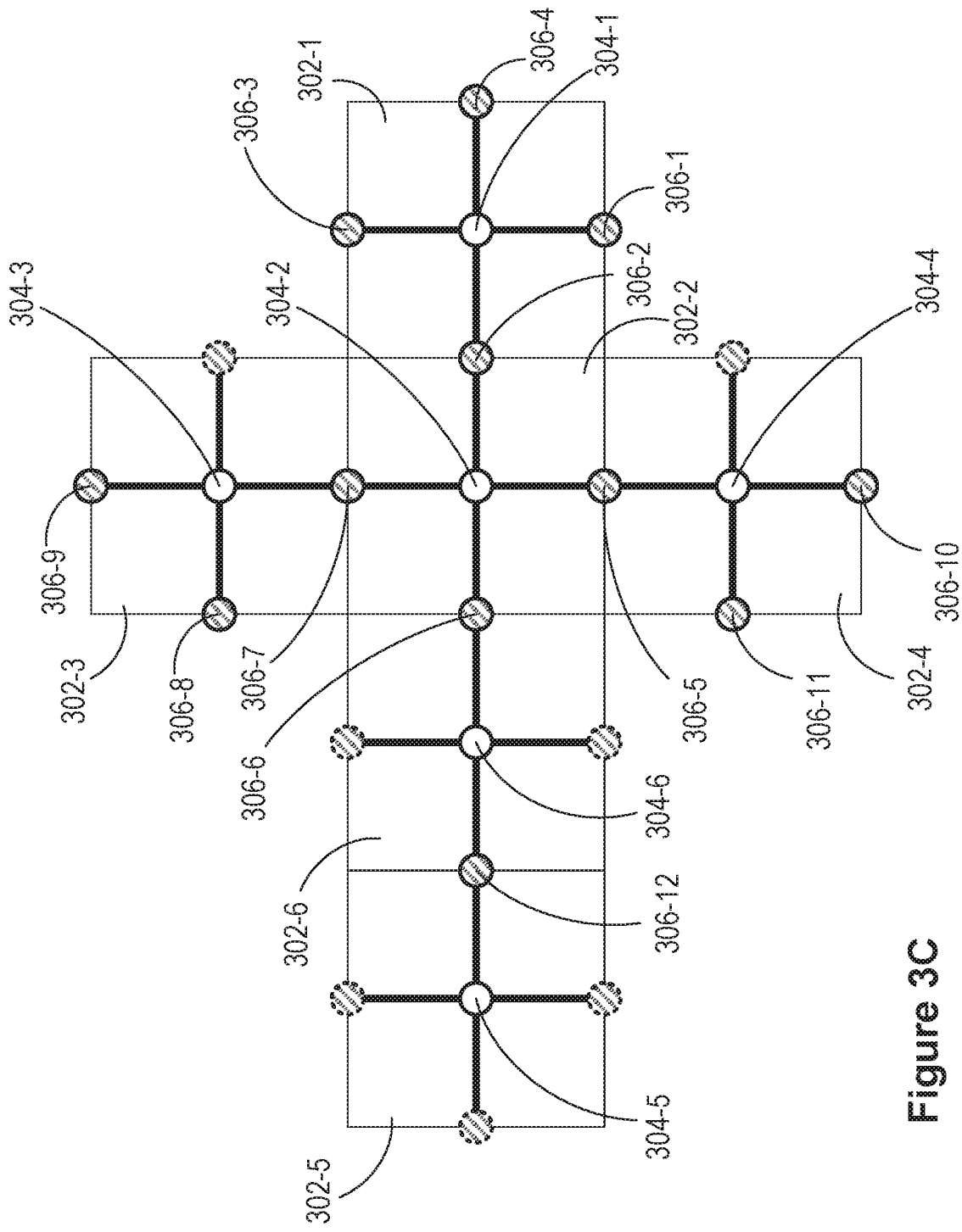
FIG. 3C is an example net of the unit cell shown in FIG. 3A.

FIG. 3C is an example net of the unit cell shown in FIG. 3A. The net shown in FIG. 3C can be understood as an unfolded representation of the unit cell shown in FIG. 3A.

FIG. 3C illustrates that the net includes six faces 302-1 through 302-6 and corresponding qubits 304-1 through 304-6 (e.g., face 302-4 corresponds to qubit 304-4, face 302-5 corresponds to qubit 304-5, and face 302-6 corresponds to qubit 304-6).

FIG. 3C also illustrates that the net includes twelve edges and corresponding qubits 306-1 through 306-12. Qubit 304-1 is entangled with qubits 306-1, 306-2, 306-3, and 306-4. Qubit 304-2 is entangled with qubits 306-5, 306-6, 306-7, and 306-2. Qubit 304-3 is entangled with qubits 306-7, 306-8, 306-9, and 306-3. Qubit 304-4 is entangled with qubits 306-10, 306-11, 306-5, and 306-1. Qubit 304-5 is entangled with qubits 306-10, 306-4, 306-9, and 306-12. Qubit 304-6 is entangled with qubits 306-11, 306-12, 306-8, and 306-6.

Figure 3D:
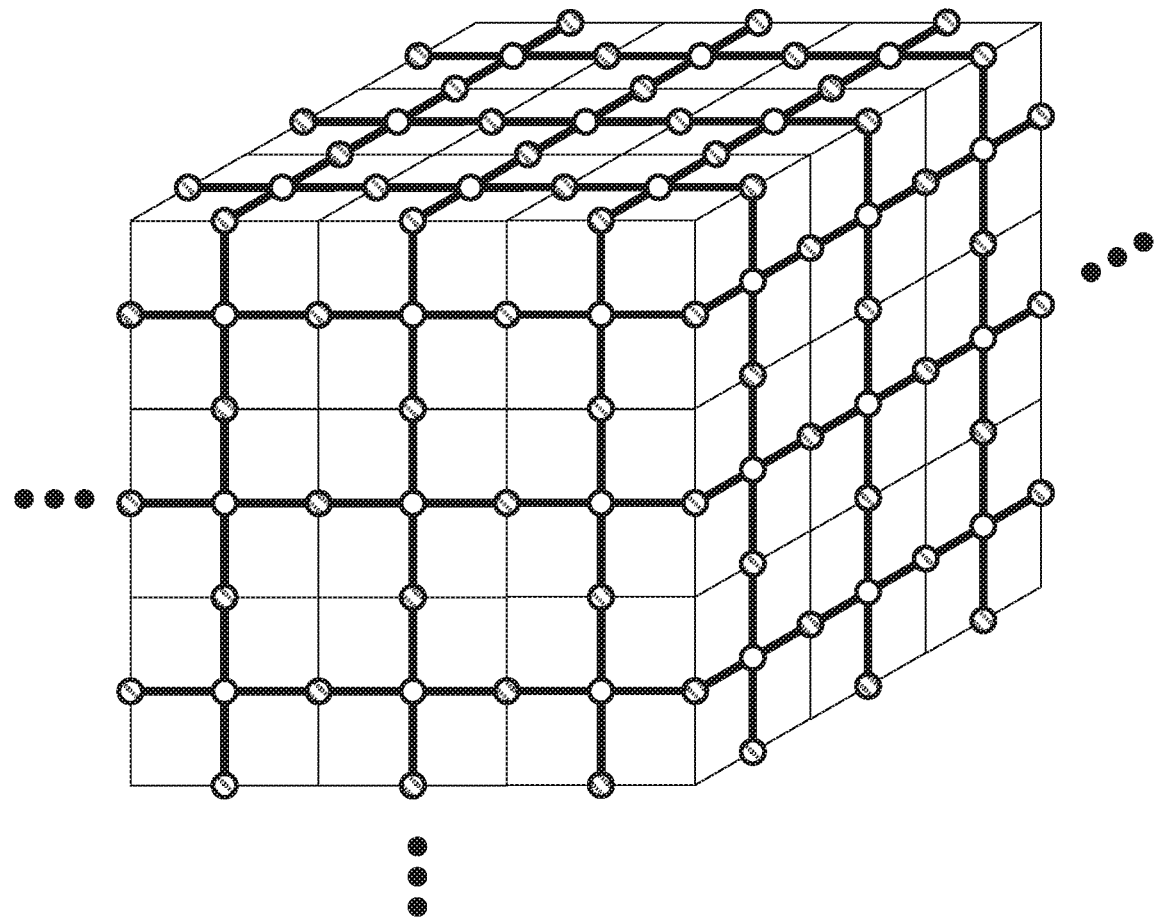
FIG. 3D is a schematic diagram illustrating an example cluster state with a plurality of unit cells in accordance with some embodiments.

FIG. 3D is a schematic diagram illustrating an example cluster state with a plurality of unit cells in accordance with some embodiments. The example cluster state shown in FIG. 3D includes a contiguous block of unit cells, each unit cell corresponding to the unit cell described with respect to FIGS. 3A-3C. The cluster state shown in FIG. 3D is sometimes called a Raussendorf lattice.

Figure 4A:
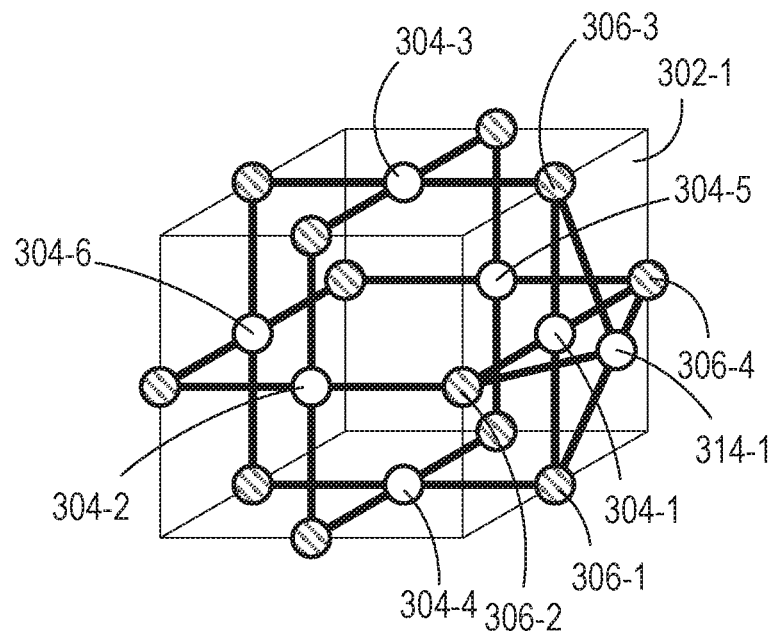
FIG. 4A is a schematic diagram illustrating an example unit cell with one face having two qubits in accordance with some embodiments.

FIG. 4A is a schematic diagram illustrating an example unit cell with one face having two qubits in accordance with some embodiments.

The unit cell shown in FIG. 4A is similar to the unit cell shown in FIG. 3B, except that face 302-1 corresponds to two qubits (e.g., qubits 304-1 and 314-1). Thus, the unit cell shown in FIG. 4A has only one face that corresponds to two qubits.

Figure 4B:
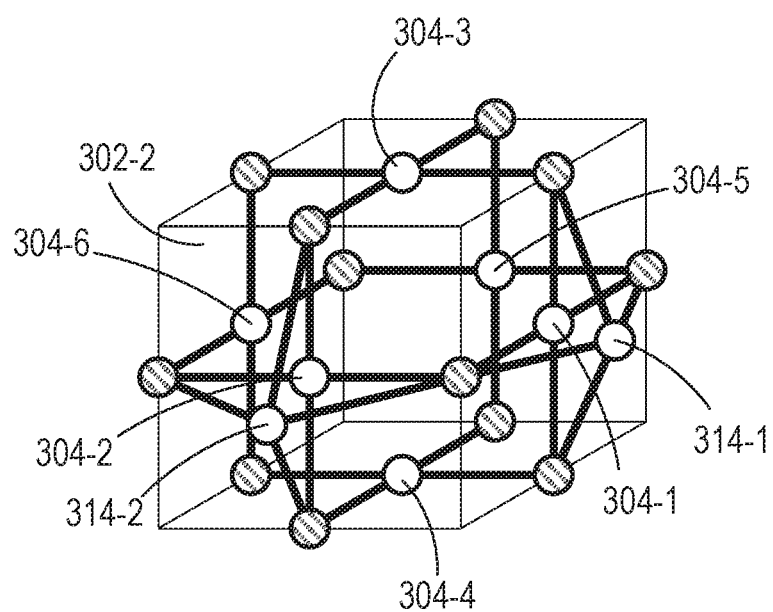
FIG. 4B is a schematic diagram illustrating an example unit cell with two faces each having two qubits in accordance with some embodiments.

FIG. 4B is a schematic diagram illustrating an example unit cell with two faces each having two qubits in accordance with some embodiments.

The unit cell shown in FIG. 4B is similar to the unit cell shown in FIG. 4A, except that face 302-2 corresponds to two qubits (e.g., qubits 304-2 and 314-2). Thus, in the unit cell shown in FIG. 4B, each of the two faces (e.g., faces 302-1 and 302-2) corresponds to a distinct (and non-overlapping) set of two qubits.

Figure 4C:
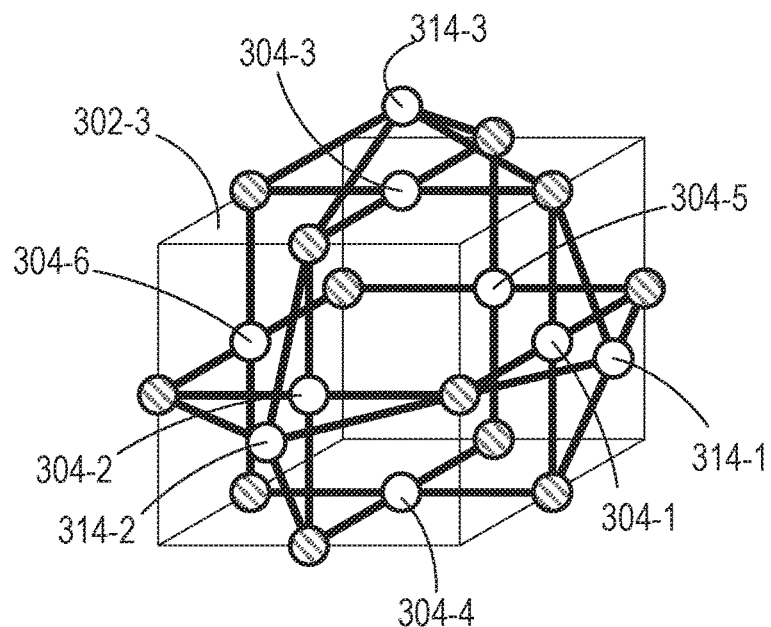
FIG. 4C is a schematic diagram illustrating an example unit cell with three faces each having two qubits in accordance with some embodiments.

FIG. 4C is a schematic diagram illustrating an example unit cell with three faces each having two qubits in accordance with some embodiments.

The unit cell shown in FIG. 4C is similar to the unit cell shown in FIG. 4B, except that face 302-3 corresponds to two qubits (e.g., qubits 304-3 and 314-3). Thus, in the unit cell shown in FIG. 4C, each of the three faces (e.g., faces 302-1 through 302-3) corresponds to a distinct (and non-overlapping) set of two qubits.

Figure 4D:
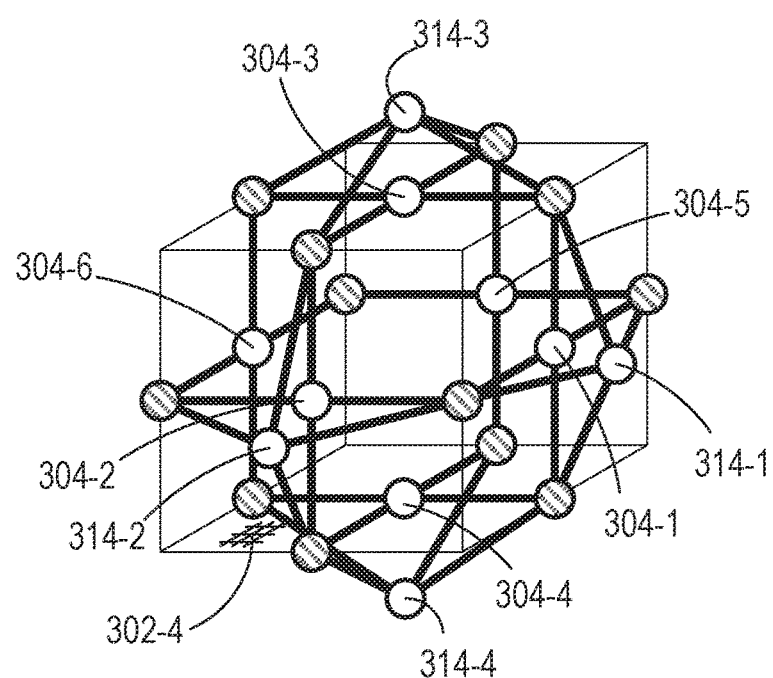
FIG. 4D is a schematic diagram illustrating an example unit cell with four faces each having two qubits in accordance with some embodiments.

FIG. 4D is a schematic diagram illustrating an example unit cell with four faces each having two qubits in accordance with some embodiments.

The unit cell shown in FIG. 4D is similar to the unit cell shown in FIG. 4C, except that face 302-4 corresponds to two qubits (e.g., qubits 304-4 and 314-4). Thus, in the unit cell shown in FIG. 4D, each of the four faces (e.g., faces 302-1 through 302-4) corresponds to a distinct (and non-overlapping) set of two qubits.

Figure 4E:
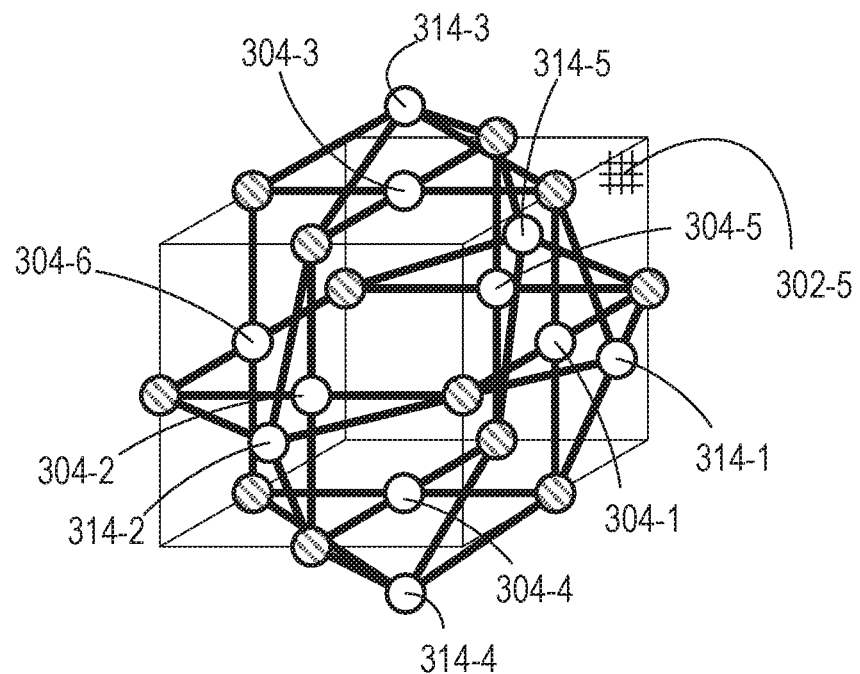
FIG. 4E is a schematic diagram illustrating an example unit cell with five faces each having two qubits in accordance with some embodiments.

FIG. 4E is a schematic diagram illustrating an example unit cell with five faces each having two qubits in accordance with some embodiments.

The unit cell shown in FIG. 4E is similar to the unit cell shown in FIG. 4D, except that face 302-5 corresponds to two qubits (e.g., qubits 304-5 and 314-5). Thus, in the unit cell shown in FIG. 4E, each of the five faces (e.g., faces 302-1 through 302-5) corresponds to a distinct (and non-overlapping) set of two qubits.

Figure 4F:
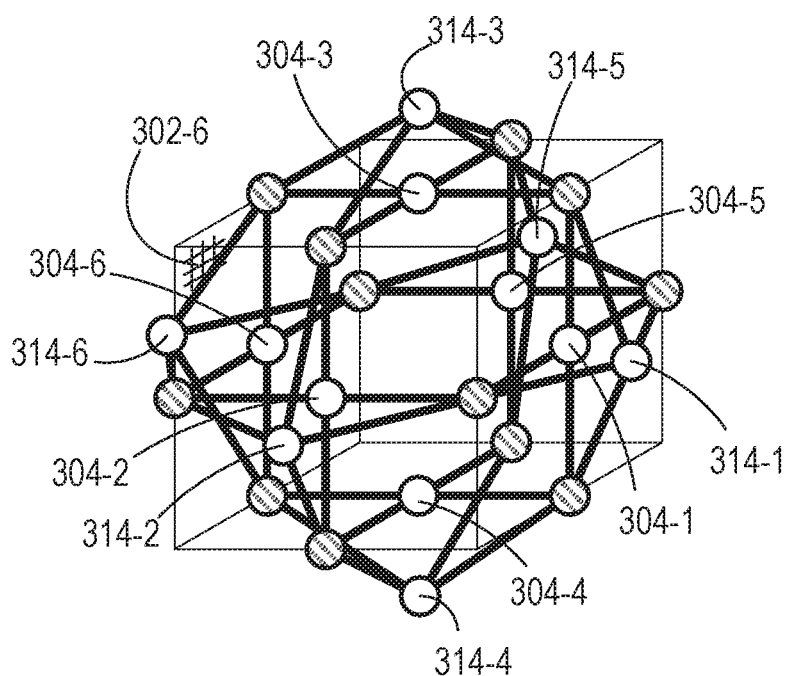
FIG. 4F is a schematic diagram illustrating an example unit cell with six faces each having two qubits in accordance with some embodiments.

FIG. 4F is a schematic diagram illustrating an example unit cell with six faces each having two qubits in accordance with some embodiments.

The unit cell shown in FIG. 4F is similar to the unit cell shown in FIG. 4E, except that face 302-6 corresponds to two qubits (e.g., qubits 304-6 and 314-6). Thus, in the unit cell shown in FIG. 4F, each of the six faces (e.g., faces 302-1 through 302-6) corresponds to a distinct (and non-overlapping) set of two qubits.

Figure 4G:
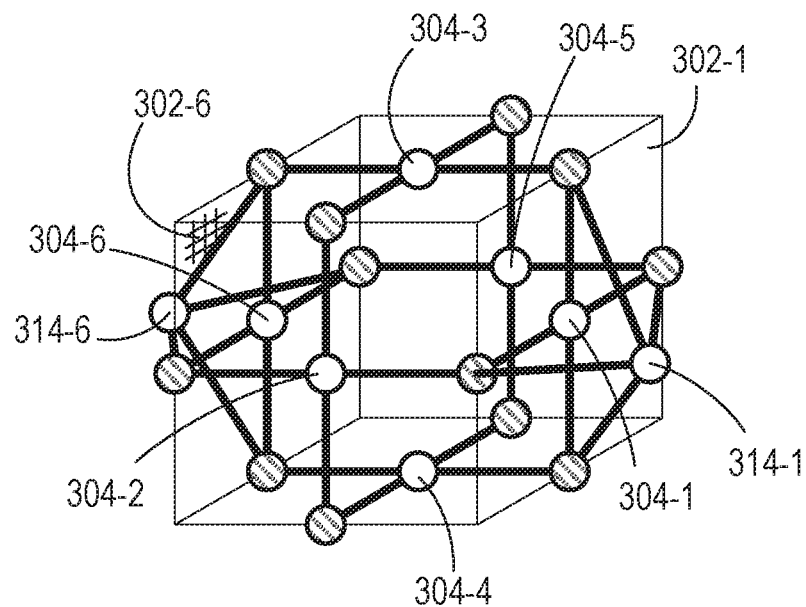
FIG. 4G is a schematic diagram illustrating an example unit cell with two faces each having two or more qubits in accordance with some embodiments.

FIG. 4G is a schematic diagram illustrating an example unit cell with two faces each having two qubits in accordance with some embodiments.

The unit cell shown in FIG. 4G is similar to the unit cell shown in FIG. 4A, except that face 302-6 corresponds to two qubits (e.g., qubits 304-6 and 314-6). Thus, in the unit cell shown in FIG. 4G, each of two faces (e.g., faces 302-1 and 302-6) corresponds to a distinct (and non-overlapping) set of two qubits.

Although FIG. 4G is similar to FIG. 4D, the unit cell shown in FIG. 4G has two pairs of opposite faces each having a distinct set of two qubits.

Figure 4H:
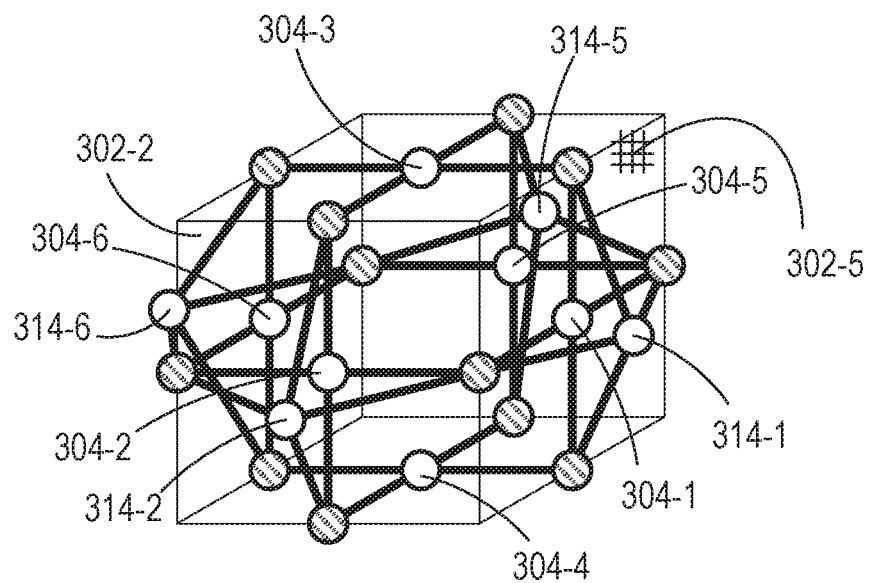
FIG. 4H is a schematic diagram illustrating an example unit cell with four faces each having two or more qubits in accordance with some embodiments.

FIG. 4H is a schematic diagram illustrating an example unit cell with four faces each having two qubits in accordance with some embodiments.

The unit cell shown in FIG. 4H is similar to the unit cell shown in FIG. 4G, except that face 302-2 corresponds to two qubits (e.g., qubits 304-2 and 314-2) and face 302-5 correspond to two qubits (e.g., qubits 304-5 and 314-5). Thus, in the unit cell shown in FIG. 4H, faces 302-1 and 302-6 with distinct sets of two qubits are positioned opposite to each other and faces 302-2 and 302-5 with distinct sets of two qubits are positioned opposite to each other.

Although FIG. 4H is similar to FIG. 4B, in FIG. 4H, the faces corresponding to respective sets of two qubits are opposite to each other, whereas in FIG. 4B, the faces corresponding to respective sets of two qubits are adjacent to each other.

In accordance with some embodiments, cluster states are desclosed herein that have higher fault tolerance than previously known cluster states. Quantum computing operations and quantum computing devices that utilize the novel cluster states have improved efficiency, accuracy, and speed. In addition, the novel cluster states enable more compact and lower cost quantum computers, as fewer components would be needed for error correction. The structures of the novel cluster states (and corresponding lattice structures) are described herein.

Figure 5A:
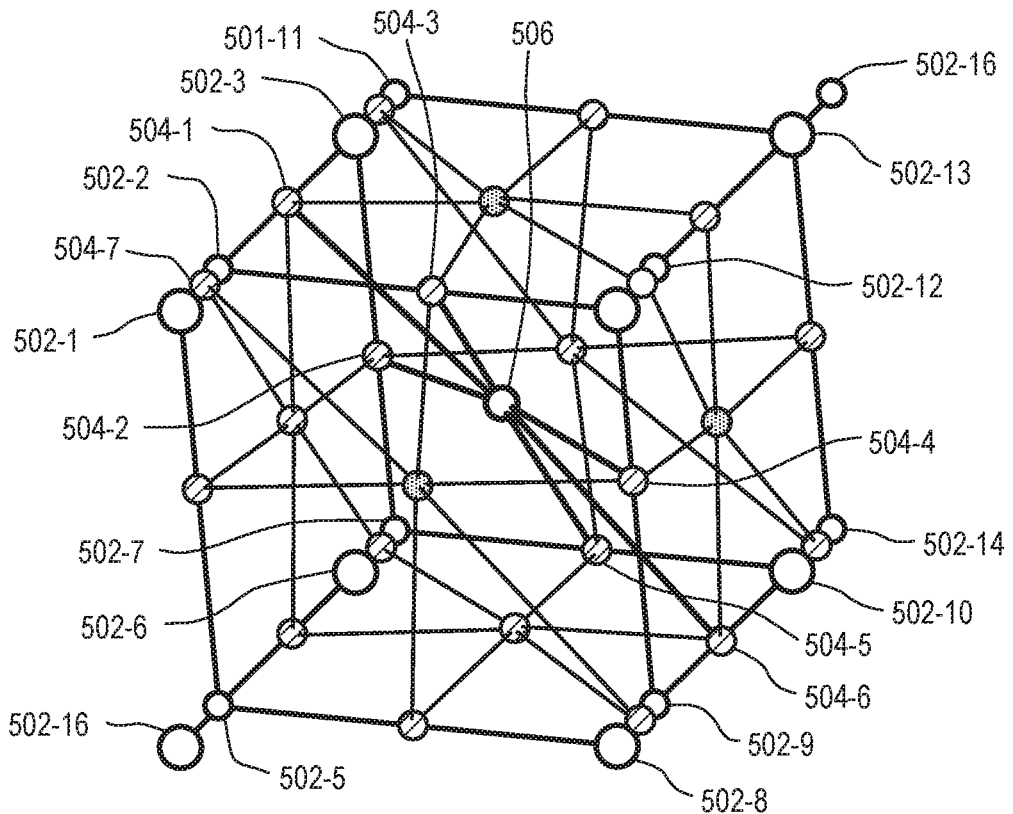
FIG. 5A is a schematic diagram illustrating a pair of lattice cells in accordance with some embodiments.

FIG. 5A is a schematic diagram illustrating a pair of lattice cells in accordance with some embodiments.

Figure 5B:
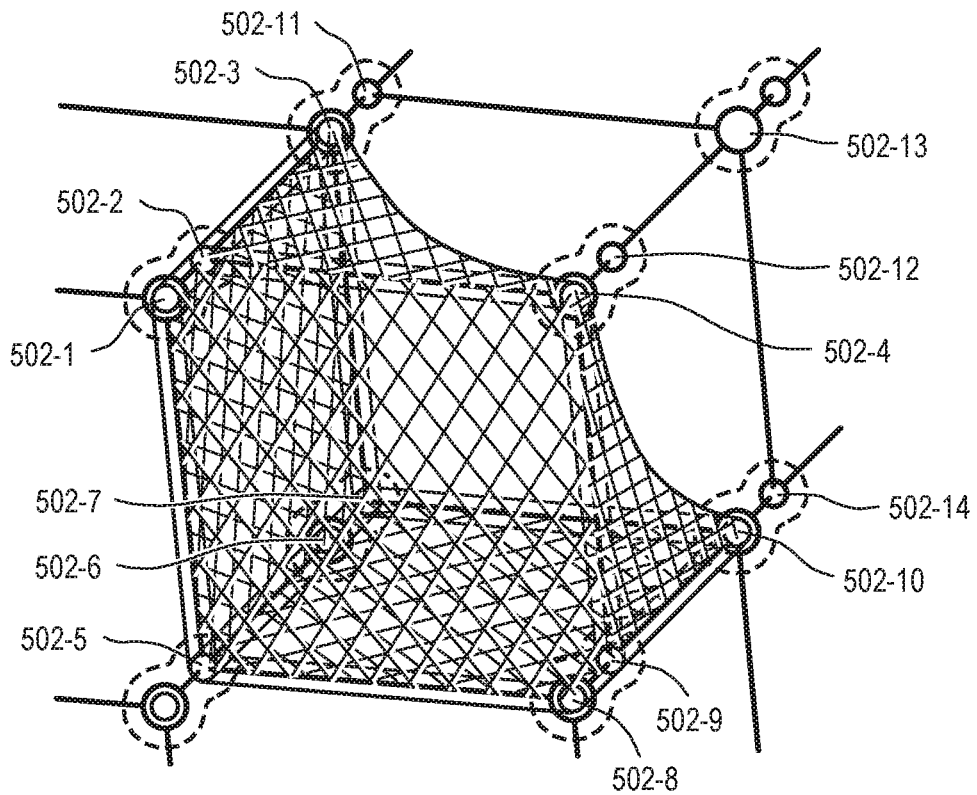
FIG. 5B shows a simplified diagram illustrating the pair of lattice cells shown in FIG. 5A.

In FIG. 5A, light grey circles 502 (e.g., 502-1 through 502-14) represent vertices of lattice cells, also referred to herein as the primal syndrome graph. Grey circles 502-15 and 502-16 also represent adjacent vertices, which are outside the pair of lattice cells. In some cases, vertices represented by grey circles 502-1 through 502-16 are described as part of a unit cell. In FIG. 5B, a section of the primal syndrome graph is shown the surface of one of the cells shown as a shaded region.

In the primal lattice there is a dual qubit, i, and therefore a cluster state stabilizer, $S_i^D$ associated with each primal face, f. Similarly there is a primal cluster state stabilizer, $S^P$, associated with each dual face, $\bar{f}$. A useful way to think about each face, f, is that it represents the X part of the stabilizer while its boundary, $\partial f$, represents the Z part of the stabilizer. This gives us an alternative geometric description of the cluster-state stabilizers as, $$S_i^D = X_f \otimes_{e \in \partial f} Z_e \quad (1)$$

$$S_f^P = X_f \otimes_{\bar{e} \in \partial \bar{f}} Z_{\bar{e}} \quad (2)$$

If we take the product of multiple face stabilizers of the same duality class, we can identify two distinct types of stabilizers. In the first case, we have a product of faces which forms an open surface, in the sense that it has an X-like surface, with a Z-like boundary. In the second case we show a product of faces which forms a closed surface, in this case there is no Z-like boundary.

In the one or more fault tolerant cluster states (FTCS) disclosed herein there is a closed stabilizer associated with every cell, c, of the primal lattice, which is formed by taking the product of all the faces of the cell. These stabilizers will provide the syndrome information that allows error correction to be performed. Similarly, for the dual lattice there is a closed stabilizer for every cell, $\bar{c} \in \bar{C}$.

$$S_c^P = \otimes_{f \in \partial (c)} X_f \quad (3)$$

$$S_{\bar{c}}^D = X_{\bar{f}} \otimes_{\bar{f} \in \partial (\bar{c})} X_{\bar{f}} \quad (4)$$

The closed stabilizers form subgroup of the cluster state stabilizer group, $S_c^P \subset S^P$. The existence of this group of closed stabilizers is what gives the FTCS its fault tolerant properties. In the bulk of the lattice all qubits are measured in the X basis, which means the only stabilizers that can be reconstructed after measurement are those which contain no Z-component.

Returning to FIG. 5A, black circles (e.g., black circles 504-1 through 504-7 and other black circles without reference numbers) represent qubits (e.g., face qubits and edge qubits). Circle 506 also represents a qubit (e.g., a face qubit). Dark black lines between black circles 504 and between black circle 504 and circle 506 represent entanglements between qubits. Grey lines are used to indicate an outline of the syndrome graph (called herein a diamond syndrome graph). In FIG. 5A, each edge (e.g., a line connecting two vertices) corresponds to one qubit and each face corresponds to one qubit, similar to the unit cells shown in FIGS. 4A and 4B.

FIG. 5B shows a simplified diagram illustrating the pair of lattice cells shown in FIG. 5A. In FIG. 5B, vertices 502 and faces defined by vertices 502 are shown. However, qubits are not illustrated in FIG. 5B so as not to obscure other aspects of lattice cells. The structure is self-dual and is made up of two identical cells that each have 4 hexagonal faces. A section of the primal syndrome graph, along with one of the cells of the geometry which is highlighted by the shaded region. Each cell has four hexagonal faces, but is not a convex polyhedron.

Figure 5C:
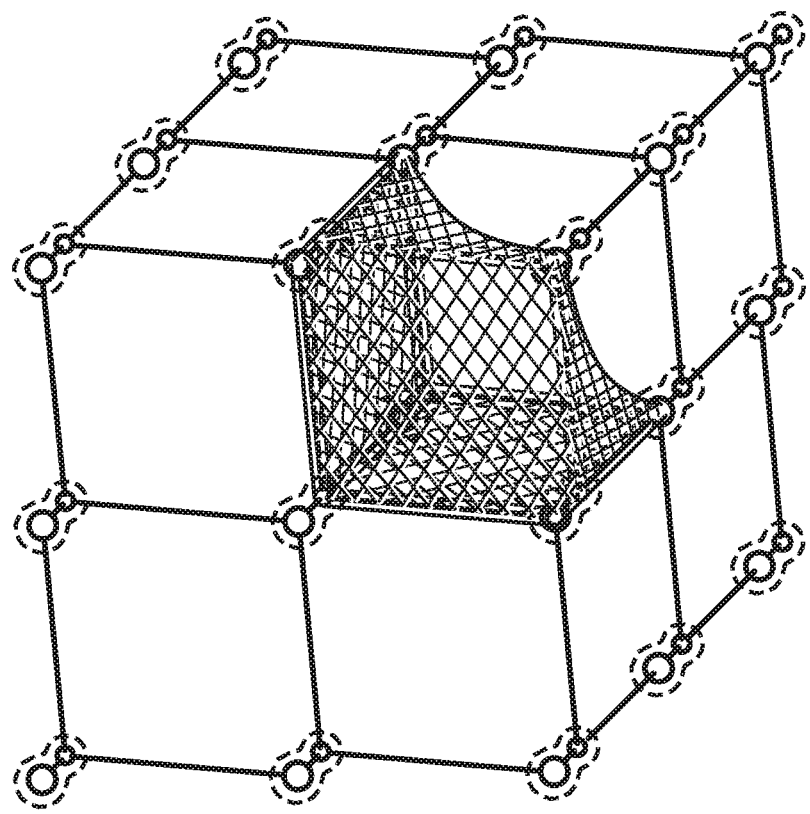
FIG. 5C illustrates multiple contiguous pairs of lattice cells in accordance with some embodiments.

FIG. 5C illustrates multiple contiguous pairs of syndrome lattice cells for the diamond lattice cluster state in accordance with some embodiments.

Figure 5D:
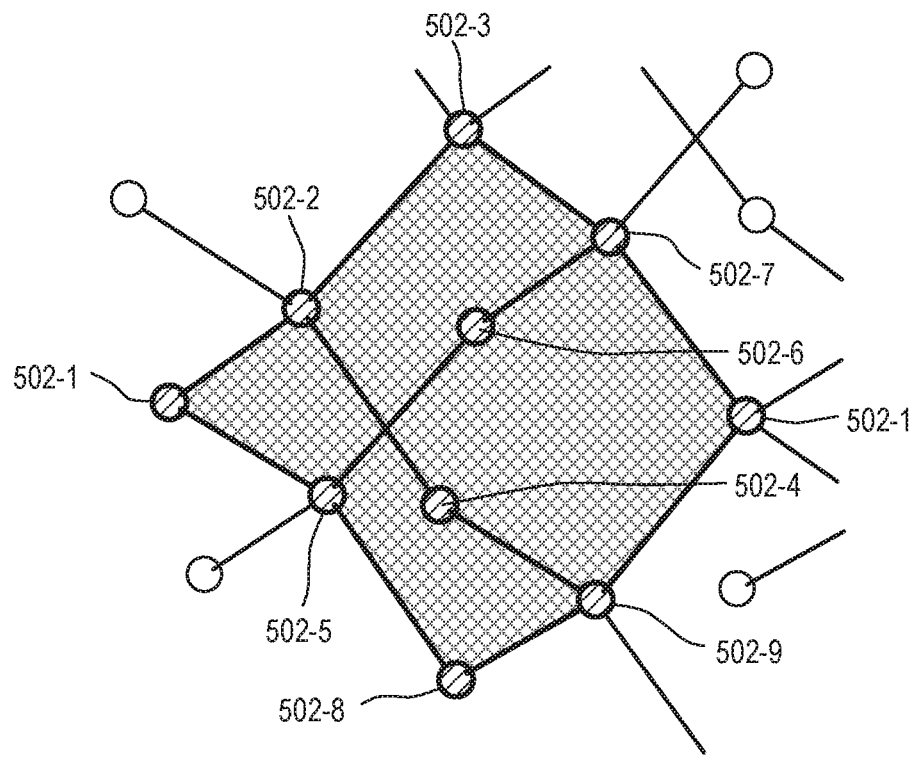
FIG. 5D is an alternative illustration of a lattice cell shown in FIG. 5B.

FIG. 5D is an alternative illustration of a syndrome lattice cell shown in FIG. 5B. In FIG. 5D, vertices 502 are arranged so that edges between vertices 502 have a same length and the faces defined by vertices 502 have a same shape. However, the lattice cell shown in FIG. 5D is equivalent to the lattice cell shown in FIG. 5B in terms of its physical properties (e.g., fault tolerance). In some cases, the lattice cell shown in FIG. 5B is called herein a "diamond lattice."

As shown in FIG. 5D, the lattice cell has four faces.

Figure 5E:
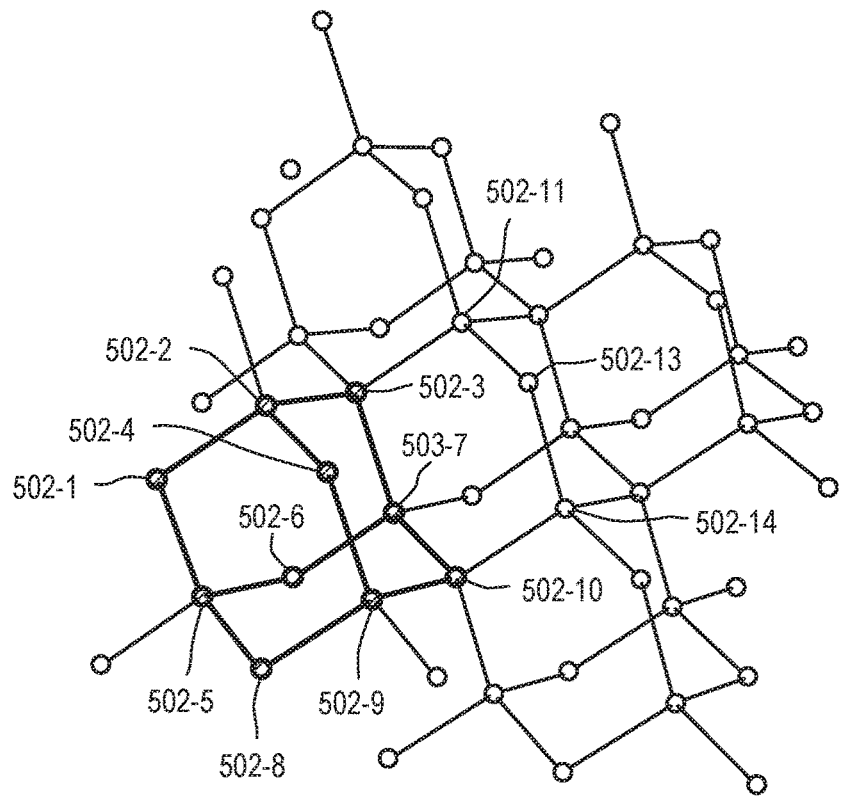
FIG. 5E illustrates the lattice cell of FIG. 5D, arranged in a different orientation.

FIG. 5E illustrates the lattice cell of FIG. 5D, arranged in a different orientation.

Figure 5F:
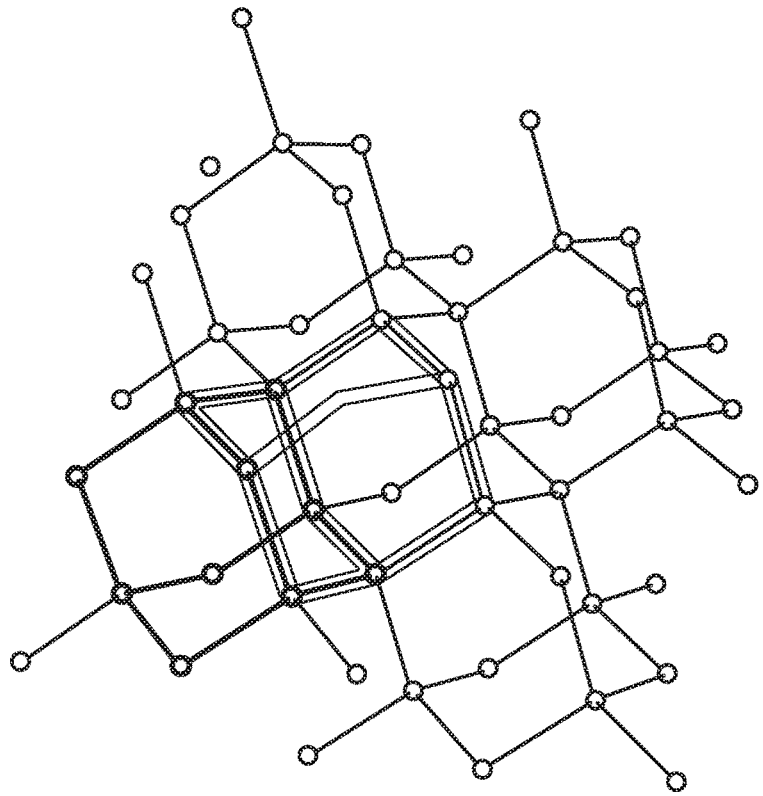
FIG. 5F is an alternative illustration of the pair of lattice cells shown in FIG. 5B.

FIG. 5F is an alternative illustration of the pair of lattice cells shown in FIG. 5B. In FIG. 5F, the first lattice cell (outlined in blue) has four hexagonal faces and the second lattice cell (outlined in red) has four hexagonal faces. The first lattice cell and the second lattice cell have a common face. As a result, the pair of lattice cells shown in FIG. 5F collectively has seven faces.

Figure 5G:
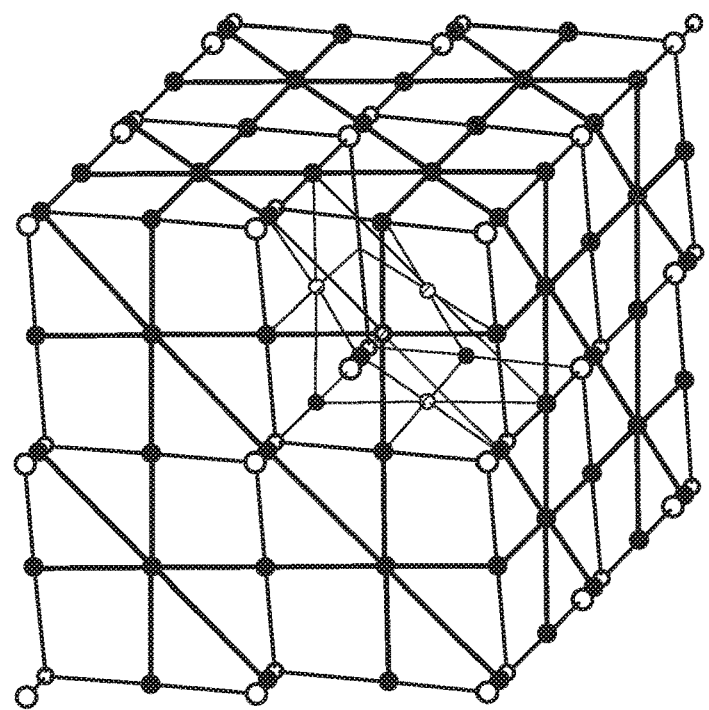
FIG. 5G shows an example of multiple unit cells of the diamond lattice cluster state.
Figure 5H:
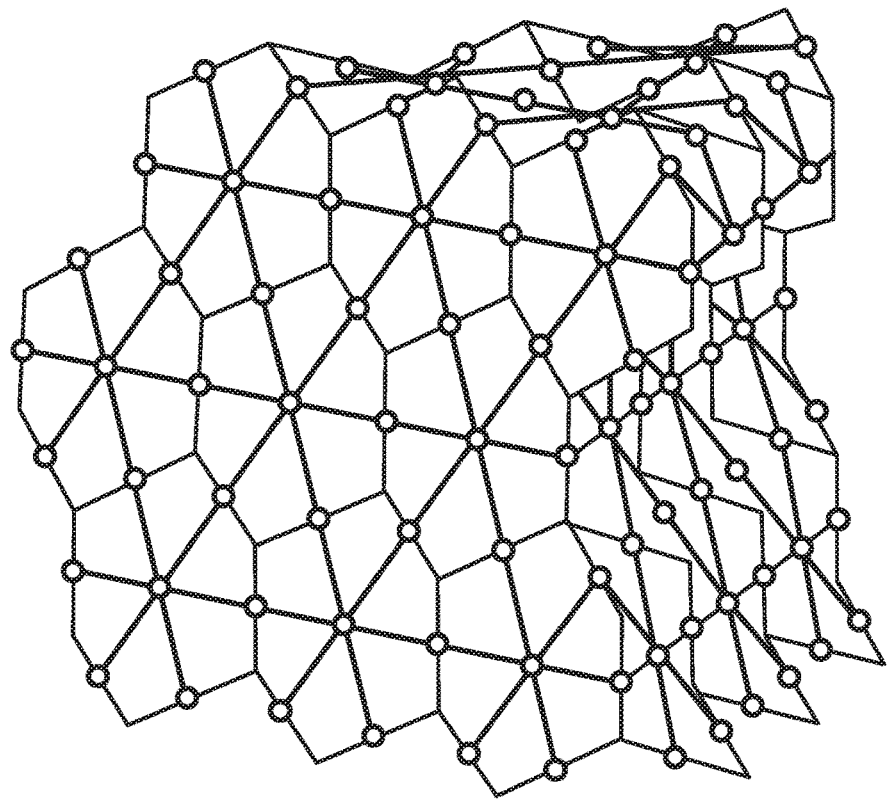
FIG. 5H is an alternative illustration of the diamond lattice cluster state shown in FIG. 5G.

FIG. 5G shows an example of multiple unit cells of the diamond lattice cluster state. The primal syndrome graph is shown with dual qubits on each face and primal qubits on each edge. The diamond lattice cluster state can also be presented in a symmetric configuration corresponding to the more familiar representation of the diamond lattice, as shown in FIG. 5H. Here all bonds have equal length, and each cell is identical.

Figure 6A:
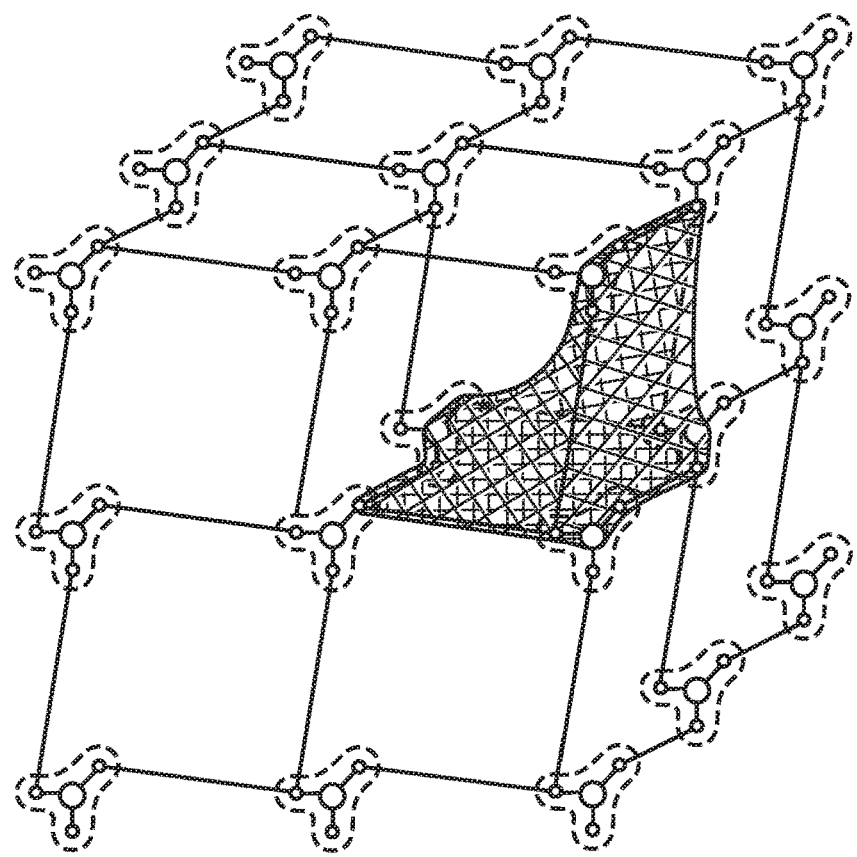
FIG. 6A illustrates a plurality of lattice cells in accordance with some embodiments.

FIG. 6A illustrates a plurality of lattice cells in accordance with some embodiments, referred to herein as the triamond syndrome lattice. In the primal picture, the cube is divided into 4 cells, each with 3 faces.

In FIG. 6A, the highlighted lattice cell (e.g., outlined in blue) has fourteen vertices and three decagonal faces.

Figure 6B:
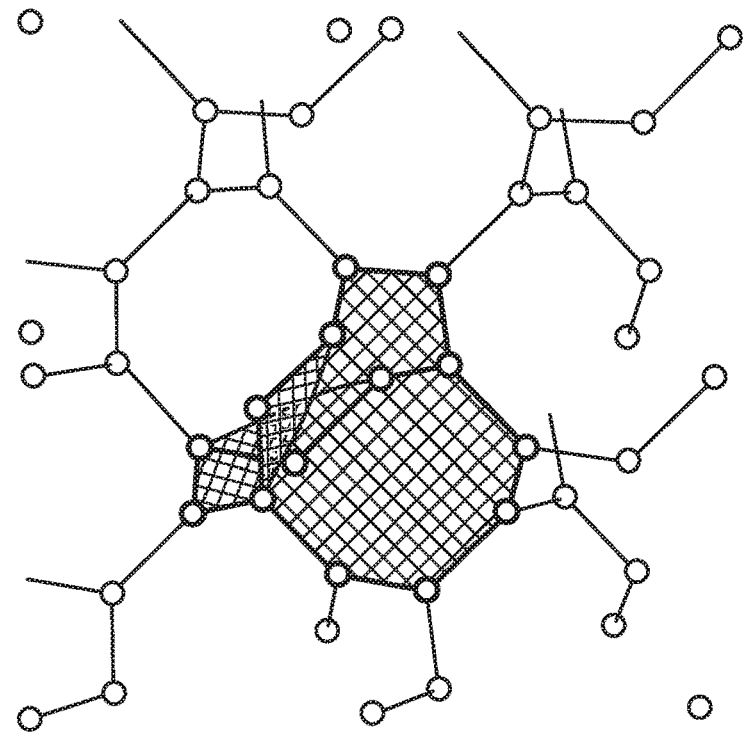
FIG. 6B is an alternative illustration of the lattice cell shown in FIG. 6A.

FIG. 6B is an alternative illustration of the lattice cell shown in FIG. 6A. In FIG. 6B, the vertices are arranged so that edges between the vertices have a same length and the faces defined by the vertices have a same shape. However, the lattice cell shown in FIG. 6B is equivalent to the lattice cell shown in FIG. 6A in terms of its physical properties (e.g., fault tolerance). In some cases, the lattice cell shown in FIG. 6B is called herein a "triamond lattice."

Figure 7A:
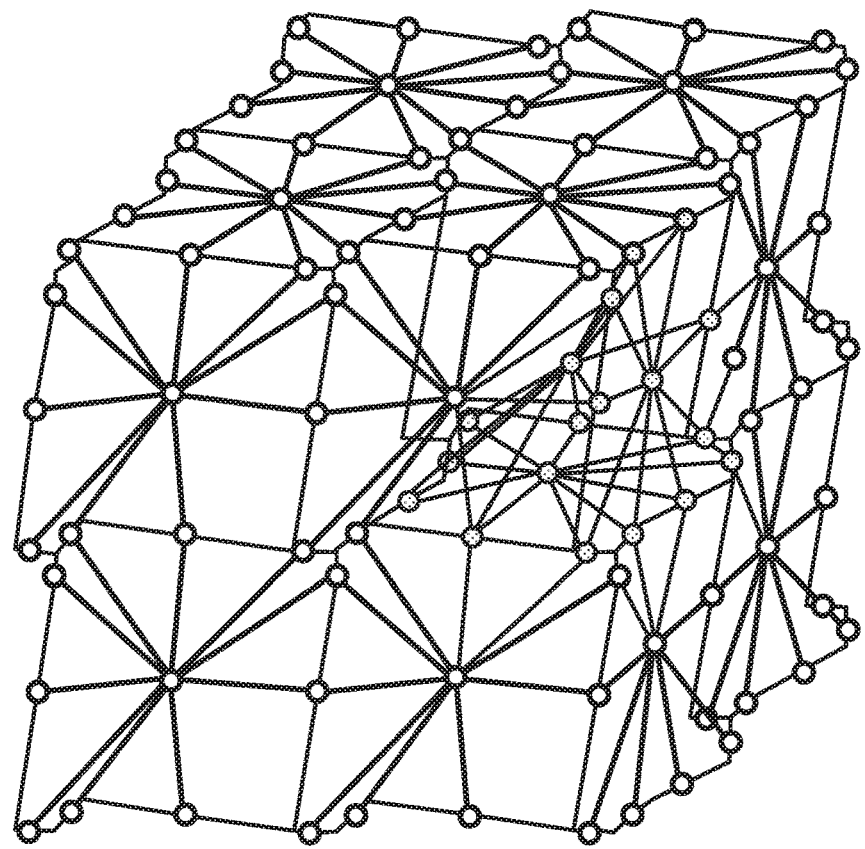
FIG. 7A shows an example of multiple syndrome unit cells of the triamond lattice cluster state.
Figure 7B:
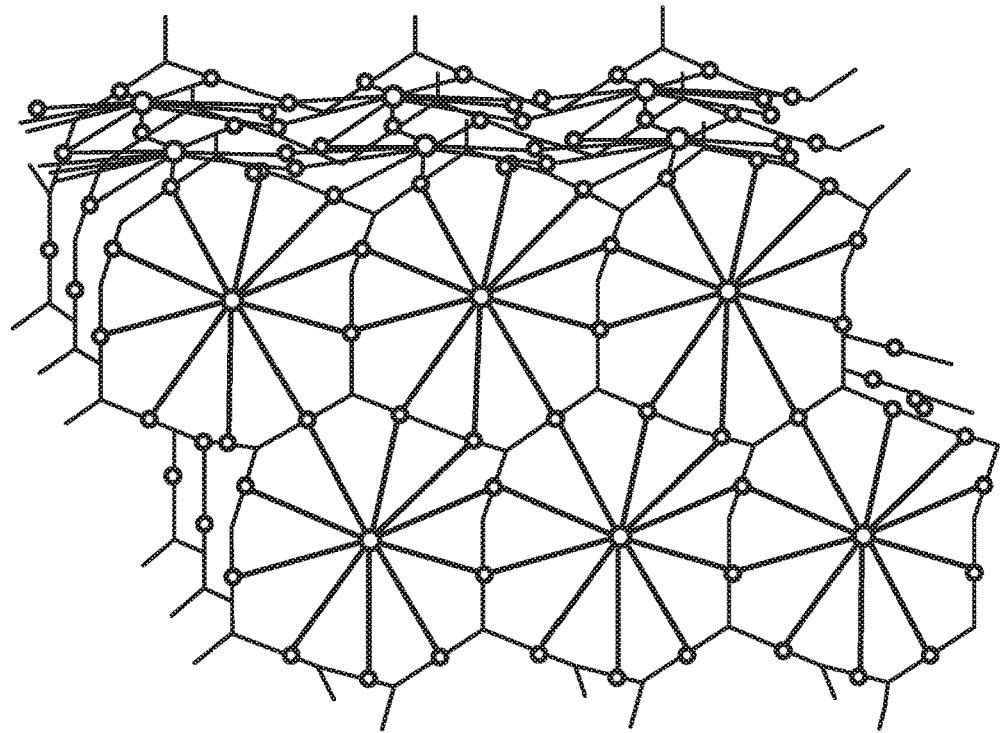
FIG. 7B is an alternative illustration of the triamond lattice cluster state shown in FIG. 7A.

FIG. 7A shows an example of multiple syndrome unit cells of the triamond lattice cluster state. The primal syndrome graph is shown with dual qubits on each face and primal qubits on each edge. The triamond lattice cluster state can also be presented in a symmetric configuration corresponding to the more familiar representation of the triamond lattice, as shown in FIG. 7B. Here all bonds have equal length, and each cell is identical.

A cluster state based on any of the lattice cells shown in 5A-5F and 6A-6B has a higher fault tolerance than a cluster state based on the unit cell shown in FIG. 3B. For example, the fault tolerance obtained by using the unit cell shown in FIG. 3B, the improved fault tolerance obtained by using the lattice cell shown in FIG. 5F, and the improved fault tolerance obtained by using the lattice cell shown in FIG. 6B are shown in the following table:

| | Erasure Threshold | Pauli (Z) Error Threshold (Union-Find Decoder) | Cluster State Bond Degree | Pauli Threshold/Bond |
| --- | --- | --- | --- | --- |
| Unit Cell of FIG. 3B | 24.9% | 2.2% | 4 | 0.55% |
| Lattice Cell of FIG. 5G-5H "Diamond Lattice" | 39% | 5.2% | 6 | 0.87% |
| Lattice Cell of FIG. 7A-7B "Triamond Lattice" | 55% | 9.5% | 10 | 0.95% |

As shown above, both the lattice cell shown in FIGS. 5G-5H and the lattice cell shown in FIGS. 7A-7B have more than 50% higher fault tolerance for erasure and more than two times fault tolerance for Pauli error compared to the unit cell shown in FIG. 3B. In particular, the lattice cell shown in FIGS. 7A-7B ("triamond lattice") has more than two times fault tolerance for erasure and more than four times fault tolerance for Pauli error compared to the unit cell shown in FIG. 3B. Even when the increased number of bonds is accounted for, the Pauli error threshold per bond is more than 50% higher with the unit cell shown in FIGS. 7A-7B than the unit cell shown in FIG. 3B.

FIG. 7 is a schematic diagram illustrating an example cluster state with a plurality of unit cells in accordance with some embodiments.

In FIG. 7, the cluster state includes a plurality of contiguous unit cells (e.g., any of the plurality of unit cells has a face that is overlapped by a face of another of the plurality of unit cells). In FIG. 7, respective unit cells of the plurality of contiguous unit cells correspond to the unit cell shown in FIG. 7F. However, in some implementations, a cluster state includes a plurality of unit cells, each unit cell of the plurality of unit cells corresponding to any unit cell described herein (e.g., any of the unit cells described with respect to FIGS. 7A-7H, 8A-8P, and 6).

FIGS. 8A-8D are schematic diagrams illustrating example unit cells in accordance with some embodiments.

Figure 8A:
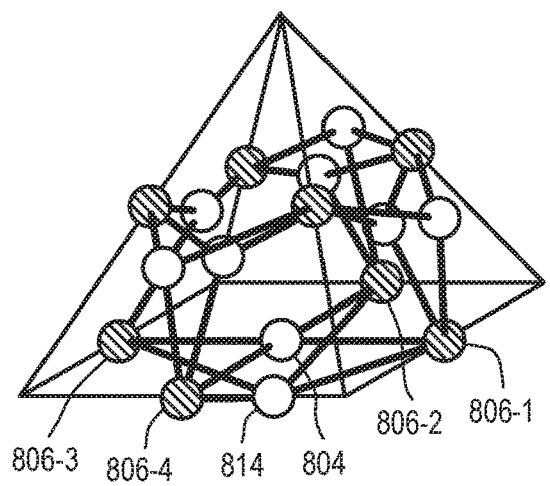
FIGS. 8A-8D are schematic diagrams illustrating example unit cells in accordance with some embodiments.

The unit cell shown in FIG. 8A has a shape of a pyramid (e.g., a rectangular pyramid, such as a rectangular right pyramid).

The unit cell in FIG. 8A has five faces. In FIG. 8A, each face of the unit cell has two corresponding qubits. Each face qubit of the unit cell shown in FIG. 8A is entangled with edge qubits of edges defining (e.g., bordering) the corresponding face. For example, the bottom face of the unit cell has two corresponding qubits 804 and 814. Each of qubits 804 and 814 is entangled with qubits 806-1, 806-2, 806-3, and 806-4.

Although FIG. 8A illustrates that each face of the unit cell has two corresponding qubits, in some implementations, each face of only a subset of the faces of the unit cell has two corresponding qubits. For example, only the bottom face of the unit cell may have two (or more) corresponding qubits. In another example, only a side face of the unit cell may have two (or more) corresponding qubits.

Figure 8B:
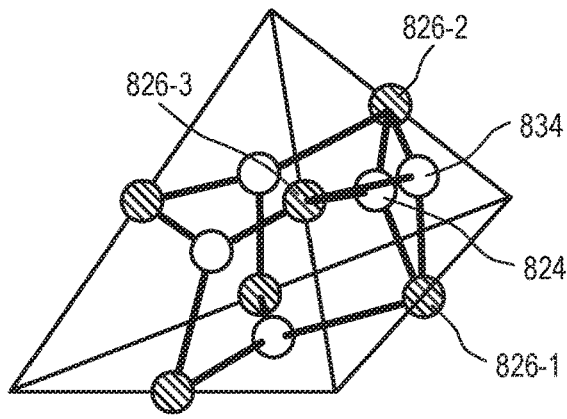

The unit cell shown in FIG. 8B has a shape of a tetrahedron. The unit cell shown in FIG. 8B has four faces. In FIG. 8B, at least one face of the unit cell has two corresponding face qubits 824 and 834. Each face qubit of the two face qubits 824 and 834 shown in FIG. 8B is entangled with edge qubits 826-1, 826-2, and 826-3 of edges defining (e.g., bordering) the corresponding face.

Although FIG. 8B illustrates that only one face of the unit cell has two corresponding qubits, in some implementations, any of the faces of the unit cell has two corresponding qubits.

Figure 8C:
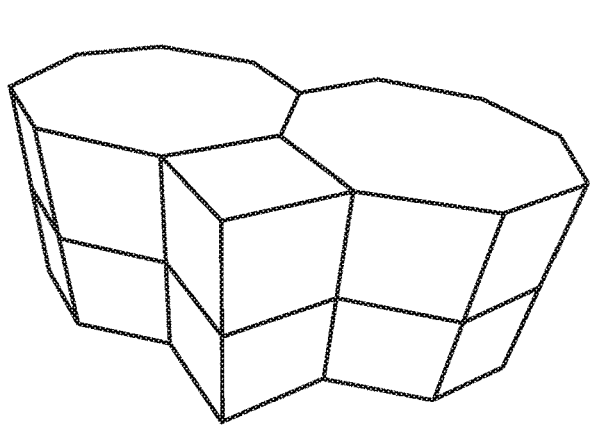
Figure 8D:
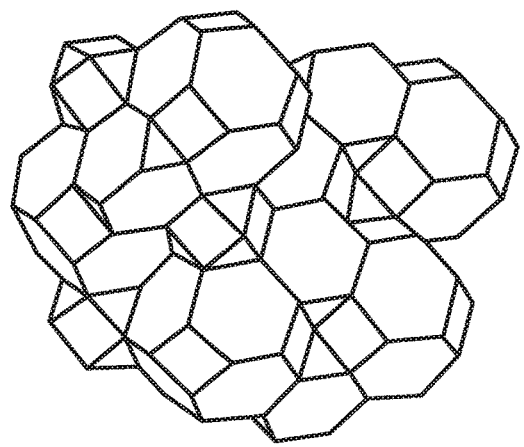

FIGS. 8C and 8D illustrate additional example unit cells. Some of the unit cells shown in FIGS. 8C and 8D have hexagonal faces and/or octagonal faces. In some embodiments, a unit cell has a shape of a truncated polyhedron (e.g., a truncated octahedron).

In some implementations, each of any subset of the faces (of the cells shown in FIGS. 8A-8D) is configured to correspond to two or more qubits (e.g., three qubits) and/or each of any subset of the edges (of the cells shown in FIGS. 8A-8D) is configured to correspond to two or more qubits (e.g., three qubits).

In general any FTCS can be constructed according to the following construction. There is a primal (dual) closed stabilizers associated with every cell C according to equations 3 above. There is a primal (dual) cluster state stabilizer associated with every face of the dual (primal) cell complex according to equation 1 above. To construct the cluster state, primal qubits are located at every edge of the primal lattice and on every face of the dual lattice. Dual qubits are located at every face of the primal lattice and every edge of the dual lattice. A cell complex, C always has a dual cell complex C*, so if the primal lattice forms a valid primal code, then the dual lattice must also do so. This means there are both primal and dual code stabilizers. There is no requirement that the cell complex be self-dual. As long as the cell complex fills space then it is always possible to find a sheet of connected faces that extends through the lattice. With suitable boundary conditions that allow the sheet to terminate, this gives us a logical correlation operator.

Several examples of cell complexes representing surface-code FTCSs are shown in FIG. 8A-8D. These cluster states represent a fault tolerant map between two 2-d surface codes on the boundaries of the state.

We comment briefly on the relationship of these states to foliated surface codes. The process of foliation can be thought of as encoding multiple rounds of stabilizer measurement on a code into a cluster state. Foliation of the surface code on a square lattice results in the cubic FTCS, but the process can be applied to an arbitrary surface code. Any foliation of a 2-d surface code will produce an FTCS which is made up of layers of prismatic cells. An example is shown in FIG. 8C. Faces of the cell complex in the x-y plane may have any shape, but all faces in the z-direction are rectangular. In foliated codes there is an intuitive notion of an input state (the first layer of the cluster state), and an output state (the final layer of the cluster state). Both the input and output are the same 2-d surface code, and the cluster state between the two layers forms the fault-tolerant channel between them. FIG. 8D shows an example of a cell complex without a layered structure, and therefore with no natural interpretation as a foliated code. Any cell complex that completely fills space defines a FTCS.

Although FIGS. 3A-3D, 7A-7H, 8A-8P, 6A-6C, 7, and 8A-8D illustrate cluster states in particular graphical representations, a person having ordinary skill in the art would understand that the same cluster states may be illustrated in other graphical representations. These graphical representations have been selected to illustrate the entanglements among a plurality of qubits. However, these graphical representations do not necessarily indicate physical locations of the represented plurality of qubits. Thus, equivalents and analogs (e.g., physical and/or geometrical equivalents) of the illustrated cluster states are within the scope of claims.

In FIGS. 3A-3D, 7A-7H, 8A-8P, 6A-6C, 7, and 8A-8D, each qubit of the cluster states may have any qubit state. In some embodiments, one or more qubits of any cluster state are further processed (e.g., using one or more gates for quantum operations, such as rotations) subsequent to formation of the cluster state while the other qubits of the cluster state are not processed in a same manner (e.g., the other qubits are not put through the one or more gates for the same quantum operations). In some embodiments, one or more qubits are processed (e.g., using one or more gates for quantum operations, such as rotations) prior to formation of a cluster state while the other qubits to be included in the cluster state are not processed in a same manner (e.g., the other qubits are not put through the one or more gates for the same quantum operations).

In some cases, qubits in one or more cluster states (e.g., cluster states illustrated in FIGS. 3A-3D, 7A-7H, 8A-8P, 6A-6C, 7, and 8A-8D) are used in a quantum memory device. Due to the multiple entanglements among the qubits, such cluster states can maintain quantum information in case of an erasure (e.g., a loss of a qubit or a loss of qubit information for a particular qubit) or a Pauli error (e.g., a measurement error). A cluster state having a high fault tolerance (e.g., cluster states illustrated in FIGS. 7A-7H, 8A-8P, 6A-6C, 7, and 8A-8D) can preserve the quantum information even in the event of multiple erasures or multiple Pauli errors, and thus, enables a more robust quantum memory device. The use of the cluster state having a high fault tolerance, in turn, improves the performance and reduces the size of a quantum memory device, as it requires a less stringent error correction mechanism or fewer qubits to provide a particular level of fault tolerance.

Figure 9A:
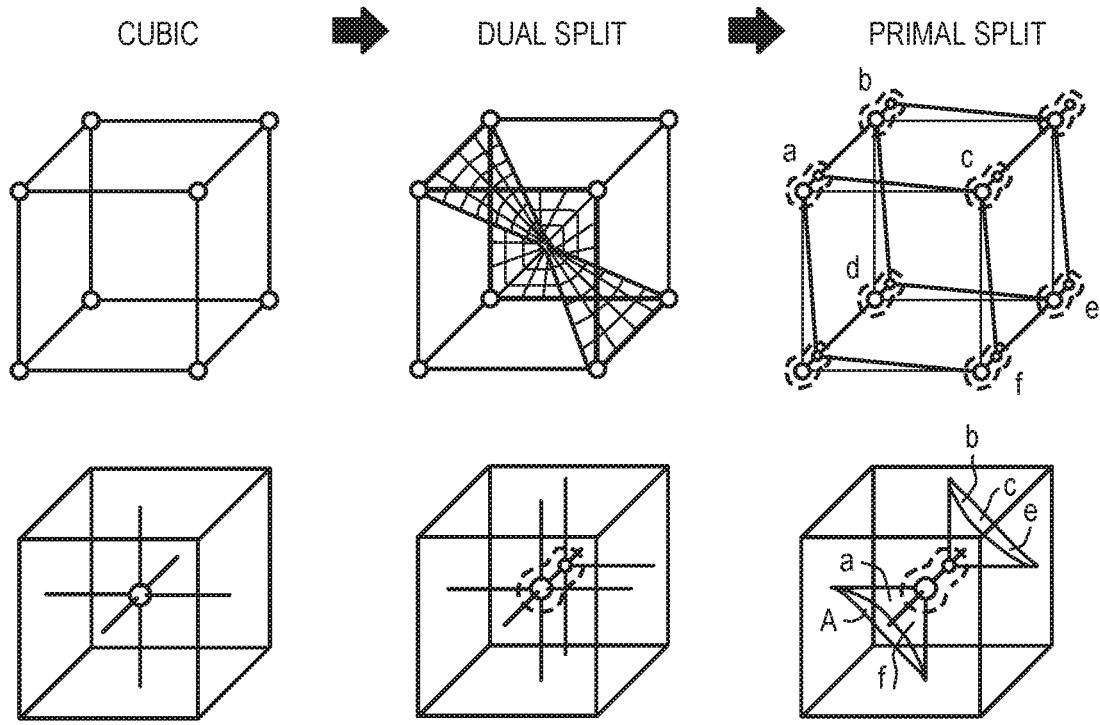
FIG. 9A is a schematic diagram illustrating modification of a cubical lattice to obtain a pair of diamond lattice cells in accordance with some embodiments.

FIG. 9A is a schematic diagram illustrating modification of a cubical lattice to obtain a pair of diamond lattice cells in accordance with some embodiments.

In FIG. 9A, a cubical lattice having eight vertices and six faces is modified (in an operation called dual split) to insert an additional face (e.g., a seventh face). In some cases, this includes placing a face qubit (e.g., qubit 506 in FIG. 5A), corresponding to the additional face, within the lattice. The face qubit is entangled with edge qubits that correspond to edges of the face corresponding to the face qubit (e.g., in FIG. 5A, qubit 506 is entangled with each of edge qubits 504-1, 504-2, 504-3, 504-4, 504-5, and 504-6).

In addition, the cubical lattice is modified (in an operation called primal split) by replacing each vertex with a pair of vertices connected by an edge. The resulting lattice cells, collectively having seven faces, correspond to the lattice cells shown in FIG. 5B.

Figure 9B:
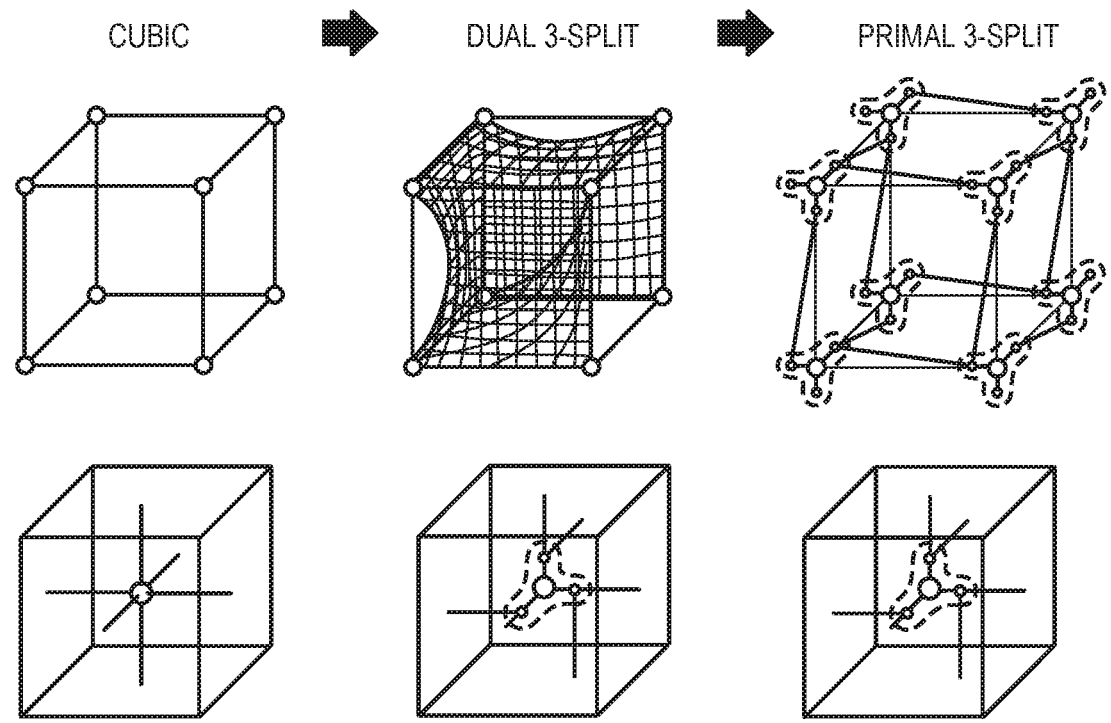
FIG. 9B is a schematic diagram illustrating modification of a cubical lattice to obtain a set of triamond lattice cells in accordance with some embodiments.

FIG. 9B is a schematic diagram illustrating modification of a cubical lattice to obtain a set of triamond lattice cells in accordance with some embodiments.

In FIG. 9B, a cubical lattice having eight vertices and six faces is modified (in dual split) to insert three additional faces (e.g., seventh, eighth, and ninth faces). In some cases, this includes placing three face qubits, each corresponding to an additional face, within the lattice.

In addition, the cubical lattice is modified (in primal split), each vertex is replaced with a set of four vertices (or three vertices are added for each exiting vertex). The resulting lattice cells, collectively having nine faces, correspond to the lattice cells shown in FIG. 6A.

A person having ordinary skill in the art would understand from this disclosure that analogous lattice cells can be formed. For example, a cubical lattice may be modified to insert four or more additional faces and replace each vertex with a set of five or more vertices. For brevity, such details are omitted herein.

In some implementations, each vertex of a cubical lattice is replaced with multiple vertices. In some implementations, only a subset, less than all, of vertices of a cubical lattice is replaced with a respective set of multiple vertices (e.g., only one vertex of a cubical lattice is replaced with two vertices).

In some embodiments, the same lattice cell is repeated throughout a cluster state (e.g., each cell of the cluster state has a same configuration).

In some embodiments, a cluster state includes lattice cells of two or more distinct configurations. In some implementations, a first subset of lattice cells has a first shape (e.g., a diamond lattice) and a second subset of lattice cells has a second shape that is distinct from the first shape (e.g., a cubical lattice). In another example, each lattice cell of the first subset of lattice cells has a first number of vertices replaced with two or more vertices (e.g., only one vertex of a cubical lattice is replaced with two vertices), and each lattice cell of the second subset of lattice cells has a second number of vertices replaced with two or more vertices (e.g., every vertex of a cubical lattice is replaced with two or more vertices).

FIG. 10 is a flowchart representing method 1000 of obtaining a plurality of entangled qubits in accordance with some embodiments. Method 1000 is performed using a quantum entanglement generator (e.g., quantum entanglement generator 174).

Method 1000 includes (1010) obtaining a plurality of entangled qubits represented by a lattice structure (e.g., FIG. 5A). The lattice structure includes a plurality of contiguous lattice cells (e.g., a plurality of contiguous lattice cells, such as lattice cells shown in FIGS. 5A-5H, 6A-6B, and 7A-7B).

In some embodiments, obtaining the plurality of entangled qubits includes (1020) fusing (i) at least one qubit of a first set of multiple entangled qubits (e.g., qubits 331, 333, 335, 337, and 339 in FIG. 3D) and (ii) at least one qubit of a second set of multiple entangled qubits (e.g., qubits 341, 343, 345, 347, and 349 in FIG. 3D). The second set of multiple entangled qubits is mutually exclusive from the first set of multiple entangled qubits.

In some embodiments, the first set of multiple entangled qubits includes three or more qubits (e.g., qubits 331, 333, 335, 337, and 339 in FIG. 3D); and the second set of multiple entangled qubits includes two or more qubits (e.g., qubits 341, 343, 345, 347, and 349 in FIG. 3D).

In some embodiments, obtaining the plurality of entangled qubits includes (1030): receiving a first set of entangled qubits, including a first center qubit entangled with three or more peripheral qubits; receiving a second set of entangled qubits, including a second center qubits entangled with three or more peripheral qubits, the second set of entangled qubits is mutually exclusive to the first set of entangled qubits; and fusing each peripheral qubit of the first set of entangled qubits with a respective peripheral qubit of the second set of entangled qubits (e.g., FIG. 3D).

In some embodiments, obtaining the plurality of entangled qubits includes receiving a first set of entangled qubits, receiving a second set of entangled qubits, and causing entanglement of at least a subset of the first set of entangled qubits and at least a subset of the second set of entangled qubits (e.g., by placing two matter particles, such as ions, in proximity of each other).

In some embodiments, the method includes performing measurements on at least a subset of the plurality of entangled qubits (e.g., measurements in X-basis).

In some embodiments, the method includes providing results of the measurements from a quantum computer to one or more classical computers (e.g., a conventional computer having semiconductor-based processor(s)).

It should be noted that details described herein with respect to the structures of the plurality of entangled qubits are also applicable in an analogous manner to method 1000 described above with respect to FIG. 10. For brevity, these details are not repeated herein.

In addition, method 1000 may include one or more features described herein with respect to method 1100, method 1200, method 1220, method 1240, and method 1260. For brevity, such details are not repeated herein.

FIG. 11 is a flowchart representing method 1100 of obtaining a plurality of entangled qubits in accordance with some embodiments.

Method 1100 includes (1110) obtaining a plurality of entangled qubits represented by a lattice structure. The lattice structure includes a plurality of contiguous lattice cells.

In some embodiments, a particular lattice cell includes (1120) ten distinct vertices that include a first vertex, a second vertex, a third vertex, a fourth vertex, a fifth vertex, a sixth vertex, a seventh vertex, an eighth vertex, a ninth vertex, and a tenth vertex (e.g., vertices 502-1 through 502-10 in FIG. 5A). The first vertex and the second vertex are coupled by a first edge of the lattice cell. The second vertex and the third vertex are coupled by a second edge of the lattice cell. The fifth vertex and the sixth vertex are coupled by a third edge of the lattice cell. The sixth vertex and the seventh vertex are coupled by a fourth edge of the lattice cell. The eighth vertex and the ninth vertex are coupled by a fifth edge of the lattice cell. The ninth vertex and the tenth vertex are coupled by a sixth edge of the lattice cell. The first vertex and the fifth vertex are coupled by a seventh edge of the lattice cell. The third vertex and the seventh vertex are coupled by an eighth edge of the lattice cell. The fourth vertex and the ninth vertex are coupled by a ninth edge of the lattice cell. The second vertex and the fourth vertex are coupled by a tenth edge of the lattice cell. The fifth vertex and the eighth vertex are coupled by an eleventh edge of the lattice cell. The seventh vertex and the tenth vertex are coupled by a twelfth edge of the lattice cell. The first edge, the second edge, the third edge, the fourth edge, the fifth edge, the sixth edge, the seventh edge, the eighth edge, the ninth edge, the tenth edge, the eleventh edge, and the twelfth edge are distinct from one another (e.g., ten vertices 502-1 through 502-10 are coupled using twelve edges). In some embodiments, the ten vertices are not coupled by any edge other than the twelve edges.

In some embodiments, the first vertex, the second vertex, the fourth vertex, the ninth vertex, the eighth vertex, and the fifth vertex define a first face. The second vertex, the third vertex, the seventh vertex, the tenth vertex, the ninth vertex, and the fourth vertex define a second face. The first vertex, the second vertex, the third vertex, the seventh vertex, the sixth vertex, and the fifth vertex define a third face. The fifth vertex, the sixth vertex, the seventh vertex, the tenth vertex, the ninth vertex, and the eighth vertex define a fourth face. The first face, the second face, the third face, and the fourth face are distinct from one another. This configuration is sometimes called a diamond lattice (e.g., FIG. 5D).

In some embodiments, each lattice cell of the plurality of contiguous lattice cells has a shape that corresponds to the particular lattice cell (e.g., FIG. 5C).

In some embodiments, a first subset of the plurality of contiguous lattice cells has multiple lattice cells each having a shape that corresponds to the particular lattice cell; and a second subset of the plurality of contiguous lattice cells has multiple lattice cells that do not have a shape that corresponds to the particular lattice cell (e.g., the second subset of the plurality of contiguous lattice cells has a shape that is distinct from the shape of the particular lattice cell).

In some embodiments, the particular lattice cell does not have a shape of a convex polyhedron (e.g., the diamond lattice does not have a shape of a convex polyhedron).

In some embodiments, a respective lattice cell includes ten vertices that include: a first vertex; a second vertex that is distinct from the first vertex; a third vertex that is distinct from the first vertex and the second vertex; a fourth vertex that is distinct from the first vertex, the second vertex, and the third vertex; a fifth vertex that is distinct from the first vertex, the second vertex, the third vertex, and the fourth vertex; a sixth vertex that is distinct from the first vertex, the second vertex, the third vertex, the fourth vertex, and the fifth vertex; a seventh vertex that is distinct from the first vertex, the second vertex, the third vertex, the fourth vertex, the fifth vertex and the sixth vertex; an eighth vertex that is distinct from the first vertex, the second vertex, the third vertex, the fourth vertex, the fifth vertex, the sixth vertex, and the seventh vertex; a ninth vertex that is distinct from the first vertex, the second vertex, the third vertex, the fourth vertex, the fifth vertex, the sixth vertex, the seventh vertex, and the eighth vertex; and a tenth vertex that is distinct from the first vertex, the second vertex, the third vertex, the fourth vertex, the fifth vertex, the sixth vertex, the seventh vertex, the eighth vertex, and the ninth vertex. The first vertex and the second vertex are coupled by a first edge of the lattice cell. The second vertex and the third vertex are coupled by a second edge of the lattice cell that is distinct from the first edge. The fifth vertex and the sixth vertex are coupled by a third edge of the lattice cell that is distinct from the first edge and the second edge. The sixth vertex and the seventh vertex are coupled by a fourth edge of the lattice cell that is distinct from the first edge, the second edge, and the third edge. The eighth vertex and the ninth vertex are coupled by a fifth edge of the lattice cell that is distinct from the first edge, the second edge, the third edge, and the fourth edge. The ninth vertex and the tenth vertex are coupled by a sixth edge of the lattice cell that is distinct from the first edge, the second edge, the third edge, the fourth edge and the fifth edge. The first vertex and the fifth vertex are coupled by a seventh edge of the lattice cell that is distinct from the first edge, the second edge, the third edge, the fourth edge, the fifth edge, and the sixth edge. The third vertex and the seventh vertex are coupled by an eighth edge of the lattice cell that is distinct from the first edge, the second edge, the third edge, the fourth edge, the fifth edge, the sixth edge, and the seventh edge. The fourth vertex and the ninth vertex are coupled by a ninth edge of the lattice cell that is distinct from the first edge, the second edge, the third edge, the fourth edge, the fifth edge, the sixth edge, the seventh edge, and the eighth edge. The second vertex and the fourth vertex are coupled by a tenth edge of the lattice cell that is distinct from the first edge, the second edge, the third edge, the fourth edge, the fifth edge, the sixth edge, the seventh edge, the eighth edge, and the ninth edge. The fifth vertex and the eighth vertex are coupled by an eleventh edge of the lattice cell that is distinct from the first edge, the second edge, the third edge, the fourth edge, the fifth edge, the sixth edge, the seventh edge, the eighth edge, the ninth edge, and the tenth edge. The seventh vertex and the tenth vertex are coupled by a twelfth edge of the lattice cell that is distinct from the first edge, the second edge, the third edge, the fourth edge, the fifth edge, the sixth edge, the seventh edge, the eighth edge, the ninth edge, the tenth edge, and the eleventh edge. The first vertex, the second vertex, the fourth vertex, the ninth vertex, the eighth vertex, and the fifth vertex define a first face. The second vertex, the third vertex, the seventh vertex, the tenth vertex, the ninth vertex, and the fourth vertex define a second face that is distinct from the first face. The first vertex, the second vertex, the third vertex, the seventh vertex, the sixth vertex, and the fifth vertex define a third face that is distinct from the first face and the second face. The fifth vertex, the sixth vertex, the seventh vertex, the tenth vertex, the ninth vertex, and the eighth vertex define a fourth face that is distinct from the first face, the second face, and the third face.

In some embodiments, a particular pair of adjacent lattice cells includes fourteen distinct vertices that include a first vertex, a second vertex, a third vertex, a fourth vertex, a fifth vertex, a sixth vertex, a seventh vertex, an eighth vertex, a ninth vertex, a tenth vertex, an eleventh vertex, a twelfth vertex, a thirteenth vertex, and a fourteenth vertex (e.g., vertices 502-1 through 502-14 in FIG. 5B). The first vertex and the second vertex are coupled by a first edge. The second vertex and the third vertex are coupled by a second edge. The fifth vertex and the sixth vertex are coupled by a third edge. The sixth vertex and the seventh vertex are coupled by a fourth edge. The eighth vertex and the ninth vertex are coupled by a fifth edge. The ninth vertex and the tenth vertex are coupled by a sixth edge. The first vertex and the fifth vertex are coupled by a seventh edge. The third vertex and the seventh vertex are coupled by an eighth edge. The fourth vertex and the ninth vertex are coupled by a ninth edge. The second vertex and the fourth vertex are coupled by a tenth edge. The fifth vertex and the eighth vertex are coupled by an eleventh edge. The seventh vertex and the tenth vertex are coupled by a twelfth edge. The third vertex and the eleventh vertex are coupled by a thirteenth edge. The fourth vertex and the twelfth vertex are coupled by a fourteenth edge. The twelfth vertex and the thirteenth tenth vertex are coupled by a fifteenth edge. The tenth vertex and the fourteenth vertex are coupled by a sixteenth edge. The thirteenth vertex and the fourteenth vertex are coupled by a seventeenth edge. The eleventh vertex and the thirteenth vertex are coupled by an eighteenth edge. The first edge, the second edge, the third edge, the fourth edge, the fifth edge, the sixth edge, the seventh edge, the eighth edge, the ninth edge, the tenth edge, the eleventh edge, the twelfth edge, the thirteenth edge, and the fourteenth edge are distinct from one another. The first vertex, the second vertex, the fourth vertex, the ninth vertex, the eighth vertex, and the fifth vertex define a first face. The second vertex, the third vertex, the seventh vertex, the tenth vertex, the ninth vertex, and the fourth vertex define a second face. The first vertex, the second vertex, the third vertex, the seventh vertex, the sixth vertex, and the fifth vertex define a third face. The fifth vertex, the sixth vertex, the seventh vertex, the tenth vertex, the ninth vertex, and the eighth vertex define a fourth face. The second vertex, the third vertex, the eleventh vertex, the thirteenth vertex, the twelfth vertex, and the fourth vertex define a sixth face. The fourth vertex, the twelfth vertex, the thirteenth vertex, the fourteenth vertex, the tenth vertex, and the ninth vertex define a sixth face. The third vertex, the eleventh vertex, the thirteenth vertex, the fourteenth vertex, the tenth vertex, and the seventh vertex define a seventh face. The first face, the second face, the third face, the fourth face, the fifth face, the sixth face, and the seventh face are distinct from one another.

In some embodiments, a particular unit cell has sixteen distinct vertices that include a first vertex, a second vertex, a third vertex, a fourth vertex, a fifth vertex, a sixth vertex, a seventh vertex, an eighth vertex, a ninth vertex, a tenth vertex, an eleventh vertex, a twelfth vertex, a thirteenth vertex, a fourteenth vertex, a fifteenth vertex, and a sixteenth vertex (e.g., FIG. 9A). Although the unit cell is described to have sixteen vertices (e.g., based on replacement of each vertex with two vertices), the pair of adjacent lattice cells has fourteen vertices, as two vertices of the sixteen vertices are included in an adjacent pair of lattice cells (e.g., FIG. 5B).

In some embodiments, the first vertex and the second vertex are coupled by a first edge. The second vertex and the third vertex are coupled by a second edge. The third vertex and the fourth vertex are coupled by a third edge. The fifth vertex and the sixth vertex are coupled by a fourth edge. The sixth vertex and the seventh vertex are coupled by a fifth edge. The seventh vertex and the eighth vertex are coupled by a sixth edge. The ninth vertex and the tenth vertex are coupled by a seventh edge. The tenth vertex and the eleventh vertex are coupled by an eighth edge. The eleventh vertex and the twelfth vertex are coupled by a ninth edge. The thirteenth vertex and the fourteenth vertex are coupled by a tenth edge. The fourteenth vertex and the fifteenth vertex are coupled by an eleventh edge. The fifteenth vertex and the sixteenth vertex are coupled by a twelfth edge. The first vertex and the tenth vertex are coupled by a thirteenth edge. The third vertex and the twelfth vertex are coupled by a fourteenth edge. The fifth vertex and the fourteenth vertex are coupled by a fifteenth edge. The seventh vertex and the sixteenth vertex are coupled by a sixteenth edge. The second vertex and the fifth vertex are coupled by a seventeenth edge. The fourth vertex and the seventh vertex are coupled by an eighteenth edge. The tenth vertex and the thirteenth vertex are coupled by a nineteenth edge. The twelfth vertex and the fifteenth vertex are coupled by a twentieth edge. The first edge, the second edge, the third edge, the fourth edge, the fifth edge, the sixth edge, the seventh edge, the eighth edge, the ninth edge, the tenth edge, the eleventh edge, the twelfth edge, the thirteenth edge, the fourteenth edge, the fifteenth edge, the sixteenth edge, the seventeenth edge, the eighteenth edge, the nineteenth edge, and the twentieth edge are distinct from one another. The sixteen vertices define seven distinct faces (e.g., FIG. 5F).

In some embodiments, a respective pair of vertices of the sixteen vertices corresponds to a respective vertex of a cube (e.g., as shown in FIG. 9A, the lattice cells in FIG. 5C are obtained by replacing each vertex of a cubical lattice).

In some embodiments, a particular lattice cell includes (1130) fourteen distinct vertices that include a first vertex, a second vertex, a third vertex, a fourth vertex, a fifth vertex, a sixth vertex, a seventh vertex, an eighth vertex, a ninth vertex, a tenth vertex, an eleventh vertex, a twelfth vertex, a thirteenth vertex, and a fourteenth vertex (e.g., FIG. 6B). The first vertex and the second vertex are coupled by a first edge of the lattice cell. The second vertex and the third vertex are coupled by a second edge of the lattice cell. The third vertex and the fourth vertex are coupled by a third edge of the lattice cell. The fourth vertex and the fifth vertex are coupled by a fourth edge of the lattice cell. The fifth vertex and the sixth vertex are coupled by a fifth edge of the lattice cell. The sixth vertex and the seventh vertex are coupled by a sixth edge of the lattice cell. The seventh vertex and the eighth vertex are coupled by a seventh edge of the lattice cell. The eighth vertex and the ninth vertex are coupled by an eighth edge of the lattice cell. The ninth vertex and the tenth vertex are coupled by a ninth edge of the lattice cell. The tenth vertex and the first vertex are coupled by a tenth edge of the lattice cell. The first vertex and the eleventh vertex are coupled by an eleventh edge of the lattice cell. The eleventh vertex and the twelfth vertex are coupled by a twelfth edge of the lattice cell. The twelfth vertex and the thirteenth vertex are coupled by a thirteenth edge of the lattice cell. The thirteenth vertex and the fourteenth vertex are coupled by a fourteenth edge of the lattice cell. The fourteenth vertex and the sixth vertex are coupled by a fifteenth edge of the lattice cell. The first edge, the second edge, the third edge, the fourth edge, the fifth edge, the sixth edge, the seventh edge, the eighth edge, the ninth edge, the tenth edge, the eleventh edge, the twelfth edge, the thirteenth edge, the fourteenth edge, and the fifteenth edge are distinct from one another. The first vertex, the second vertex, the third vertex, the fourth vertex, the fifth vertex, the sixth vertex, the seventh vertex, the eighth vertex, the ninth vertex, and the tenth vertex define a first face. The first vertex, the second vertex, the third vertex, the fourth vertex, the fifth vertex, the sixth vertex, the fourteenth vertex, the thirteenth vertex, the twelfth vertex, and the eleventh vertex define a second face that is distinct from the first face; and the first vertex, the tenth vertex, the ninth vertex, the eighth vertex, the seventh vertex, the sixth vertex, the fourteenth vertex, the thirteenth vertex, the twelfth vertex, and the eleventh vertex define a third face that is distinct from the first face and the second face (e.g., FIG. 6B).

In some embodiments, a respective set of contiguous lattice cells has (1140) eight sets of vertices (e.g., FIG. 7A). Each set of vertices of the eight sets of vertices has one or more vertices. A first set of vertices the eight sets of vertices coupled to a second set of vertices of the eight sets of vertices. The second set of vertices coupled to a third set of vertices of the eight sets of vertices. The third set of vertices coupled to a fourth set of vertices of the eight sets of vertices. The fourth set of vertices coupled to the first set of vertices. A fifth set of vertices of the eight sets of vertices coupled to a sixth set of vertices of the eight sets of vertices. The sixth set of vertices coupled to a seventh set of vertices of the eight sets of vertices. The seventh set of vertices coupled to an eighth set of vertices of the eight sets of vertices. The eighth set of vertices coupled to the fifth set of vertices. The first set of vertices coupled to the fifth set of vertices. The second set of vertices coupled to the sixth set of vertices. The third set of vertices coupled to the seventh set of vertices. The fourth set of vertices coupled to the eighth set of vertices. The first set of vertices, the second set of vertices, the third set of vertices, and the fourth set of vertices defining a first face. The fifth set of vertices, the sixth set of vertices, the seventh set of vertices, and the eighth set of vertices defining a second face that is distinct from the first face. The first set of vertices, the second set of vertices, the sixth set of vertices, and the fifth set of vertices defining a third face that is distinct from the first face and the second face. The second set of vertices, the third set of vertices, the seventh set of vertices, and the sixth set of vertices defining a fourth face that is distinct from the first face, the second face, and the third face. The third set of vertices, the fourth set of vertices, the eighth set of vertices, and the seventh set of vertices defining a fifth face that is distinct from the first face, the second face, the third face, and the fourth face, the fourth set of vertices, the first set of vertices, the fifth set of vertices, and the eighth set of vertices defining a sixth face that is distinct from the first face, the second face, the third face, the fourth face, and the fifth face.

In some embodiments, at least one set of vertices of the eight sets of vertices has (1150) two or more vertices (e.g., primal split as shown in FIG. 7A).

In some embodiments, each set of vertices of the eight sets of vertices has two or more vertices (e.g., primal split shown in FIG. 7A).

In some embodiments, at least one set of vertices of the eight sets of vertices has (1152) three or more vertices (e.g., primal split in FIG. 7B).

In some embodiments, each set of vertices of the eight sets of vertices has three or more vertices (e.g., primal split in FIG. 7B).

In some embodiments, at least one set of vertices of the eight sets of vertices has (1154) four or more vertices.

In some embodiments, at least one set of vertices of the eight sets of vertices has five or more vertices.

In some embodiments, the eight sets of vertices define (1160) one or more additional faces that are distinct from the first face, the second face, the third face, the fourth face, the fifth face, and the sixth face (e.g., dual split as shown in FIG. 7A).

In some embodiments, the eight sets of vertices define (1162) a seventh face that is distinct from the first face, the second face, the third face, the fourth face, the fifth face, and the sixth face (e.g., dual split shown in FIG. 7A).

In some embodiments, the seventh face is defined by the first set of vertices, the second set of vertices, the fourth set of vertices, the sixth set of vertices, the seventh set of vertices, and the eighth set of vertices (e.g., FIG. 7A).

In some embodiments, the eight sets of vertices define (1164) an eighth face that is distinct from the first face, the second face, the third face, the fourth face, the fifth face, the sixth face, and the seventh face and a ninth face that is distinct from the first face, the second face, the third face, the fourth face, the fifth face, the sixth face, the seventh face, and the eighth face (e.g., dual split as shown in FIG. 7B). At least one set of vertices of the eight sets of vertices has two or more vertices.

In some embodiments, the eight sets of vertices define (1166) four or more additional faces that are distinct from the first face, the second face, the third face, the fourth face, the fifth face, and the sixth face.

In some embodiments, method 1100 may include one or more features described herein with respect to method 900, method 1200, method 1220, method 1240, and method 1260. For brevity, such details are not repeated herein.

FIG. 12A is a flowchart representing method 1200 of obtaining a plurality of entangled qubits in accordance with some embodiments.

Method 1200 includes (1210) obtaining a plurality of qubits, including a first qubit entangled with second, third, fourth, fifth, sixth, and seventh qubits. The plurality of qubits also includes one or more of: an eighth qubit entangled with at least one of the second qubit and the seventh qubit; a ninth qubit entangled with at least one of the third qubit and the fourth qubit; a tenth qubit entangled with at least one of the fifth qubit and the sixth qubit; an eleventh qubit entangled with at least one of the eighth qubit and the ninth qubit; a twelfth qubit entangled with at least one of the eighth qubit and the ninth qubit; a thirteenth qubit entangled with at least one of the eighth qubit and the tenth qubit; a fourteenth qubit entangled with at least one of the eighth qubit and the tenth qubit; a fifteenth qubit entangled with at least one of the ninth qubit and the tenth qubit; and a sixteenth qubit entangled with at least one of the ninth qubit and the tenth qubit.

In some embodiments, the eighth qubit is entangled with both the second qubit and the seventh qubit. The ninth qubit is entangled with both the third qubit and the fourth qubit. The tenth qubit is entangled with both the fifth qubit and the sixth qubit. The eleventh qubit is entangled with both the eighth qubit and the ninth qubit. The twelfth qubit is entangled with both the eighth qubit and the ninth qubit. The thirteenth qubit is entangled with both the eighth qubit and the tenth qubit. The fourteenth qubit is entangled with both the eighth qubit and the tenth qubit. The fifteenth qubit is entangled with both the ninth qubit and the tenth qubit. The sixteenth qubit is entangled with both the ninth qubit and the tenth qubit.

In some embodiments, method 1200 includes (1212) one or more of: entangling the first qubit with the second qubit; entangling the first qubit with the third qubit; entangling the first qubit with the fourth qubit; entangling the first qubit with the fifth qubit; entangling the first qubit with the sixth qubit; entangling the first qubit with the seventh qubit; entangling the eighth qubit with the second qubit; entangling the eighth qubit with the seventh qubit; entangling the ninth qubit with the third qubit; entangling the ninth qubit with the fourth qubit; entangling the tenth qubit with the fifth qubit; entangling the tenth qubit with the sixth qubit; entangling the eleventh qubit with the eighth qubit; entangling the eleventh qubit with the ninth qubit; entangling the twelfth qubit with the eighth qubit; entangling the twelfth qubit with the ninth qubit; entangling the thirteenth qubit with the eighth qubit; entangling the thirteenth qubit with the tenth qubit; entangling the fourteenth qubit with the eighth qubit; entangling the fourteenth qubit with the tenth qubit; entangling the fifteenth qubit with the ninth qubit; entangling the fifteenth qubit with the tenth qubit; entangling the sixteenth qubit with the ninth qubit; and entangling the sixteenth qubit with the tenth qubit.

In some embodiments, entangling two qubits includes (1214) performing a Bell state measurement on a first ancillary qubit entangled with one qubit of the two qubits and a second ancillary qubit entangled with the other qubit of the two qubits.

In some embodiments, method 1200 may include one or more features described herein with respect to method 900, method 1000, method 1220, method 1240, and method 1260. For brevity, such details are not repeated herein.

FIG. 12B is a flowchart representing method 1220 of obtaining a plurality of entangled qubits in accordance with some embodiments.

Method 1220 includes (1230) includes obtaining a plurality of qubits, including a first qubit entangled with second, third, fourth, fifth, and sixth qubits. The first qubit is also entangled with one or more of: seventh, eighth, ninth, tenth, and eleventh qubits. The plurality of qubits also includes one or more of: a twelfth qubit entangled with at least one of the second qubit, the third qubit, the fourth qubit, the fifth qubit, and the eleventh qubit; a thirteenth qubit entangled with at least one of the seventh qubit, the eighth qubit, the ninth qubit, and the tenth qubit; a fourteenth qubit entangled with at least one of the twelfth qubit and the thirteenth qubit; a fifteenth qubit entangled with at least one of the twelfth qubit and the thirteenth qubit; a sixteenth qubit entangled with at least one of the twelfth qubit and the thirteenth qubit; a seventeenth qubit entangled with at least one of the twelfth qubit and the thirteenth qubit; and an eighteenth qubit entangled with at least one of the twelfth qubit and the thirteenth qubit.

In some embodiments, the first qubit is entangled with all of the seventh, eighth, ninth, tenth, and eleventh qubits. The twelfth qubit is entangled with all of the second, third, fourth, fifth, and eleventh qubits. The thirteenth qubit is entangled with all of the seventh, eighth, ninth, and tenth qubits. The fourteenth qubit is entangled with both the twelfth qubit and the thirteenth qubit. The fifteenth qubit is entangled with both the twelfth qubit and the thirteenth qubit. The sixteenth qubit is entangled with both the twelfth qubit and the thirteenth qubit. The seventeenth qubit is entangled with both the twelfth qubit and the thirteenth qubit. The eighteenth qubit is entangled with both the twelfth qubit and the thirteenth qubit.

In some embodiments, method 1220 includes (1232) one or more of: entangling the first qubit with the second qubit; entangling the first qubit with third qubit; entangling the first qubit with fourth qubit; entangling the first qubit with fifth qubit; entangling the first qubit with sixth qubit; entangling the first qubit with the seventh qubit; entangling the first qubit with the eighth qubit; entangling the first qubit with the ninth qubit; entangling the first qubit with the tenth qubit; entangling the first qubit with the eleventh qubit; entangling the twelfth qubit with the second qubit; entangling the twelfth qubit with the third qubit; entangling the twelfth qubit with the fourth qubit; entangling the twelfth qubit with the fifth qubit; entangling the twelfth qubit with the eleventh qubit; entangling the thirteenth qubit with the seventh qubit; entangling the thirteenth qubit with the eighth qubit; entangling the thirteenth qubit with the ninth qubit; entangling the thirteenth qubit with the tenth qubit; entangling the fourteenth qubit with the twelfth qubit; entangling the fourteenth qubit with the thirteenth qubit; entangling the fifteenth qubit with the twelfth qubit; entangling the fifteenth qubit with the thirteenth qubit; entangling the sixteenth qubit with the twelfth qubit; entangling the sixteenth qubit with the thirteenth qubit; entangling the seventeenth qubit with the twelfth qubit; entangling the seventeenth qubit with the thirteenth qubit; entangling the eighteenth qubit with the twelfth qubit; and entangling the eighteenth qubit with the thirteenth qubit.

In some embodiments, entangling two qubits includes performing a Bell state measurement on a first ancillary qubit entangled with one qubit of the two qubits and a second ancillary qubit entangled with the other qubit of the two qubits.

In some embodiments, method 1220 may include one or more features described herein with respect to method 900, method 1000, method 1200, method 1240, and method 1260. For brevity, such details are not repeated herein.

Figure 12C:
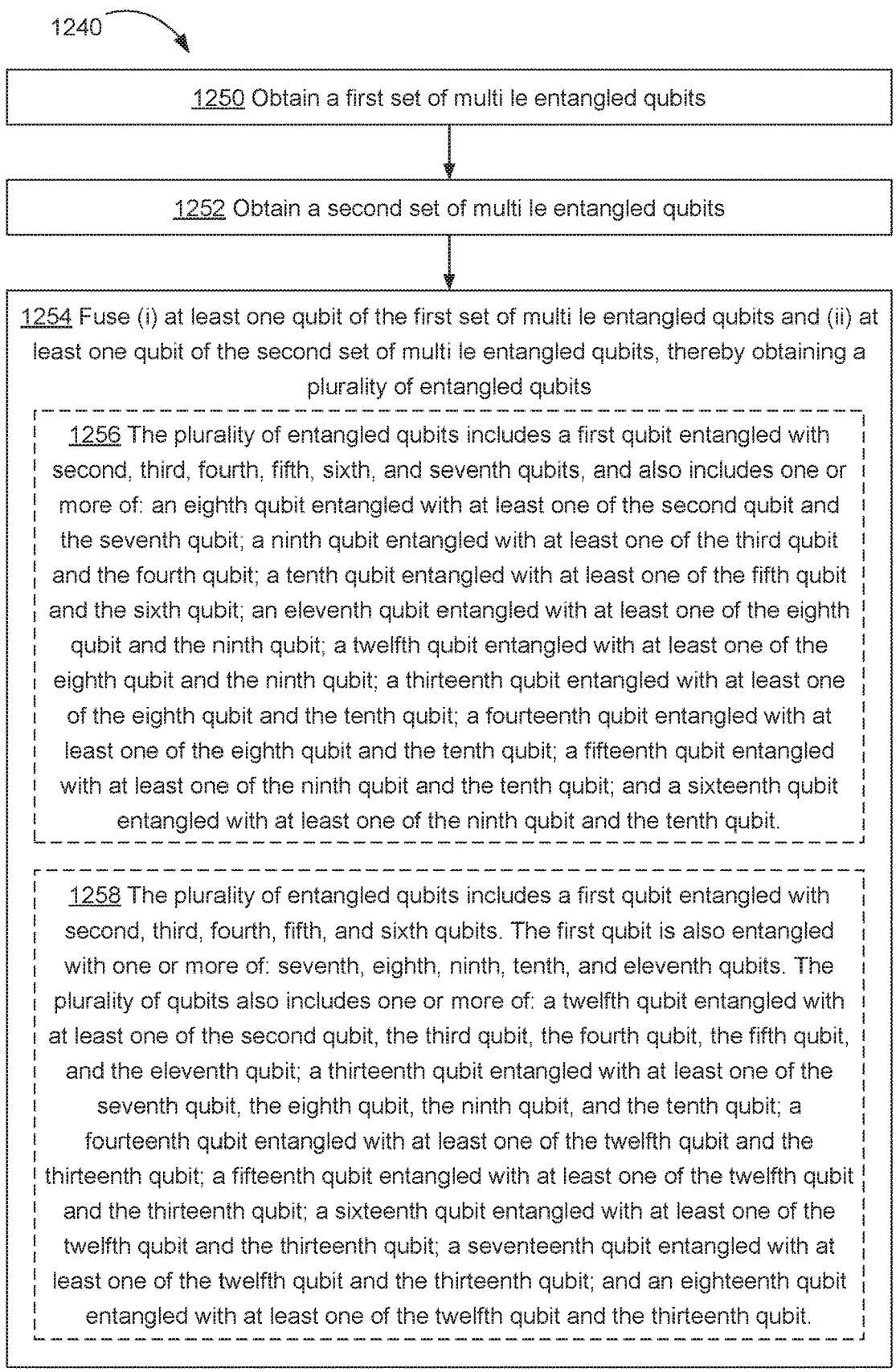
FIG. 12C is a flowchart representing a method of obtaining a plurality of entangled qubits in accordance with some embodiments.

FIG. 12C is a flowchart representing method 1240 of obtaining a plurality of entangled qubits in accordance with some embodiments.

Method 1240 includes (1250) obtaining a first set of multiple entangled qubits, and (1252) obtaining a second set of multiple entangled qubits. The second set of multiple entangled qubits is mutually exclusive from the first set of multiple entangled qubits. Method 1240 also includes (1254) fusing (i) at least one qubit of the first set of multiple entangled qubits and (ii) at least one qubit of the second set of multiple entangled qubits, thereby obtaining a plurality of entangled qubits.

In some embodiments, the plurality of entangled qubits includes (1256) a first qubit entangled with second, third, fourth, fifth, sixth, and seventh qubits. The plurality of qubits also includes one or more of: an eighth qubit entangled with at least one of the second qubit and the seventh qubit; a ninth qubit entangled with at least one of the third qubit and the fourth qubit; a tenth qubit entangled with at least one of the fifth qubit and the sixth qubit; an eleventh qubit entangled with at least one of the eighth qubit and the ninth qubit; a twelfth qubit entangled with at least one of the eighth qubit and the ninth qubit; a thirteenth qubit entangled with at least one of the eighth qubit and the tenth qubit; a fourteenth qubit entangled with at least one of the eighth qubit and the tenth qubit; a fifteenth qubit entangled with at least one of the ninth qubit and the tenth qubit; and a sixteenth qubit entangled with at least one of the ninth qubit and the tenth qubit.

In some embodiments, the plurality of entangled qubits includes (1258) a first qubit entangled with second, third, fourth, fifth, and sixth qubits. The first qubit is also entangled with one or more of: seventh, eighth, ninth, tenth, and eleventh qubits. The plurality of qubits also includes one or more of: a twelfth qubit entangled with at least one of the second qubit, the third qubit, the fourth qubit, the fifth qubit, and the eleventh qubit; a thirteenth qubit entangled with at least one of the seventh qubit, the eighth qubit, the ninth qubit, and the tenth qubit; a fourteenth qubit entangled with at least one of the twelfth qubit and the thirteenth qubit; a fifteenth qubit entangled with at least one of the twelfth qubit and the thirteenth qubit; a sixteenth qubit entangled with at least one of the twelfth qubit and the thirteenth qubit; a seventeenth qubit entangled with at least one of the twelfth qubit and the thirteenth qubit; and an eighteenth qubit entangled with at least one of the twelfth qubit and the thirteenth qubit.

In some embodiments, method 1240 may include one or more features described herein with respect to method 900, method 1000, method 1200, method 1220, and method 1260. For brevity, such details are not repeated herein.

Figure 12D:
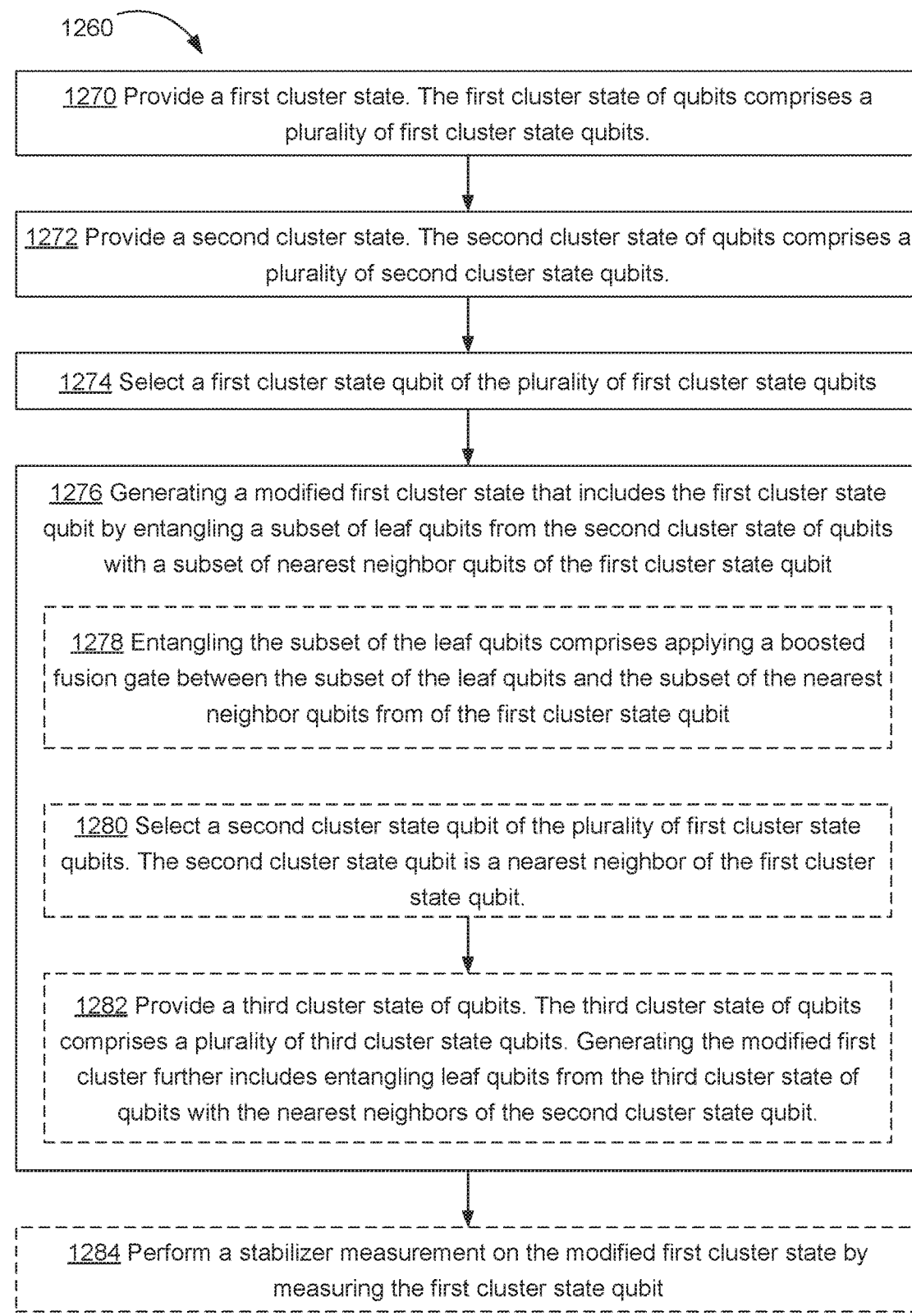
FIG. 12D is a flowchart representing a method of generating a modified cluster state through entanglement in accordance with some embodiments.

FIG. 12D is a flowchart representing method 1260 of generating a modified cluster state through entanglement in accordance with some embodiments.

Method 1260 includes (1270) providing a first cluster state. The first cluster state of qubits comprises a plurality of first cluster state qubits. Method 1260 also includes (1272) providing a second cluster state. The second cluster state of qubits comprises a plurality of second cluster state qubits. Method 1260 further includes (1274) selecting a first cluster state qubit of the plurality of first cluster state qubits, and generating (1276) a modified first cluster state that includes the first cluster state qubit by entangling a subset of leaf qubits from the second cluster state of qubits with a subset of nearest neighbor qubits of the first cluster state qubit.

In some embodiments, entangling the subset of the leaf qubits comprises (1278) applying a boosted fusion gate between the subset of the leaf qubits and the subset of the nearest neighbor qubits from of the first cluster state qubit.

In some embodiments, method 1260 includes (1280) selecting a second cluster state qubit of the plurality of first cluster state qubits. The second cluster state qubit is a nearest neighbor of the first cluster state qubit. Method 1260 also includes (1282) providing a third cluster state of qubits. The third cluster state of qubits comprises a plurality of third cluster state qubits. Generating the modified first cluster further includes entangling leaf qubits from the third cluster state of qubits with the nearest neighbors of the second cluster state qubit.

In some embodiments, method 1260 also includes (1284) performing a stabilizer measurement on the modified first cluster state by measuring the first cluster state qubit.

In some embodiments, method 1260 may include one or more features described herein with respect to method 900, method 1000, method 1200, method 1220, and method 1240. For brevity, such details are not repeated herein.

IV. Circuit-Based Implementation

FIGS. 13A-13G illustrate a circuit-based quantum computing approach for employing the modified clusters states described herein and used as error correcting codes, e.g., as stabilizer states that can be used for quantum error correction on a logical qubit that is formed from a cluster state of several physical data qubits. The circuit-based approach disclosed herein can be useful for a quantum computing system that employs matter-based qubits. For example, the qubits can be particles, such as atoms, ions, and nuclei. In another example, the qubits can be photons. In yet other examples, the quantum systems can be other engineered quantum systems such as flux qubits, phase qubits, or charge qubits (e.g., formed from a superconducting Josephson junction), topological qubits (e.g., Majorana fermions), or spin qubits formed from vacancy centers (e.g., nitrogen vacancies in diamond).

Figure 13A:
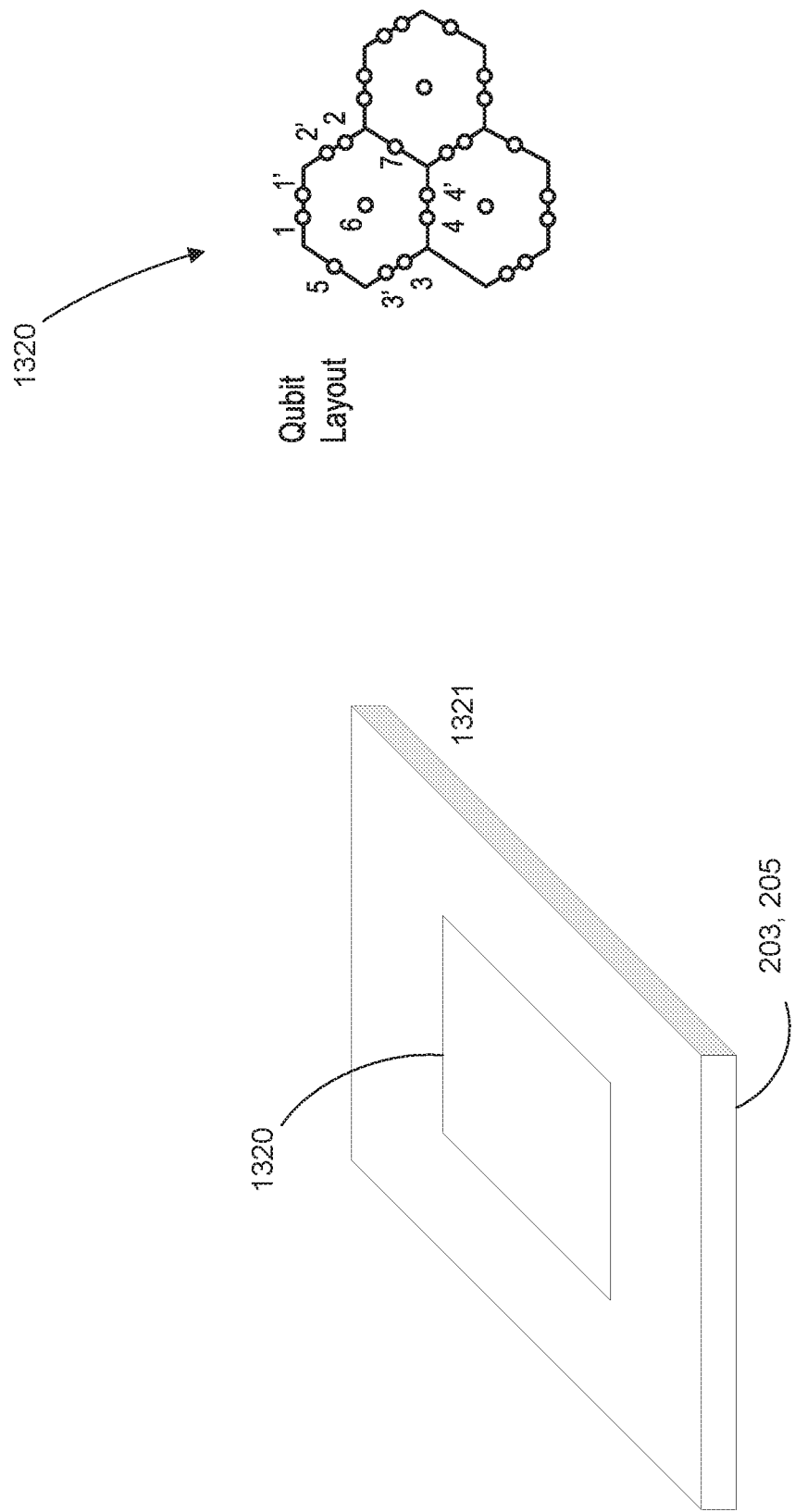
FIGS. 13A illustrates operations for obtaining a plurality of entangled qubits in accordance with some embodiments.

FIG. 13A illustrates a combination of the qubit entangling system 203 (described with respect to FIG. 2) and the qubit readout system 205 (described with respect to FIG. 2). The system includes a substrate 1320 on which a collection of matter-based qubits is arranged in a manner that facilitates the use of the modified cluster state disclosed herein for fault tolerant quantum computation. In some embodiments, the qubit entangling system 203 and the qubit readout system 205 can be integrated together as a single quantum chip. In some embodiments, the qubit entangling system 203 and the qubit readout system 205 are distinct and separate from each other, e.g., they can be distinct dies that are linked via optical and or electrical interconnects.

FIG. 13A also illustrates an example configuration of the qubits on the substrate 1320. More specifically FIG. 13A shows one example of how qubits could be arranged on a hexagonal lattice to implement the diamond lattice cluster state in a circuit-based quantum computing system. However, the qubits may be arranged in many other configurations, which are omitted herein for brevity.

FIGS. 13B-13G show an illustration of the sequence of quantum gates and qubit measurements that can be applied to employ a version of the cluster state disclosed herein, e.g., the diamond lattice. In this example, the system is operating as a quantum memory that fault tolerantly preserves the quantum state of a logical qubit that is encoded by the data qubits of the cluster state. More specifically, the diagrams shown in FIGS. 13B-13G show a method of operating a quantum circuit to repeatedly produce temporal slices of one unit cell of the modified cluster state shown in FIGS. 5G-5H and how to conduct the associated stabilizer measurements used for quantum error correction. More specifically repeated rounds of stabilizer measurements are performed and the results (all measurements in the X basis) are collected in classical memory and used to generate the syndrome graph which is then used for quantum error correction.

In step 1312, layer 1 of the cluster is generated. The correspondence between cluster state qubits and circuit-based qubits is shown in FIGS. 13B and 13C. At the outset the data qubits are either received from a previous circuit output in some quantum state (representing quantum information being processed by the algorithm being run) or are initialized in the |+> state in a case where 1312 is the first step of the algorithm. In stage 1312 qubit 6 is entangled (by way of application of pairwise CZ gates) with qubits 1, 2, 3, 4, 5, and 7. Measurement of qubit 6 in the X basis then performs the first joint parity check on the data qubits 1, 2, 3, 4, 5, and 7. Although not shown here, the outcomes of the parity check measurement (which are classical bits) are stored in a classical memory, like that shown in FIG. 2 above, to generate the error syndrome for later error correction by the decoder. In practice, the data qubits shown could be only a fraction of the total number of data qubits used to encode the quantum information of the logical qubit that is being protected by the modified cluster state if a cluster state of multiple unit cells is used (analogous to the multi-cell lattice shown here).

In 1314, layer 2 of the cluster is formed. Qubits 1'-4' and 6 are initialized to the |+> state. Data qubits 1 and 1' are entangled, 2 and 2' are entangled, 3 and 3' and entangled and 4 and 4' are entangled (again via CZ gates). In addition, qubit 3' is entangled to qubit 5 and qubit 4' is entangled with qubit 7. Qubit 7 is also entangled with a corresponding qubit in the next hexagonal cell, as is qubit 4. Quantum information stored in data qubits 1-4 is teleported to corresponding data qubits 1'-4' via x measurements on qubits 1-7. This teleportation step is not required but can be beneficial for qubits that tend to leak out of the computation basis over time due to noise.

In step 1316, layer 3 of the cluster is generated. Qubits 5 and 7 are initialized in the |+> state. Qubits 5 and 6 are entangled and qubits 7 and 6 are entangled via CZ. Qubits 5 and 1' are entangled and 5 and 3' are entangled via pairwise CZ gates. Qubits 7 and 2' are entangled and 7 and 4' are entangled via pairwise CZ gates. Qubits 5 and 7 are measured in the X basis.

In step 1318, layer 4 of the cluster is generated. Qubits 1-5 and 7 are initialized in the |+> state. Data qubits 1 and 1' are entangled, 2 and 2' are entangled, 3 and 3' and entangled and 4 and 4' are entangled (again via CZ gates). Qubits 3 and 6 are entangled and qubits 4 and 6 are entangled via CZ. Qubits 5 and 1' are entangled and 7 and 2' are entangled via pairwise CZ gates. Qubits 1'-4' and qubit 6 is measured. Quantum information from qubits 1-5 and 7 are then fed into the next stage of the process, which is a repetition of step 1312.

While the CZ between particular pairs of qubits are depicted here in a certain temporal order, the order that the CZ's are applied can be altered without departing from the scope of the present disclosure. Furthermore, the initialization of any qubits (e.g., initialization of ancilla in the |+> state) can be performed any time before the first entangling gate is applied to the qubit being initialized. Likewise, the measurements on any qubit can be performed any time after the final entangling gate on that qubit has been applied.

Figure 13G:
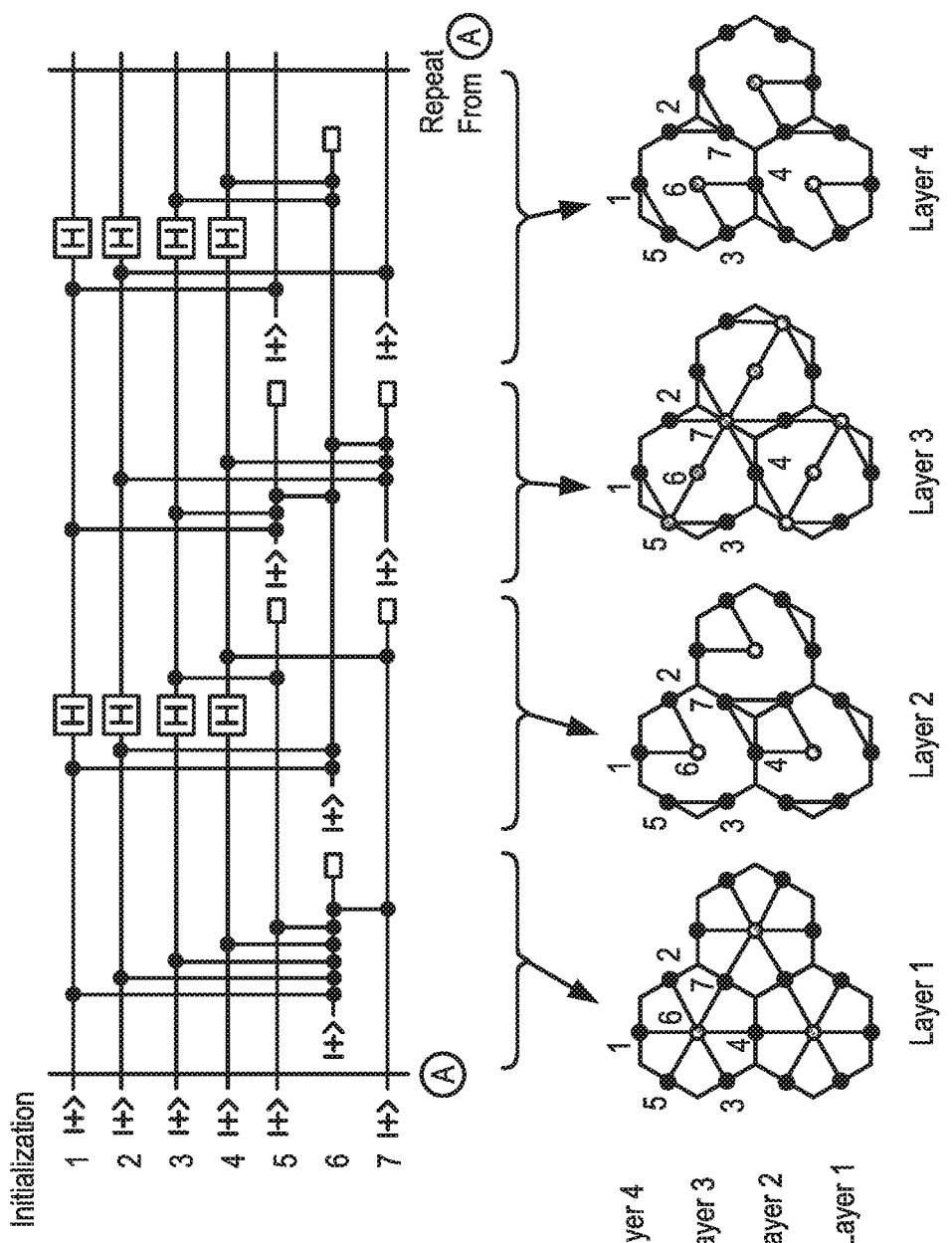
FIG. 13G illustrates operations for obtaining a plurality of entangled qubits in accordance with some other embodiments.
Figure 13E:
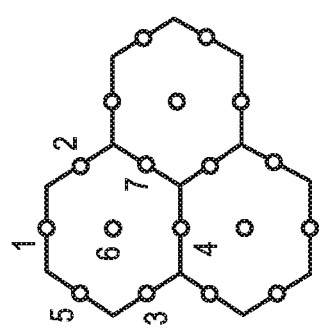
Figure 13F:
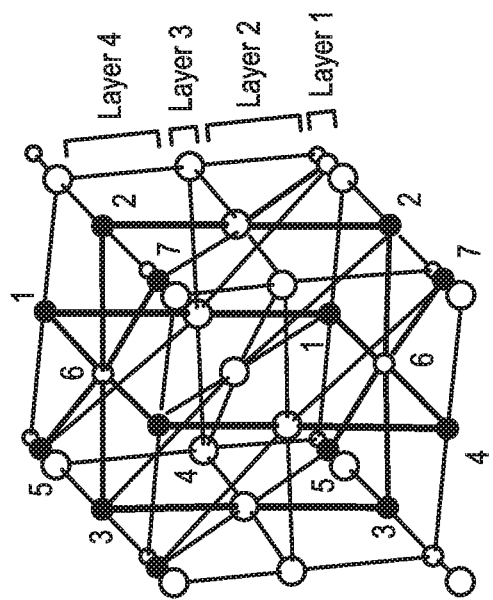

FIGS. 13E-13G illustrates operations for obtaining a plurality of entangled qubits from matter-based qubits in accordance with some other embodiments. More specifically, FIG. 13G shows an arrangement that does not require quantum teleportation and thus requires fewer data qubits. The operations shown in FIG. 13G includes the use of Hadamard operators. One of ordinary skill will appreciate that other arrangements of Hadamard's and other gates may be used without departing from the scope of the present disclosure. These operations perform a change of basis and allow the second set of joint parity checks to be made by measuring the ancilla in the X basis. In FIG. 13G, 7 qubits per hexagonal cell, instead of 10 qubits shown in FIGS. 13B-13D, are used to preserve the quantum state information.

In some embodiments, the qubits can be arranged on the surface of the quantum chip in a manner that facilitates tiling of the cells for generation of a larger cluster state. For example, FIGS. 13A-G shows a geometric arrangement of the qubits that employs hexagonal tiles Arranged in this way, a unit cell (as shown by the dashed box) that can be tiled into a large bulk lattice is formed. Advantageously, tiling many lattice cells forms a larger cluster state (including more physical qubits) over which to encode the logical qubit thus leading to a higher tolerance to error on the encoded logical qubit.

V. Fusion-Based Implementation

FIGS. 14A-14D are schematic diagrams illustrating example entanglement operations in accordance with some embodiments. More specifically FIGS. 14A-14D show how fusion operations, also referred to herein as fusion gates, can be applied to small cluster states, e.g., cluster states of 2, 3, 4, 5 qubits and so on, to form larger cluster states. In accordance with some embodiments a fusion-based scheme can be used to generate a large modified cluster states with improved fault tolerance using only smaller cluster states. As described in more detail below, the fusion process can be "boosted" by consuming one or more ancilla entangled states to improve the probability of success. In such a way a modified cluster state can be generated with probability of error below the threshold for the modified cluster state and thus, the modified cluster state formed by fusions can be employed as a resource to perform fault tolerant quantum computation.

Figure 14A:
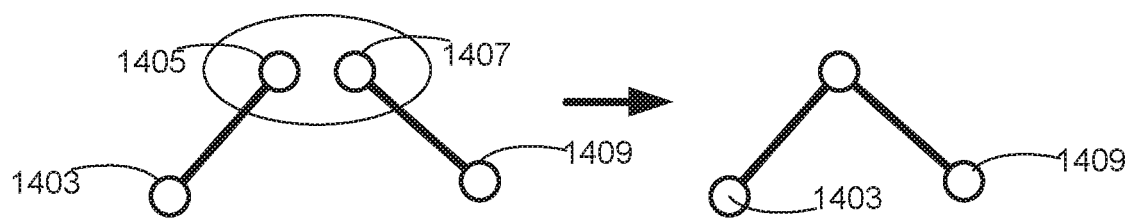
FIGS. 14A-14D are schematic diagrams illustrating example entanglement operations in accordance with some embodiments.

FIG. 14A illustrates two pairs of entangled qubits: a first pair of entangled qubits 1403 and 1405 and a second pair of entangled qubits 1407 and 1409. FIG. 14A also illustrates fusion of qubits 1405 and 1407, which leads to three entangled qubits (e.g., qubit 1403 is entangled with a middle qubit, which is, in turn, entangled with qubit 1409).

Figure 14B:
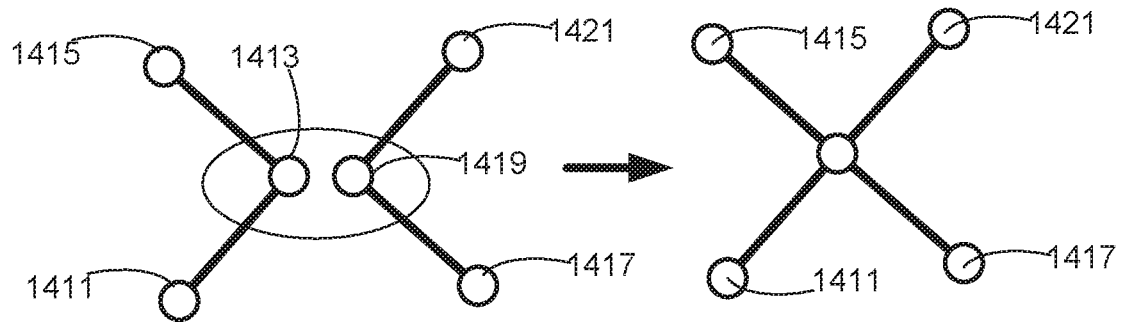

FIG. 14B illustrates two sets of entangled qubits: a first set of three entangled qubits 1411, 1413, and 1415 and a second set of three entangled qubits 1417, 1419, and 1421. FIG. 14B also illustrates fusion of qubits 1413 and 1419, which leads to five entangled qubits (e.g., a middle qubit entangled with qubits 1411, 1415, 1417, and 1421).

Figure 14C:
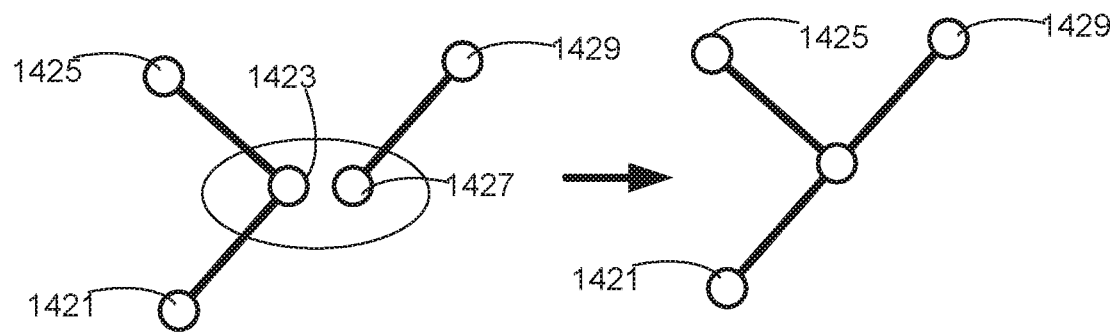

FIG. 14C illustrates two sets of entangled qubits: a first set of three entangled qubits 1421, 1423, and 1425 and a second set of two entangled qubits 1427 and 1429. FIG. 14C also illustrates fusion of qubits 1423 and 1427, which leads to four entangled qubits (e.g., a middle qubit entangled with qubits 1421, 1425, and 1429).

Figure 14D:
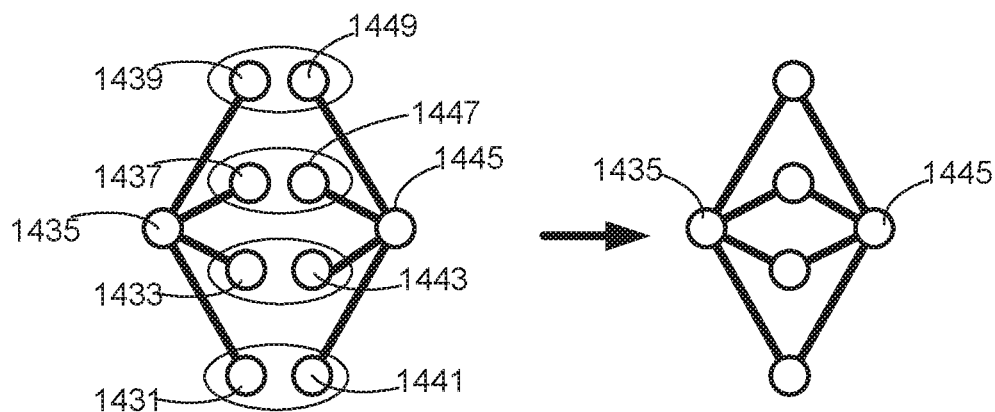

FIG. 14D illustrates two sets of entangled qubits: a first set of five entangled qubits 1431, 1433, 1435, 1437, and 1439 and a second set of five entangled qubits 1441, 1443, 1445, 1447, and 1449. FIG. 14D also illustrates fusion of qubits 1435 and 1445, which leads to six entangled qubits (e.g., qubit 1435 and qubit 1445 each entangled with four qubits).

Figure 15:
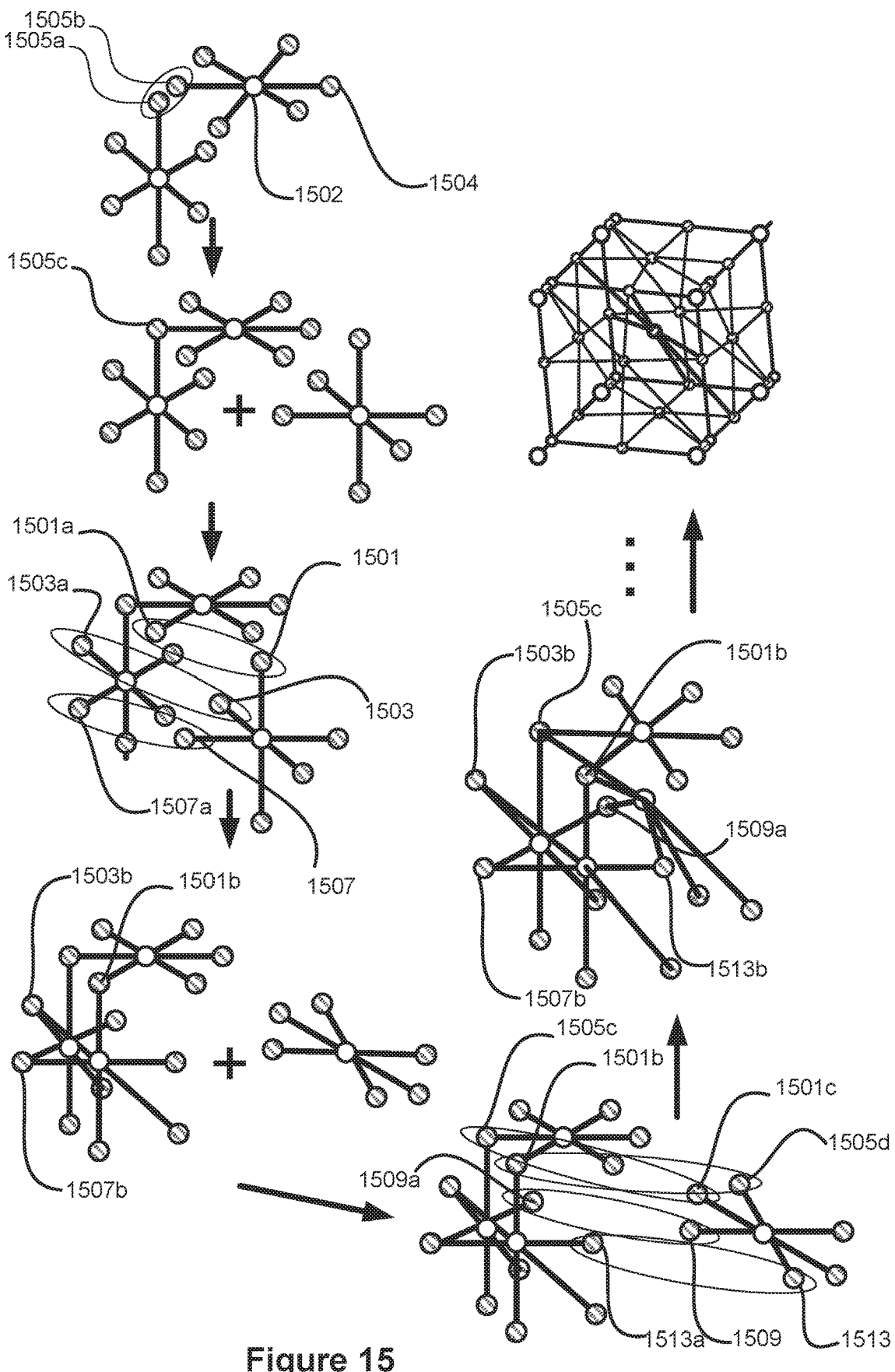
FIG. 15 is a schematic diagram illustrating example entanglement operations in accordance with some embodiments.

FIG. 15 shows example entanglement operations for forming a cluster state (e.g., a diamond lattice). In FIG. 15, multiple sets of 6 entangled qubits (e.g., a middle qubit entangled with four peripheral qubits to form a star state) are sequentially entangled to form the example cluster state 1500. In practice, the fusion operations may not succeed in every attempt and boosting may be required to generate a cluster state with low enough loss to operate below threshold. Different resource states other than 6 qubit star states can be employed. One of ordinary skill will appreciate that many different protocols exist for generating the cluster state 1500 and the one shown here is merely one example. Oval circles represent fusion operation between qubits, e.g., type I fusion.

A person having ordinary skill in the art would understand that the example entanglement operations depicted in FIGS. 14A-14D and analogous operations may be used to form different cluster states, such as cluster states shown in FIGS. 7A-7B. For brevity, such details are omitted herein.

a. Photonic Circuit for Fusion Generated Cluster State

Figure 16:
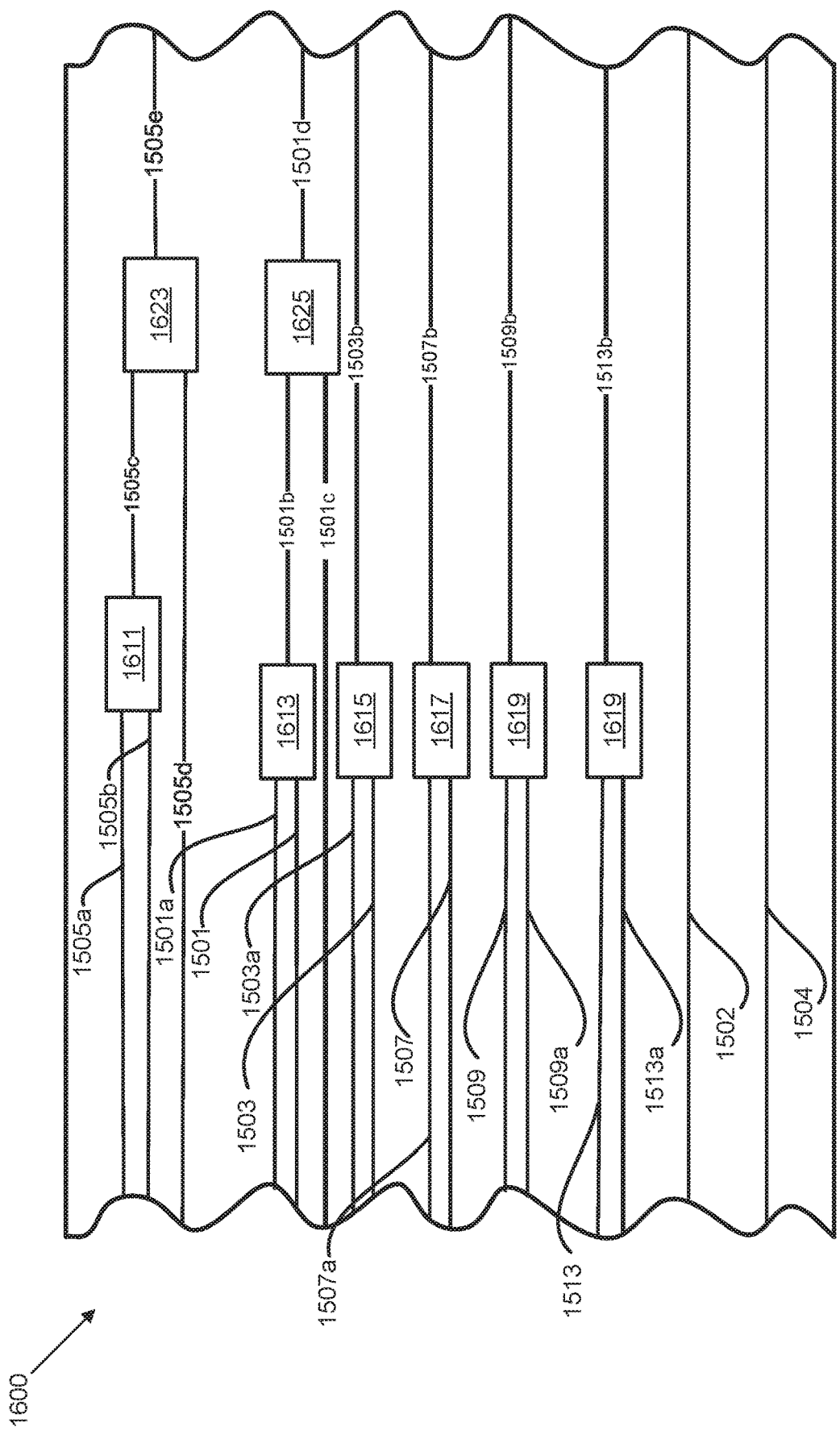
FIG. 16 is a photonic circuit diagram in accordance with some embodiments.

FIG. 16 shows one example of linear optical circuit that can be used to generate a portion of the modified cluster state disclosed herein. More specifically, the circuit shows a collection of optical channels and Type I fusion gates that can be applied to generate the modified cluster state shown in FIG. 15.

FIG. 16 illustrates a device 1600 for generating a cluster state, in accordance with some embodiments. In some embodiments, the device can be implemented on an integrated photonics chip, in which case the lines shown may be one or more photonic waveguides. In such an implementation, the qubit sources (not shown) can be photon sources of various levels of entanglement, e.g., photonic Bells state generators, or higher entangled state generators such as generators or one or more portions of the modified cluster state. Such sources can include integrated optical components such as waveguides, beamsplitters, photon detectors, phase shifters, and photonic switches in any appropriate combination to produce the entangled quantum systems that will be fused to generate the larger cluster. Likewise, the fusion gates can include integrated optical circuits components such as waveguides, beamsplitters, photon detectors, phase shifters, photonic switches, and the like. One of ordinary skill will appreciate that the diagram shown in FIG. 16 can also be interpreted as a generalized schematic diagram that is not strictly limited to a photonic implementation but rather can employ any other qubit architecture without departing from the scope of the present disclosure.

Device 1600 includes a plurality of (boosted and/or unboosted) fusion generators (e.g., fusion generator 1611, 1613, 1615, 1617, 1619, 1621, 1623, and 1625). Note that for the sake of simplicity, any optical waveguides that confine the photonic qubits that do not undergo fusion at this stage of the device are not shown and it should be recognized that they would simply be unencumbered paths that pass through the device similar to the waveguide that confines photonic qubit 1502 and 1504 shown here (where qubit labels correspond to those shown in FIG. 15).

Boosted and/or un-boosted fusion generators 1611, 1613, 1615, 1617, 1619, 1621, 1623, and 1625 generate the following entangled qubits of the cluster state: 1505c, 1505e, 1501d, 1503b, 1507b, 1509b, and 1513b, respectively. In some embodiments, fusion generators can all be boosted fusion generators or only a subset of the fusion generators can emply boosting. All components can be part of a chip and can share the same substrate, or they can be formed from different chips on different substrates and networked together by way of optical interconnects. In the simplified diagram shown in FIG. 16, only a small section of the sub-circuits are shown in order to avoid over complicating the description. However, one of ordinary skill will appreciate that the size of the circuit shown in FIG. 16 will map directly to the size of the modified cluster state desired.

In some embodiments, the fusion generators shown here can be two-way Type I fusion gates (boosted or unboosted) the details of which are described in more detail below in reference to FIGS. 17A-17B, 18A-18F, and 19A-19B. The Type I fusion gates can include internal detectors that can perform a measurement, e.g., a Bell measurement, on their respective input qubits. The results of these measurements take the form of classical data, e.g., binary data that can signal (also referred to as "herald") the different outcomes (e.g., "success" or "failure" to generate a fused qubit) of each fusion gate. The classical data output from the two-way Type I fusion gates can be provided to a classical controller (not shown, but could be implemented as any processor, ASIC, classical computer logic, and the like) via classical information channels and stored in a classical computer memory that is accessible by the controller. Such information can be useful for a number of operations because it gives the controller information regarding specific errors in the cluster state (e.g., which qubits within the cluster state are missing). Such information can be used by the controller to improve a number of processes that may be required to perform the quantum computation, including, e.g., renormalizing the percolated cluster to an error correcting code, decoding the measurement results, performing adaptive cluster state generation, performing adaptive measurements, and etc.

b. Type I Fusion

In the schematic diagrams used herein, e.g., FIGS. 17A, 18B, 19A-19C, certain photonic components and quantum gates are represented using notation described in detail below in reference to FIG. 20.

Figure 17A:
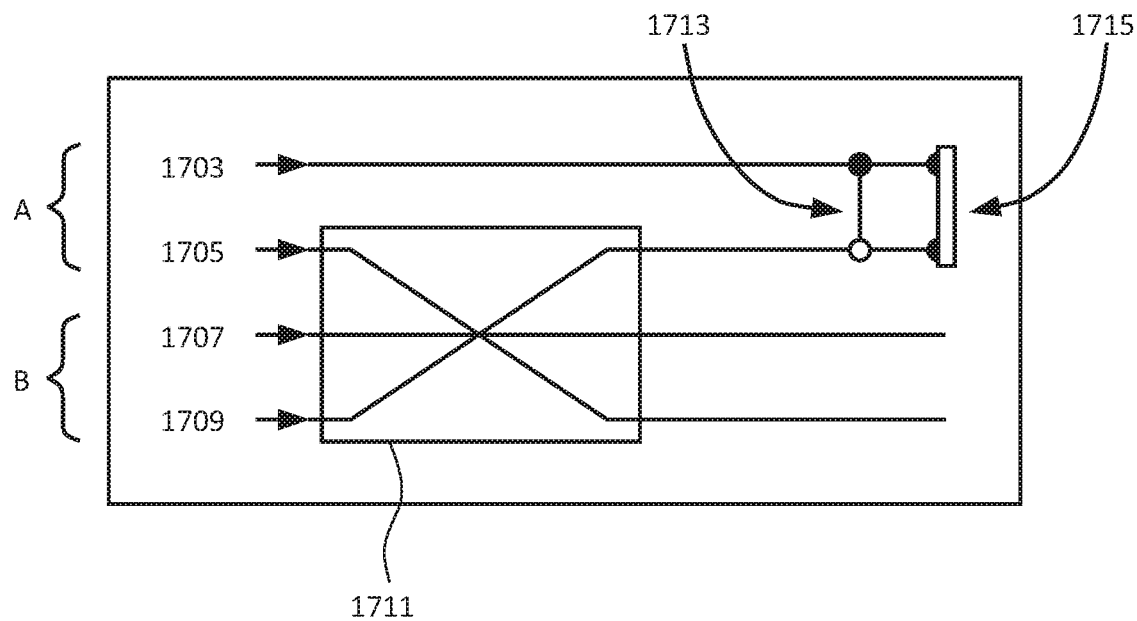
FIG. 17A is a type I fusion gate in accordance with some embodiments.
Figure 17B:
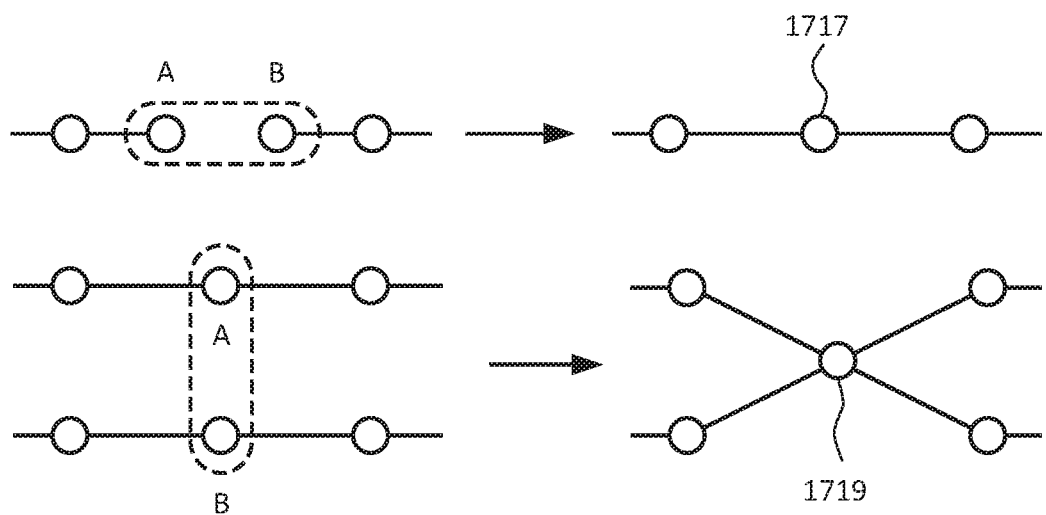
FIG. 17B shows type I fusion in accordance with some embodiments.

FIG. 17A shows a linear optical circuit for performing Type 1 fusion on dual rail encoded photonic qubits. FIG. 17B shows two examples of qubit cluster states that result from fusion operations in accordance with some embodiments. In the description that follows, embodiments will be described that employ spatial modes of photons as the qubit system, but one of ordinary skill will appreciate that any type of qubit described by any type of mode can be employed without departing from the scope of the present disclosure. Furthermore, in what follows, photonic waveguides are used to define the spatial modes of the photon. However, one of ordinary skill having the benefit of this disclosure will appreciate that any type of mode, e.g., polarization modes, temporal modes, and the like, can be used without departing from the scope of the present disclosure.

In general, in a photonic system, fusion gates can be linear optical circuits that allow the fusion of small entangled resources, e.g., Bell pairs, to obtain larger entangled states and, ultimately, generate a cluster state used for quantum computation. There are two types of fusion gates, Type I and Type II fusion gates, with Type I described in detail below. Both types of fusion gates work by performing a probabilistic Bell state measurement (BSM) on the input state to collapse the two input qubits onto a Bell pair when the fusion succeeds. For the case of Type I fusion, the collapse of the state of the two input qubits onto a Bell pair can be viewed as the application of Kraus operators to the input.

FIG. 17A shows a circuit diagram illustrating a (unboosted) type I fusion gate in accordance with some embodiments. The diagram shown in FIG. 17A is schematic with each horizontal line representing a mode of a quantum system, e.g., a waveguide with a photon confined therein. In the dual rail path encoding, each pair of modes represents a qubit. In a photonic implementation of the gate, the modes in diagrams such as that shown in FIG. 17A can be physically realized using single photons in photonic waveguides. Most generally, a type I fusion gate like that shown in FIG. 17A fuses qubits A (physically realized by photon modes 1703 and 1705) and B (physically realized by photon modes 1707 and 1709) to create a Bell pair between them. Qubits A and B are each entangled with the modes of one or more other qubits (not shown) and thus, when they are fused by the gate, a larger cluster state can be created.

For example, FIG. 17B shows the result of fusing two qubits A and B that are each, respectively, a qubit located at the end (i.e., a leaf) of some longer entangled cluster state (only a portion of which is shown). The qubit 1717 that remains after the fusion operation inherits the entangling bonds from the original qubits A and B thereby creating a larger fused linear cluster state. FIG. 17B also shows the result of fusing two qubits A and B that are each, respectively, an internal qubit that belongs some longer entangled cluster of qubits (only a portion of which is shown). As before, the qubit 1719 that remains after fusion inherits the entangling bonds from the original qubits A and B thereby creating a fused cluster state. In this case, the qubit that remains after the fusion operation is entangled with the larger cluster by way of four other nearest neighbor qubits as shown.

Returning to the schematic illustration of the type I fusion gate shown in FIG. 17A, qubit A is dual rail encoded by modes 1703 and 1705 and qubit B is dual rail encoded by modes 1707 and 1709. For example, in the case of path encoded photonic qubits, the logical zero state of qubit B $|0\rangle_B$ occurs when mode 1703 is a photonic waveguide that includes a single photon and mode 1705 is a photonic waveguide that includes zero photons (and likewise for qubit B). Thus, the type 1 fusion gate shown in FIG. 17A takes as input two dual rail encoded photon qubits thereby resulting in a total of four input modes (e.g., modes 1703, 1705, 1707, and 1709). To accomplish the fusion operation, a mode coupler (e.g., 50:50 beamsplitter) 1713 is applied between a mode of each of the input qubits, e.g., between mode 1703 and mode 1709 before performing a detection operation on both modes using photon detectors 1715 (which includes two distinct photon detectors coupled to modes 1703 and 1709 respectively). In addition, to ensure that the output modes are adjacently positioned, a mode swap operation 1711 can be applied that swaps the position of the second mode of qubit A (mode 1705) with the position the second mode of qubit B (mode 1709). In some embodiments, mode swapping can be accomplished through a physical waveguide crossing or by one or more photonic switches or by any other type of physical mode swap.

FIG. 17A shows only an example arrangement for the type I fusion gate and one of ordinary skill will appreciate that the position of the beamsplitter and the presence of the mode swap region 1711 can be altered without departing from the scope of the present disclosure. For example, beamsplitter 1713 can be applied between modes 1705 and 1707. Mode swaps are optional and are not necessary if qubits having non-adjacent modes can be dealt with, e.g., by tracking which modes belong to which qubits by storing this information in a classical memory.

The type I fusion gate shown in FIG. 17A is a nondeterministic gate, i.e., the fusion operation only succeeds with a certain probability and in other cases the quantum state that results is not a larger cluster state that comprises the original cluster states fused together to a larger cluster state. More specifically, the gate "succeeds" with probability 50%, when only one photon is detected by detectors 1715, and "fails" if zero or two photons are detected by detectors 1715. When the gate succeeds, the two cluster states that qubits A and B were a part of become fused into a single larger cluster state with a fused qubit remaining as the qubit that links the two previously unlinked cluster states (see, e.g., FIG. 17B). However, when the fusion gate fails, it has the effect of removing both qubits from the original cluster resource states without generating a larger fused state.

While the type I fusion gate described above exhibits only a 50% success rate, in accordance with some embodiments, it is possible to increase the success probability of the gate by interfering the qubits that enter the gate with an ancillary entangled resource before the detection. This type of fusion gate, referred to herein as a two-way boosted type I fusion gate exhibits a success probability of $$p_{succ}^n = 1 - \frac{1}{2^{n+1}}$$

where n is referred to as the "level" of the boosting and defines the size of the ancilla resource that is used for the boosting. In general, the ancilla is prepared in a $2^n$-Greenberger-Horne-Zeilinger state, also referred to as a $2^n$-GHZ state. For n=1, the ancilla resource used for boosting is two qubits in a Bell state resulting a 75% fusion success probability, as described in further detail below.

Figure 18A:
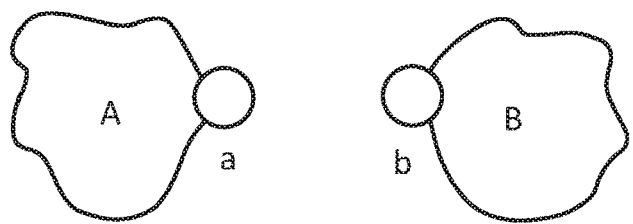
FIGS. 18A-18F show a boosted type I fusion gates and associated fusion outcomes in accordance with some embodiments.
Figure 18B:
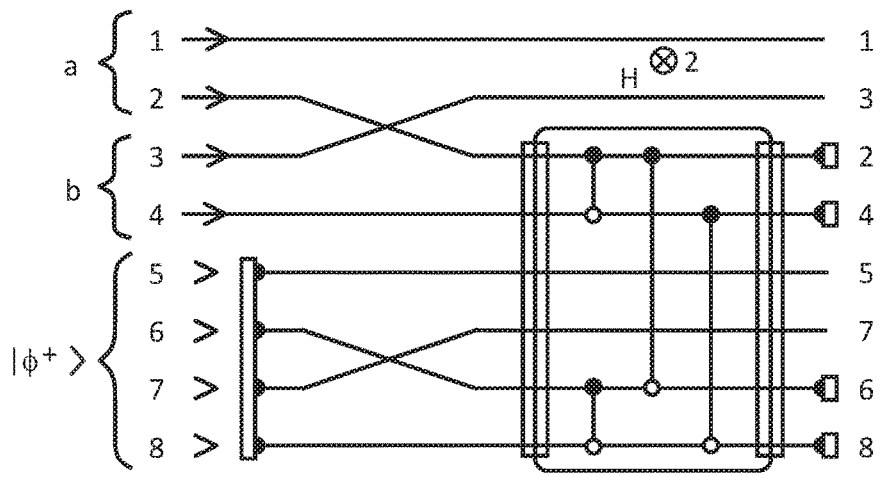

FIG. 18A shows an example of two input states for a typical fusion operation. More specifically the input qubits to the fusion gate are two qubits a and b that are each entangled to larger states represented as regions A and B (e.g., A and B could be respective unit cells of a Raussendorf lattice). Such a state can be described as $$|\Psi\rangle = (|A_0\rangle|0\rangle_a + |A_1\rangle|1\rangle_a) \otimes (|B_0\rangle|0\rangle_b + |B_1\rangle|1\rangle_b),$$

where a, b label the qubits entering the fusion gate, A, B label the systems entangled to them respectively, and $|0\rangle$, $|1\rangle$ are the basis states in the qubit basis (also referred to as the computational basis or z basis). This state can be further expanded as:

$$|\Psi_{in}\rangle =$$
$$|A_0\rangle|B_0\rangle|0\rangle_a|0\rangle_b + |A_1\rangle|B_0\rangle|1\rangle_a|0\rangle_b + |A_0\rangle|B_1\rangle|0\rangle_a|1\rangle_b + |A_1\rangle|B_1\rangle|1\rangle_a|1\rangle_b =$$
$$|A_0\rangle|B_0\rangle|10\rangle_a|10\rangle_b + |A_1\rangle|B_0\rangle|01\rangle_a|10\rangle_b +$$
$$|A_0\rangle|B_1\rangle|10\rangle_a|01\rangle_b + |A_1\rangle|B_1\rangle|01\rangle_a|01\rangle_b \mapsto$$
$$|A_0\rangle|B_0\rangle|0\rangle_a|0\rangle_b|1\rangle_a|1\rangle_b + |A_1\rangle|B_0\rangle|1\rangle_a|0\rangle_b|0\rangle_a|1\rangle_b +$$
$$|A_0\rangle|B_1\rangle|0\rangle_a|1\rangle_b|1\rangle_a|0\rangle_b + |A_1\rangle|B_1\rangle|1\rangle_a|1\rangle_b|0\rangle_a|0\rangle_b$$

where in the second line the qubit states have been expressed in the path encoding (Fock notation) and in the third line, the modes have been rearranged so that even modes are first and odd modes are second, where even and odd refer to the mode ordering on input, e.g., as shown in FIG. 18B.

In the same notation (dual rail path encoding, even modes first) the state of an ancilla Bell pair can be written as $$|\phi^+\rangle = \frac{(|10\rangle|10\rangle + |01\rangle|01\rangle)}{\sqrt{2}} \mapsto \frac{(|00\rangle|11\rangle + |11\rangle|00\rangle)}{\sqrt{2}}$$

where in the second line the modes have been rearranged to place even modes first and odd modes second.

To illustrate the boosted fusion operation, consider sending the last two modes of each of $|\Psi_{in}\rangle$ and $|\Phi^+\rangle$ (in the rearranged form) through a four-mode Hadamard gate and then detecting them, as shown in the schematic of FIG. 18B. Such a four-mode Hadamard can be realized with a series of four beamsplitters, as further explained in reference to FIG. 20 below. Such a Hadamard gate applied to the modes as shown in FIG. 18B has the effect of removing the information about which modes the detected photons come from, without altering their number.

FIG. 18B shows a Boosted Type I fusion circuit, including the input qubits a and b, the ancilla Bell pair $|\Phi^+\rangle$, and mode swaps on the input and ancilla. The cluster states A and B with which qubits a and b are entangled are not shown to avoid complicating the diagram. Each input mode 1-8 is labeled as an integer with modes 1 and 2 belonging to qubit a, and modes 3 and 4 belonging to qubit b and modes 5, 6, 7, and 8, belonging to the two qubits associated with the Bell state $|\Phi^+\rangle$. Mode swaps are shown as crossing lines and are used to rearrange the even and odd modes to be adjacent such that the diagram corresponds to the more mathematical description above. One of ordinary skill will appreciate that the modes need not be rearranged as shown as long as the mode coupling and detector placement is consistent with the description above, i.e., the 4-mode Hadamard can take in one respective mode from each of the input qubits a and b and can take in two modes from the Bell pair ancilla. At the output of the gate, all four of these modes are measured by a corresponding photon detector. The Hadamard is configured (by the application of the appropriate pair-wise beam splitters) to ensure that a detection of a photon by any one of the 4 detectors does not reveal any information about which input mode the detected photon originated. At the output of the boosted fusion gate, modes 1 and 3 from qubits a and b constitute the fused qubit that, under certain detector results, is fused with the cluster states A and B that were originally entangled with the input qubits a and b.

The possible detection outcomes are determined by taking the sum of the photon counts on the detectors of modes 2, 4, 6, and 8 that are coupled to the outputs of the Hadamard gate. Possible outcomes for the final quantum state are shown in FIGS. 18C-18E with FIGS. 18C-18D illustrating the result of a successful fusion and FIG. 18E illustrating the result of a failed fusion.

Odd Number of Photons Detected

Figure 18C:
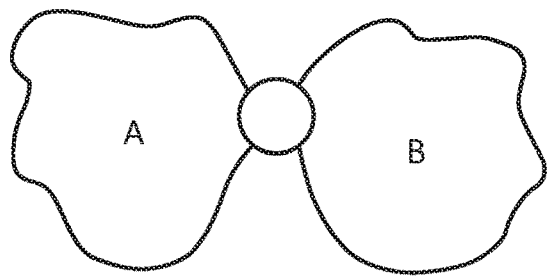
Figure 18D:
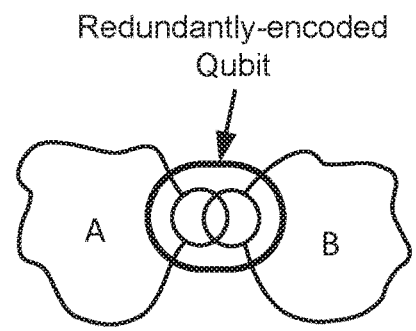
Figure 18E:
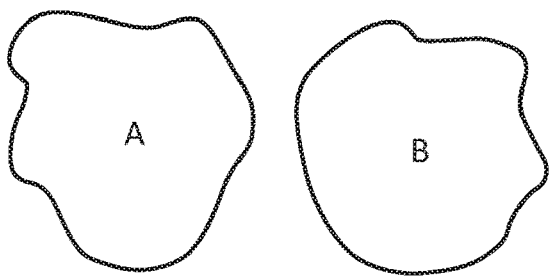

If the total number of photons detected is odd, then the fusion result is the success scenario illustrated in FIG. 18C where the cluster states A and B are fused via a single fused qubit. This can be understood by recognizing that the Bell pair ancilla can contribute either 0 or 2 photons to the detection pattern. So, in the case of an odd number of photons detected, it must be the case that the modes coming from $|\Psi_{in}\rangle$ contain 1 photon. The probability of this happening is $P_{odd} = \frac{1}{2}$. In this case, the (unnormalized) post-measurement state of the output modes is one of:

$$|\Psi_{out}^1\rangle = (|A_1\rangle|B_0\rangle|10\rangle \pm |A_0\rangle|B_1\rangle|01\rangle) \otimes |11\rangle$$

$$|\Psi_{out}^3\rangle = (|A_1\rangle|B_0\rangle|10\rangle \pm |A_0\rangle|B_1\rangle|01\rangle) \otimes |00\rangle$$

depending on whether 1 or 3 photons are detected (as indicated by the superscript). The relative phase between the two terms is determined by the specific measurement pattern obtained.

The state of the two modes coming from the Bell pair (modes 5 and 7) is revealed by the number of photons detected and factors out (i.e., the modes can be discarded), while the two modes coming from $|\Psi_{in}\rangle$ (modes 1 and 3) become entangled to both systems A and B, resulting in successful fusion. This is illustrated graphically in FIG. 18C.

2 Photons Detected

The detection of two photons can happen in two cases: either $|\Psi_{in}\rangle$ contributes 2 photons and the Bell pair contributes zero 0 or vice versa. The probability of this happening is therefore $p_2 = p_\psi^2 p_{BP}^0 + p_{104}^0 p_{BP}^2 = \frac{1}{4} \times \frac{1}{2} + \frac{1}{4} \times \frac{1}{2} = \frac{1}{4}$. The (unnormalized) post-measurement state of the output modes is:

$$|\Psi_{out}^2\rangle =$$
$$|A_0\rangle|B_0\rangle|00\rangle|11\rangle \pm |A_1\rangle|B_1\rangle|11\rangle|00\rangle = |A_0\rangle|B_0\rangle|10\rangle|10\rangle \pm |A_1\rangle|B_1\rangle|01\rangle|01\rangle$$

where, in the first line, the first two modes come from $|\Psi_{in}\rangle$ and the other two from $|\varphi^+\rangle$ and the second line is obtained by rearranging the modes. Again, the sign between the two terms depends on the specific detection pattern observed. This state corresponds to a successful fusion, where both systems A and B end up entangled to a single redundantly-encoded qubit, as illustrated in FIG. 18D.

Zero or Four Photons Detected

The detection of 0 or 4 photons collapses both $|\Psi_{in}\rangle$ and $|\varphi^+\rangle$ to one of their terms only, since these outcomes can only be obtained if both states contribute the same number of photons, 0 or 2, respectively. In such a case, the post-measurement states in the two cases are the product states:

$$|\Psi_{out}^4\rangle = |A_0\rangle|B_0\rangle|00\rangle|00\rangle$$

$$|\Psi_{out}^0\rangle = |A_1\rangle|B_1\rangle|11\rangle|11\rangle$$

neither of which produce any entanglement between the two systems A and B and therefore correspond to failure of the gate. In this case both the input qubits are destroyed, as illustrated in FIG. 18E.

In Summary:

| No. of detected photons | Probability | Outcome |
| --- | --- | --- |
| 1 or 3 photons | 1/2 | Success<br>Entanglement through one single central qubit |
| 2 photons | 1/4 | Success<br>Entanglement through a redundantly encoded central qubit |
| 0 or 4 photons | 1/4 | Failure<br>No entanglement |

The overall success probability of the scheme is therefore $\frac{3}{4}=75\%$.

Figure 18F:
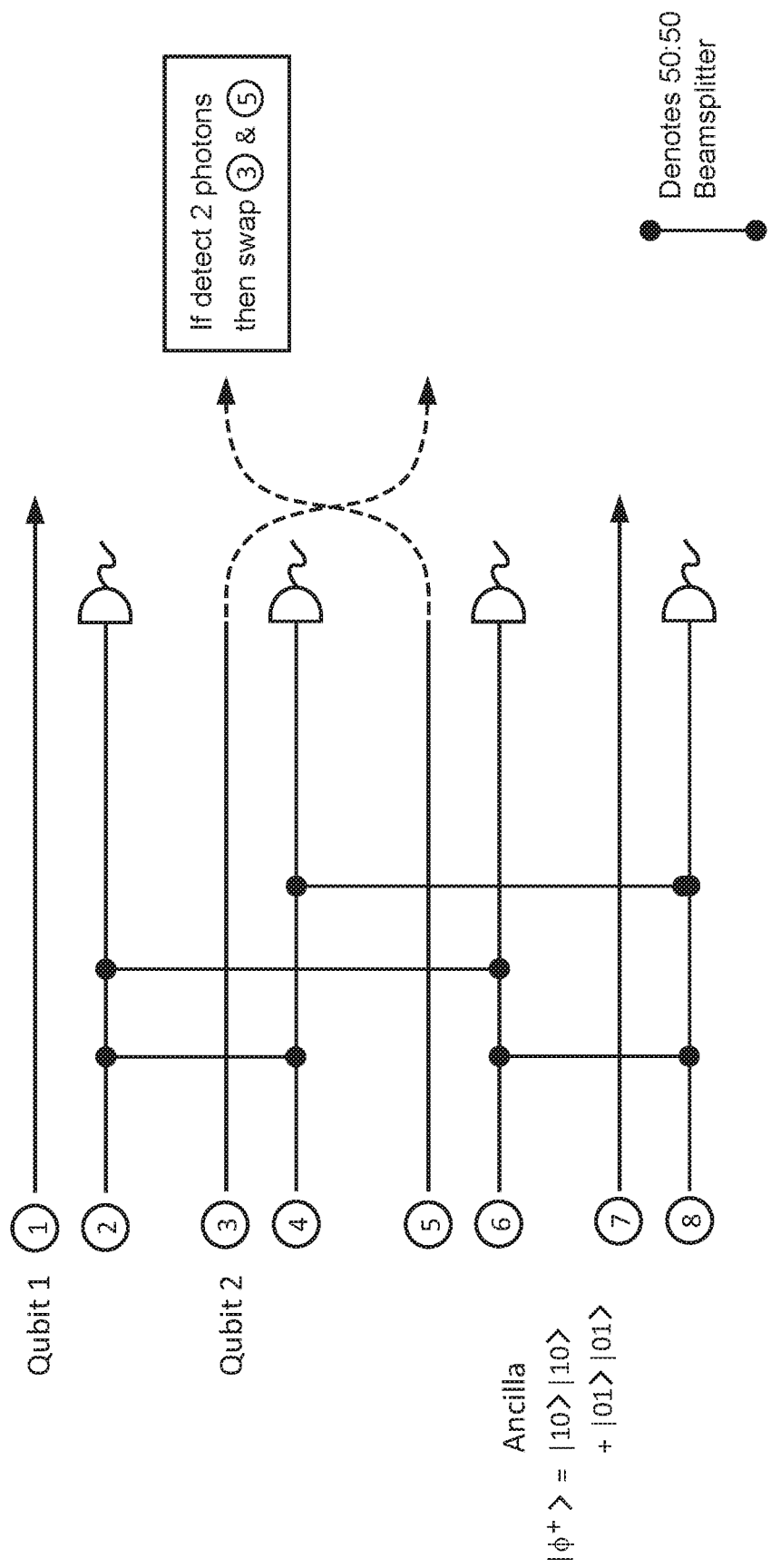

In some embodiments, boosted Type I fusion can employ some form of adaptivity, i.e., certain operations such as mode swaps can be conditioned on a certain detection pattern. For example, in the case that 2 photons are detected, the output modes can be swapped so that the modes that define the output qubits are adjacent in the circuit. Such a swap is shown in FIG. 18F. However, such adaptivity is not necessary if the position, i.e., mode number for each mode of the output qubits is stored in memory and tracked such that any gates/measurement to be applied to those modes will be applied consistently despite the fact that the qubit itself may be defined in non-adjacent modes.

Figure 19A:
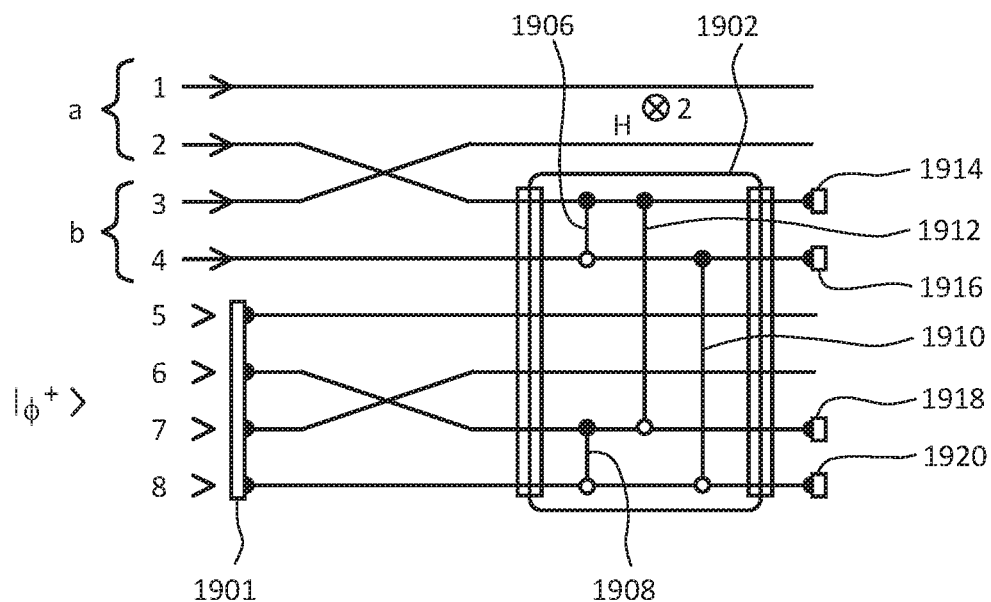
FIGS. 19A-19B shows boosted type I fusion gates in accordance with some embodiments.
Figure 19B:
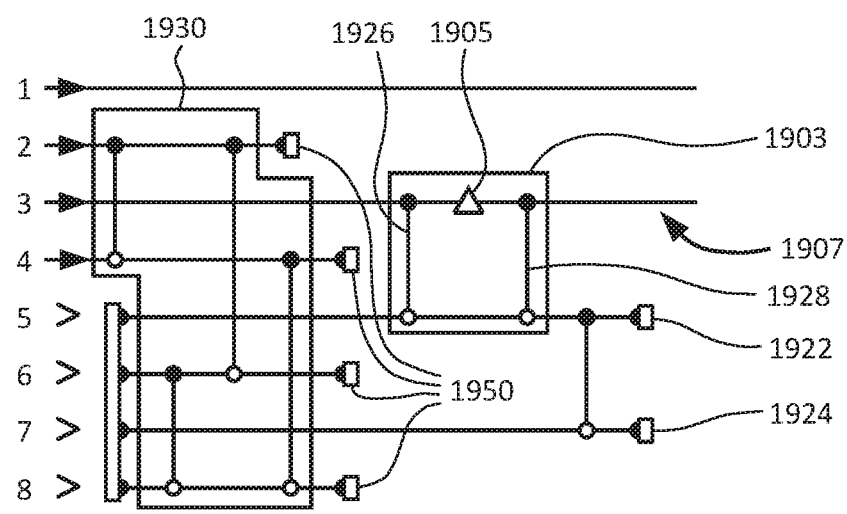

FIGS. 19A-19C show examples of two-way boosted type I fusion gates in accordance with some embodiments. As in FIG. 18B, qubit modes are represented as horizontal lines. Entangled states of many modes are represented by rectangles that extend across, and thereby join, multiple modes. For example, rectangle 1901 in FIG. 19A signifies that the four modes 5-8 form a Bell state). In the examples shown here, qubits are encoded in a two-mode (i.e., dual rail encoding). For example, in a photonic implementation, all modes can be physically implemented as waveguides as already described above. Furthermore, in FIGS. 19A-19C, collections of components that can be grouped together functionally to form gates are outlined by larger rectangles. For example, Hadamard gate 1902 is outlined in a shaded rectangle having four input modes (2, 4, 6, 8) and four output modes (2, 4, 6, 8). In the diagrams shown here, modes that pass through a rectangular block are not part of the gate, e.g., modes 5 and 7 in FIG. 19A are not acted on by the Hadamard gate 1902. Photon detectors are shown as small rectangles that terminate a given mode, e.g., detectors 1914, 1916, 1918, and 1920. Detectors generally measure whether or not the quantum system being measured is in the mode being measure (e.g., whether or not any given waveguide being measured includes a photon). For example, the two-way boosted type I fusion gate shown in FIG. 19A includes four detectors that terminate modes 2, 4, 6, and 8 labeled as detectors 1914, 1916, 1918, and 1920, respectively. Such detectors can be any type of single photon detector, including, e.g., superconducting nanowire single photon detectors, SPADs, APDs and the like.

In the two-way boosted type I fusion gate shown in FIG. 19A, the Hadamard gate 1902 includes a collection of mode couplers, e.g., beam splitters 1906, 1908, 1910, and 1912. At a high level, the function of the beam splitters is to couple the modes such that if a photon is detected at any one of detectors 1914, 1916, 1918, and 1920 it is impossible to determine which input mode that photon originated from. To function this way, the example shown in FIG. 19A includes a first mode coupler 1906 that couples two of the modes from input qubits a and b and a second mode coupler 1908 that couples two of the four modes that make up the ancilla Bell pair $|\varphi^+\rangle$. The coupled modes 2 and 4 from the input qubits a and b and the coupled modes 6 and 8 from the ancilla Bell pair are then coupled via beam splitter 1916 and beam splitter 1910, respectively. Details of the operation of the fusion gate shown in FIG. 19A were previously described above in reference to FIGS. 18A-18F and therefore will not be repeated here.

FIG. 19B shows another example of two-way boosted type I fusion gate shown i) without the mode swaps shown in FIG. 19A; ii) with additional circuitry to effectuate a conditional mode swap described in more detail above in reference to FIGS. 18A-18F; and iii) two additional detectors 1922 and 1924 to measure out the two Bell state modes that do not contribute to the fused cluster state. Before detection, the two Bell state modes are coupled to ensure that detection in either mode does not provide information relating to which mode the photon originated from thereby ensuring that the measurements at detectors 1922 and 1924 do not collapse the output modes of the fusion operation to an undesired state.

The fusion gate shown in FIG. 19B also includes a set of components that form a Mach-Zehnder interferometer 1903 that accomplishes a conditional mode swap between modes 3 and 5 depending on the detection results from detectors 1950. More specifically the Mach-Zehnder interferometer 1903 includes a phase shifter 1905 sandwiched between to mode couplers 1926 and 1928, which can be 50/50 beam-splitters. One of ordinary skill will appreciate that the Mach-Zehnder interferometer shown here is but one example and many different implementations of Mach-Zehnder interferometers (or conditional mode swappers) can be implemented without departing from the scope of the present disclosure. In the boosted type I fusion gate shown in FIG. 19B, the Hadamard gate 1930 is implement as in FIG. 19A, i.e., by a set of mode couplers that couple four modes (two from the input qubits and two from the ancilla Bell pair).

In each of boosted fusion circuits shown in FIGS. 19A-19B, Hadamard gates are accomplished by a collection of beam splitters that operate to couple all the input modes together in such a way that detection of a photon at one of the detectors located at one of the output ports of the Hadamard does not reveal which mode the detected photon originated from, i.e., the action of the Hadamard is to erase any information relating to which input modes any given detected photon originated from. This "mode-scrambling" or "information erasure" function of the Hadamard can be implemented in any number of ways without departing from the scope of the present disclosure. For example, as shown schematically in FIGS. 19A-19B Hadamard 1902 can be accomplished in a photonic system by coupling the two input modes 2 and 4 (originating from qubits a and b, respectively) via a 50/50 beamsplitter 1906. In other architectures other types of physical mode couplers can be used. For example, in trapped ion systems or superconducting qubits may employ mode couplers that are physically implemented by some form of electromagnetic coupling between qubit modes, e.g., via laser light and/or RF/microwave electromagnetic fields.

In each of the boosted type 1 fusion gates shown in FIGS. 19A-19B, detectors are placed on the even modes (or more generally they can be placed on the modes that do not make up the final fused qubit). Backing logic circuitry (not shown) can take the detector outputs (which can be analog pulses and/or digital data in the forms of 1' and 0's) and can then determine an action to take (e.g., swap modes 3 and 5) based on the detection result. As described above, if a total of two photons is detected by the detectors, then the backing logic circuity can send a control signal to the phase shifter 1905 of the Mach-Zehnder interferometer 1903 resulting in the desired mode swap.

FIG. 19C shows a three-way boosted type I fusion gate in accordance with some embodiments. This three-way boosted type I fusion gate 1930 is one way to implement the boosted fusion generators described above in reference to FIG. 5 above. At a high level, the three-way boosted type I fusion gate 1930 includes two two-way boosted type I fusion gates 1932 and 1934 such as those described above in reference to FIGS. 19A-19B. Modes 1-8 are input on two-way boosted type I fusion gate 1932, which is a circuit that is equivalent to that described above in reference to FIG. 19B. Likewise, the two output modes from the two-way boosted type I fusion gate 1932 and new modes 9-15 form the 8 input modes for the second-stage two-way boosted type I fusion gate 1934, which is equivalent to the gate shown in FIG. 19A but without the optional mode swaps.

c. Notation

Figure 20:
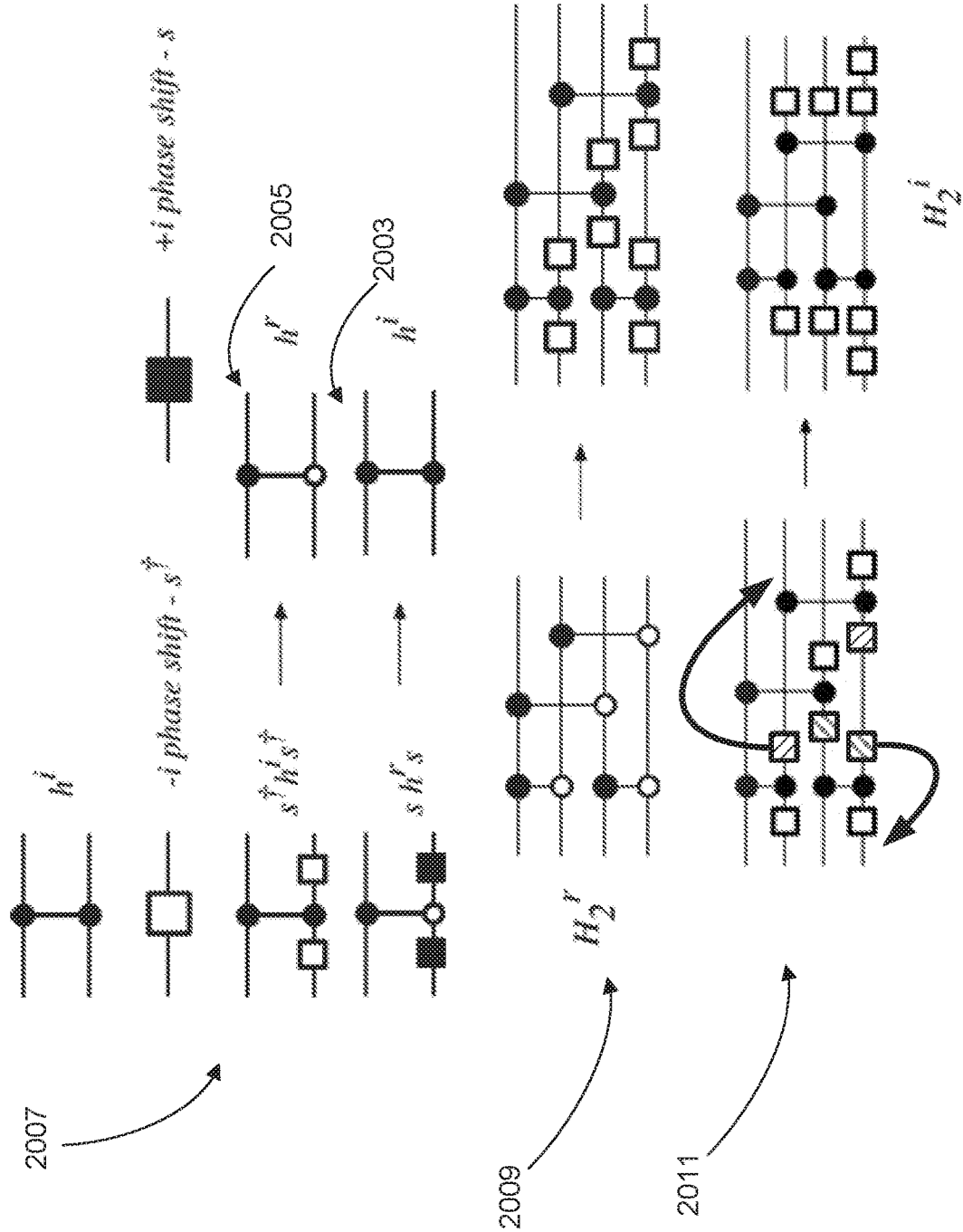
FIG. 20 shows schematic diagrams of beamsplitters and Hadamard gates in accordance with some embodiments.

In the schematic diagrams used herein, e.g., FIGS. 17A, 18B, 19A-19C, certain components/quantum gates are represented as shown in FIG. 20. In general, the definitions and relations between beamsplitters and n-mode Hadamards can be translated to the path-encoded diagrams using the notation shown in FIG. 20. Mathematically, the imaginary Hadamard can be written as $$h^i = \frac{1}{\sqrt{2}} \begin{pmatrix} 1 & i \\ i & 1 \end{pmatrix}$$

and the real Hadamard $h^r$ can be written as $$h^r = \frac{1}{\sqrt{2}} \begin{pmatrix} 1 & 1 \\ 1 & -1 \end{pmatrix}$$

Physically, e.g., in a photonic system, the above Hadamard gates can be implemented as beamsplitters and/or directional couplers. The real and complex Hadamards can be transformed into one another by applying a ±i phase shift to the second mode. The unitary operators that define such a phase shift are given by $$s = \begin{pmatrix} 1 & 0 \\ 0 & i \end{pmatrix} \text{ and } s^\dagger = \begin{pmatrix} 1 & 0 \\ 0 & -i \end{pmatrix},$$

in which case $h^i = s h^r s$ and $h^r = s^\dagger h^i s^\dagger$.

In view of the above mathematical relations, the complex Hadamard corresponds to a real Hadamard preceded and followed by a phase of i on the second mode, and the real Hadamard corresponds to a complex Hadamard preceded and followed by a phase of −i on the second mode. Both matrices are symmetric, but they differ in that $h^i$ applies the same operation to both the modes it acts on, while $h^r$ acts differently on the two modes. This means that, while the order of the input modes is irrelevant when the complex Hadamard is used, it is important if the real version is applied.

The two-mode imaginary Hadamard $h^i$ and the two-mode real Hadamard $h^r$ can be represented schematically as mode couplers 2003 and 2005, respectively. The transformations between the two are also shown via schematic elements 2007, where −i phase shifts applied to a mode are represented by open boxes and i phase shifts applied to a mode are represented by boxes with black fill. As already described above, these mode couplers can be physically implemented as beamsplitters, directional couplers and the like.

The above description for two-mode Hadamard gates can be generalized to n-mode situations. More specifically an n-mode (also referred to herein as an n-th order Hadamard) real/imaginary Hadamard can be expressed as $$H_n^r = h^r \otimes h^r \otimes \ldots \otimes h^r = h^{r \otimes n}$$

$$H_n^i = h^i \otimes h^i \otimes \ldots \otimes h^i = h^{i \otimes n}$$

For example, the $2^{nd}$ order Hadamards are $$H_2^r = \frac{1}{2} \begin{pmatrix} 1 & 1 & 1 & 1 \\ 1 & -1 & 1 & -1 \\ 1 & 1 & -1 & -1 \\ 1 & -1 & -1 & 1 \end{pmatrix}$$

$$H_2^i = \frac{1}{2} \begin{pmatrix} 1 & i & i & -1 \\ i & 1 & -1 & i \\ i & -1 & 1 & i \\ -1 & i & i & 1 \end{pmatrix}$$

More generally, the 2n×2n Hadamards (real or complex) can be decomposed into products of single beamsplitters using the following formula:

$$H_n^{r(i)} = \prod_{j=1}^{\log_2(N)} \left( \prod_{\substack{i=0 \, i \bmod 2^j < 2^{j-1}}}^{N-1} h_{i,i+2^{j-1}}^{r(i)} \right)$$

Where $N=2^n$ and the lower indices on $h^{r(i)}$ indicate the modes the beamsplitters act on. For example, expanding this formula gives:

$$H_1^{r(i)} = h_{0,1}^{r(i)}(2\times 2)$$

$$H_2^{r(i)} = h_{0,1}^{r(i)} h_{2,3}^{r(i)} h_{0,2}^{r(i)} h_{1,3}^{r(i)}(4\times 4)$$

$$H_3^{r(i)} = h_{0,1}^{r(i)} h_{2,3}^{r(i)} h_{4,5}^{r(i)} h_{6,7}^{r(i)} h_{0,2}^{r(i)} h_{1,3}^{r(i)} h_{4,6}^{r(i)} h_{5,7}^{r(i)} h_{0,4}^{r(i)} h_{1,5}^{r(i)} h_{2,6}^{r(i)} h_{3,7}^{r(i)}(8\times 8)$$

Schematic diagrams 2009 show one example of the real second order Hadamard. Likewise, schematic 2011 shows the imaginary second order Hadamard. Also included are the steps by which the real Hadamard can be converted to the imaginary Hadamard.

d. Example Implementations of Beam Splitters

FIG. 21A is a block diagram illustrating components of an example quantum entanglement generator in accordance with some embodiments.

The example quantum entanglement generator shown in FIG. 21A includes beam splitter 2102 (e.g., a polarizing beam splitter) configured to receive single photon 2105 of entangled photons 2103 and 2105 and single photon 2107 of entangled photons 2107 and 2109 (without receiving photons 2103 and 2109). In FIG. 21A, beam splitter 2102 is coupled with detector 2104. Detector 2104 is configured to detect one or more photons. In some implementations, detector 2104 is used for determining whether quantum entanglement has been successfully performed. For example, when only one photon is detected by detector 2104, photons 2103 and 2109 and the photon output from beam splitter 2102 are deemed to be entangled. In some embodiments, a quantum entanglement generator includes one or more polarization-based elements (e.g., quarter waveplates, half waveplates, linear polarizers, etc.). For brevity, such details are omitted herein.

Figure 21C:
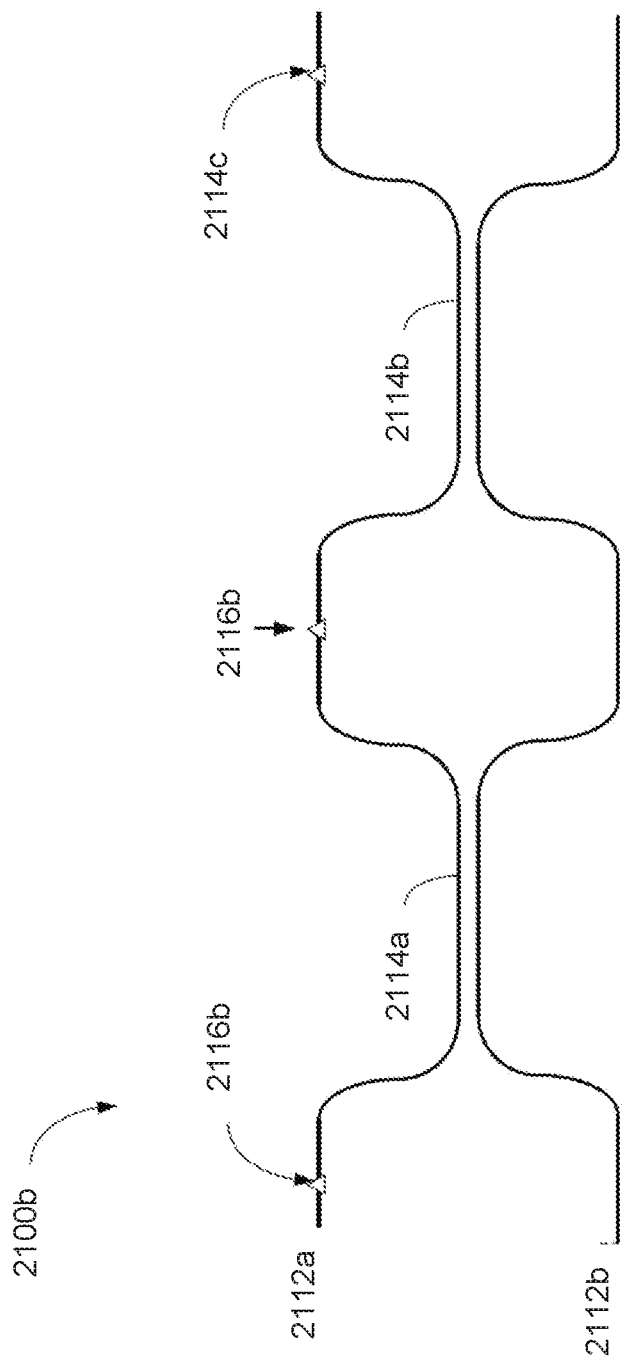
Figure 21D:
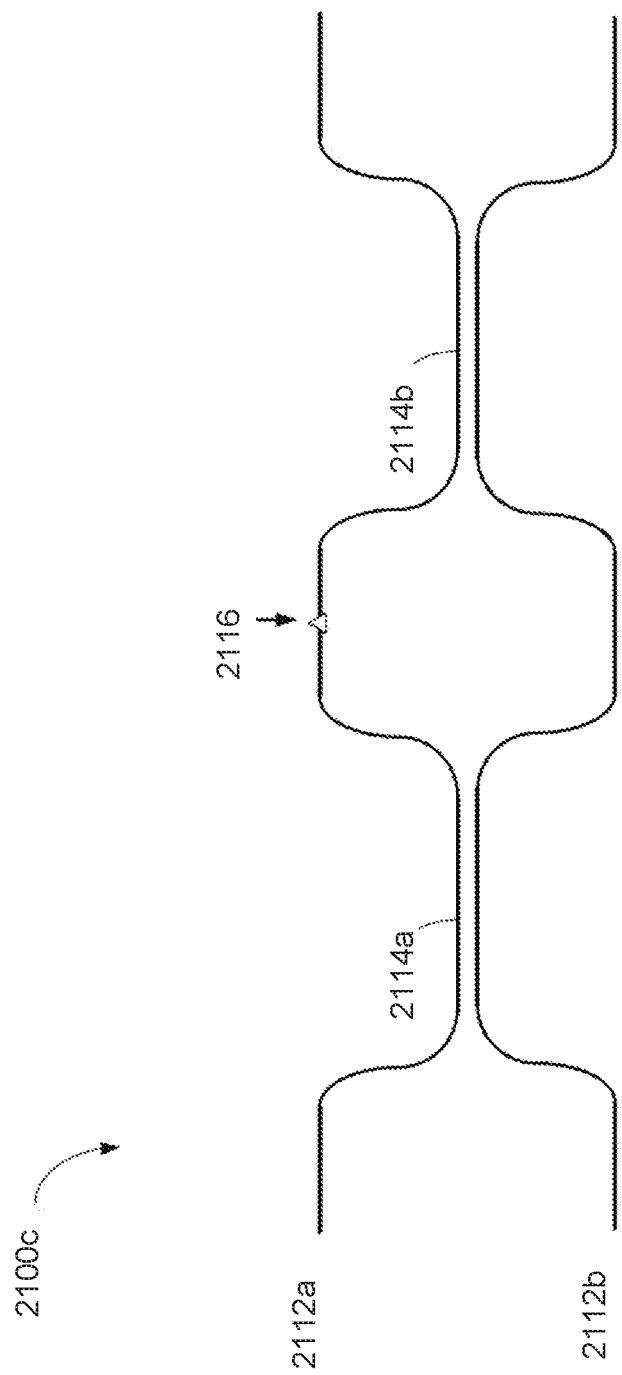

FIGS. 21B-21D illustrate schematic diagrams of waveguide beam splitters 2100 (e.g., 2100a, 2100b, and 2100c, respectively), in accordance with some embodiments. In some embodiments, beam splitters are implemented in integrated photonics via directional couplings, which are realized by bringing together the different waveguides (e.g., waveguides 2112a and 2112b) close enough so that the evanescent field of one of them can couple into the other one. By controlling the separation d between the waveguides 2112 and/or the length/of the coupling region 2114, different transmissivity can be obtained and therefore this implementation is equivalent to a beam-splitter in bulk optics. In this manner, wave guide beam splitter 2100 may be configured to have a transmissivity equal to 0.5 (e.g., a 50:50 beam splitter, greater than 0.6, greater than 0.7, greater than 0.8, or greater than 0.9).

In some embodiments, waveguide beam splitters 2100 include variable phase-shifters 2116. Variable phase-shifters can be implemented in integrated circuits, providing control over the relative phases of the state of a photon spread over multiple modes. For the silica-on-silicon materials some embodiments implement variable phase-shifters using thermo-optical switches. The thermo-optical switches use resistive elements fabricated on the surface of the chip, that via the thermo-optical effect can provide a change of the refractive index n by raising the temperature of the waveguide 2112 by an amount of the order of $10^{-5}$ K. One of skill in the art, however, having had the benefit of this disclosure, will understand that any effect that changes the refractive index of a portion of the waveguide can be used to generate a variable, electrically tunable, phase shift. For example, some embodiments use beam splitters based on any material that supports an electro-optic effect, so-called $\chi^2$ and $\chi^3$ materials such as lithium niobite, BBO, KTP, and the like and even doped semiconductors such as silicon, germanium, and the like.

Beam-splitters with variable transmissivity and arbitrary phase relationships between output modes can also be achieved by combining directional couplings and variable phase-shifters in a Mach-Zehnder Interferometer (MZI) configuration, e.g., as shown in FIG. 21C. Complete control over the relative phase and amplitude of the two paths in dual rail encoding can be achieved by varying the phases imparted by phase shifters 2116a, 2116b, and 2116c. FIG. 21D shows a slightly simpler example of a MZI that allows for a variable transmissivity between modes 2112a and 2112b by varying the phase imparted by the phase shifter 2116. FIGS. 21B-21D are only three examples of how one could implement a mode coupling in a physical device, but any type of mode coupling/beam splitter can be used without departing from the scope of the present disclosure.

For example, the waveguide beam splitter in FIG. 21D can be used to switch photons in mode 2112a into either mode 2112a or 2112b by adjusting the phase of phase shifter 2116b appropriately. Thus, a tunable waveguide beam splitter is a device for mode swapping and optical switching. In addition, these beam splitters, e.g., in a 50:50 configuration can be used to spread the quantum state of a single photon equally across multiple modes (waveguides).

VI. Quantum Computing System

Figure 22:
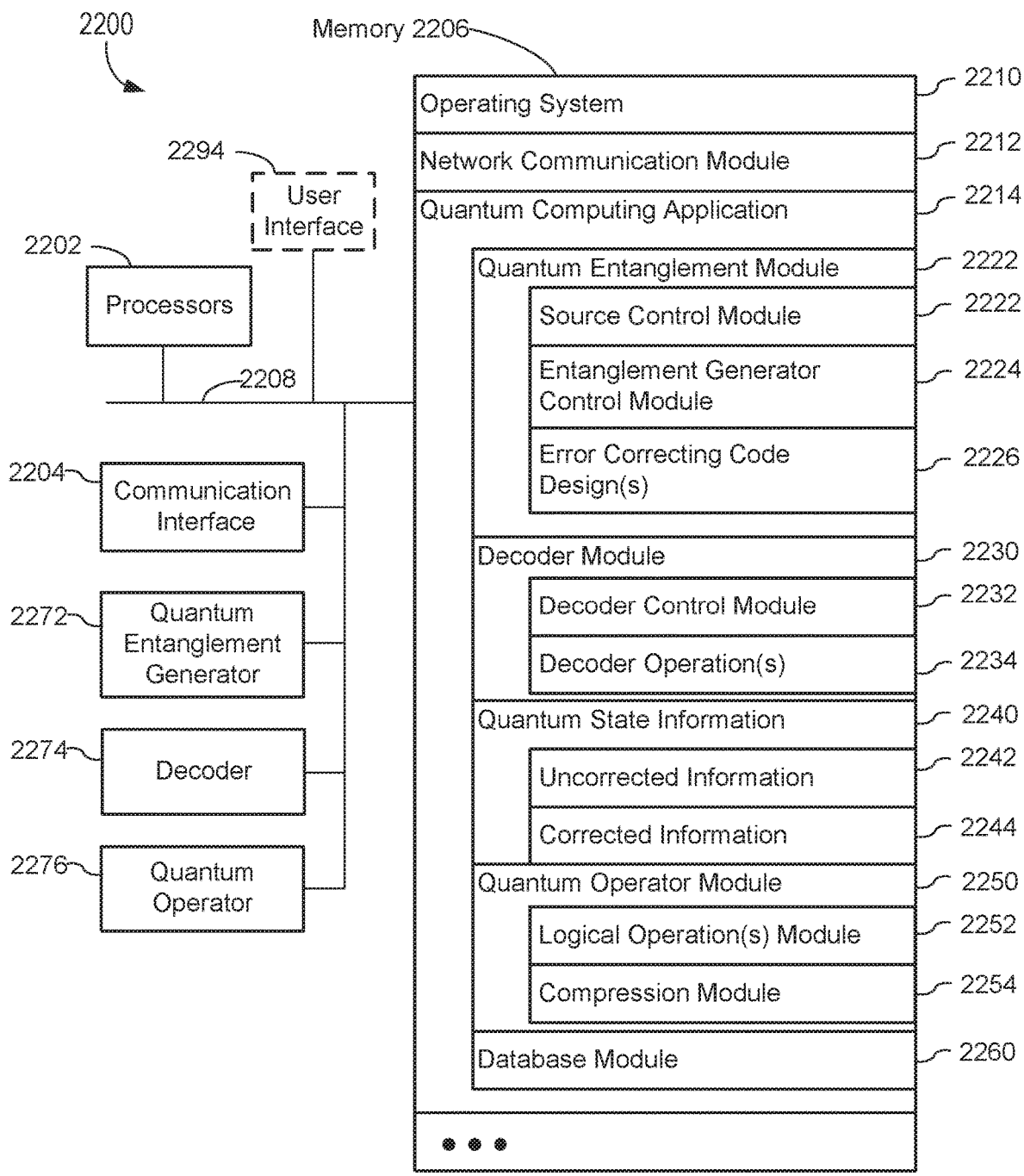
FIG. 22 is a block diagram illustrating components of a quantum computer in accordance with some embodiments.

FIG. 22 is a block diagram illustrating components (e.g., electronic components, optical components, etc.) of quantum computer 2200 in accordance with some embodiments. Quantum computer 2200 typically includes one or more processing units 2202 (central processing units, application processing units, application-specific integrated circuit, etc., which are also called herein processors), one or more network or other communications interfaces 2204, memory 2206, and one or more communication buses 2208 for interconnecting these components. In some embodiments, one or more processing units 2202 include integrated circuit configured for performing various computational and data processing operations. In some embodiments, communication buses 2208 include circuitry (sometimes called a chipset) that interconnects and controls communications between system components. In some embodiments, quantum computer 400 includes user interface 2294 (e.g., a user interface having a display device, which can be used for displaying acquired images, one or more buttons, and/or other input devices).

In some embodiments, quantum computer 2200 also includes quantum entanglement generator 2272 (e.g., quantum entangling system 223, FIG. 2) configured for generating entangled qubits. In some embodiments, quantum entanglement generator 2272 includes one or more quantum bit (also called herein qubit) sources (e.g., one or more single photon sources, one or more trapped ion sources, etc.). In some embodiments, quantum entanglement generator 2272 also includes one or more entanglement generators to entangle qubits provided by the one or more qubit sources.

In some embodiments, quantum computer 2200 includes decoder 2274 (e.g., quantum detection array 221, FIG. 2) configured for correcting errors in quantum state information.

In some embodiments, quantum entanglement generator 2272 includes one or more detectors for obtaining certain quantum state information (e.g., syndrome states and/or qubit states) from the entangled qubits. In some embodiments, the one or more detectors are configured for obtaining only a subset of quantum state information. In some embodiments, decoder 2274 includes the one or more detectors.

In some embodiments, quantum computer 2200 includes quantum operator 2276 for processing entangled qubits. In some embodiments, quantum operator 2276 includes photonic circuits (e.g., integrated optical circuits), electrical circuits, and/or magnetic circuits for processing the entangled qubits. In some embodiments, quantum operator 2276 is configured to perform logical operations (e.g., logic gate operations, such as AND, OR, NOT, XOR, NAND, NOR, and/or any combination thereof) with the entangled qubits. In some embodiments, quantum operator 2276 is configured to perform a quantum gate operation (e.g., Hadamard transformation, Pauli-X operation, Pauli-Y operation, Pauli-Z operation, square-root-of-NOT operation, phase shift operation, swap operation, square-root-of-swap operation, Toffoli operation, Fredkin operation, Ising operation, Deutsch operation, and/or any combination thereof). In some embodiments, quantum operator 2276 is configured to perform compression of the entangled qubits (e.g., determine a sum or a product of qubit states for the entangled qubits).

In some embodiments, quantum entanglement generator 2272 includes one or more quantum operators 2276 for changing states of qubits or obtaining qubits in particular states prior to entanglement so that qubits in the particular states are used in entanglement.

In some embodiments, quantum computer 2200 includes one or more routing elements (e.g., photonic waveguides) for routing qubits (e.g., photons) among quantum entanglement generator 2272, decoder 2274, and quantum operator 2276. For example, in some implementations, the one or more routing elements (e.g., photonic waveguides) route qubits provided by quantum entanglement generator 2272 to decoder 2274 and/or quantum operator(s) 2276. In some implementations, the one or more routing elements (e.g., photonic waveguides) route qubits provided by decoder 2274 to quantum operator(s) 2276. In some implementations, the one or more routing elements (e.g., photonic waveguides) route qubits processed by quantum operator(s) 2276 back to the same or different quantum operator(s) 2276 for further processing. In some implementations, the one or more routing elements (e.g., photonic waveguides) route qubits processed by quantum operator(s) 2276 to quantum entanglement generator 2272 and/or decoder 2274 for further processing (e.g., further entanglements and/or decoding).

In some embodiments, communications interfaces 2204 include wired communications interfaces and/or wireless communications interfaces (e.g., Wi-Fi, Bluetooth, etc.).

Memory 2206 of quantum computer 2200 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 2206 may optionally include one or more storage devices remotely located from the processors 2202. Memory 2206, or alternately the non-volatile memory device(s) within memory 2206, comprises a computer readable storage medium (which includes a non-transitory computer readable storage medium and/or a transitory computer readable storage medium). In some embodiments, memory 2206 includes a removable storage device (e.g., Secure Digital memory card, Universal Serial Bus memory device, etc.). In some embodiments, memory 2206 is a physically separate and distinct storage device (e.g., a memory chip). In some embodiments, memory 2206 is integrated in another electronic component (e.g., cache and/or register of a processor).

In some embodiments, memory 2206 or the computer readable storage medium of memory 2206 stores the following programs, modules and data structures, or a subset thereof:
- operating system 2210 that includes procedures for handling various basic system services and for performing hardware dependent tasks;
- network communication module (or instructions) 2212 that is used for connecting quantum computer 2200 to other computers (e.g., clients and/or servers) via one or more communications interfaces 2204 and one or more communications networks, such as the Internet, other wide area networks, local area networks, metropolitan area networks, and so on; and
- quantum computing application 2214 that controls operations of quantum entanglement generator 2272, decoder 2274, and/or quantum operator 2276.

In some embodiments, quantum computing application 2214 includes the following modules and data structures, or a subset or superset thereof:
- quantum entanglement module 2220 configured for operating quantum entanglement generator 2272;
- decoder module 2230 configured for operating decoder 2274;
- quantum state information 2240 storing various quantum state information, such as qubit states and/or syndrome states for a respective set of entangled qubits;
- quantum operator module 2250 configured for operating quantum operator 2276; and
- database module 2260 configured to assist storage and/or retrieval of data on quantum computer 2200 or a remote data storage device (e.g., a remote data server).

In some embodiments, quantum entanglement module 2220 includes the following programs, modules and data structures, or a subset or superset thereof:
- source control module 2222 configured for controlling one or more qubit sources in quantum entanglement generator 2272 (e.g., providing instructions to the one or more qubit sources to provide a certain number of qubits);
- entanglement generator control module 2224 configured for controlling the one or more entanglement generators (e.g., providing instructions to the one or more entanglement generators to entangle certain groups of qubits); and
- error correcting code design(s) 2226 (e.g., information identifying how a group of qubits needs to be entangled, such as Shor code, Steane code, CSS codes, stabilizer codes, topological quantum codes, etc.).

In some embodiments, decoder module 2230 includes the following programs, modules and data structures, or a subset or superset thereof:
- decoder control module 2232 configured for controlling decoder 2274 (e.g., providing instructions to decoder 2274 to initiate correction of errors in quantum state information); and
- decoder operations 2234 including information identifying particular decoder operations (e.g., cluster identification, selective growth of a cluster, etc.). In some embodiments, decoder operations 2234 also include instructions for transferring data between decoder 2274 and other components (e.g., quantum entanglement generator 2272 and/or quantum operator 2276).

In some embodiments, quantum state information 2240 includes the following data structures, or a subset or superset thereof:
- uncorrected information 2242 obtained from quantum state measurements; and
- corrected information 2244 obtained by processing uncorrected information 2242 with decoder 2274.

In some embodiments, quantum state information 2240 includes multiple copies, including one or more interim copies, of corrected information 2244 based on a number of iterations of error correction operations.

In some embodiments, quantum state information 2240, or a subset or superset thereof, is stored outside memory 2206 (e.g., quantum state information 2240, or a subset or superset thereof, is stored in decoder 2274).

In some embodiments, quantum operator module 2250 includes the following programs, modules and data structures, or a subset or superset thereof:
- logical operations module 2252 configured for controlling quantum operator 2276 for logical operations (e.g., providing instructions to quantum operator 2276 to initiate certain logical operations); and
- compression module 2254 configured for controlling quantum operator 2276 for compression operation (e.g., providing a sum or a product of a group of entangled qubits).

Each of the above identified modules and applications correspond to a set of instructions for performing one or more functions described above. These modules (e.g., sets of instructions) need not be implemented as separate software programs, procedures or modules, and thus various subsets of these modules may be combined or otherwise rearranged in various embodiments. In some embodiments, memory 2206 may store a subset of the modules and data structures identified above. Furthermore, memory 2206 may store additional modules and data structures not described above.

The above-described components need not be implemented as separate components, and thus various subsets of these components may be combined or otherwise rearranged in various embodiments. For example, in some embodiments, quantum entanglement generator 2272 and decoder 2274 are integrated in a single physical component (e.g., a single integrated photonic circuit). In some embodiments, quantum entanglement generator 2272, decoder 2274, and quantum operator 2276 are integrated in a single physical component (e.g., a single integrated photonic circuit).

In accordance with some embodiments, a photonic device includes one or more gates configured to perform any of the methods described herein.

In some embodiments, the photonic device includes one or more fusion gates. For example, the one or more gates of the photonic device include one or more fusion gates.

In some embodiments, the photonic device includes one or more beam splitters (e.g., beam splitter 2102 in FIG. 21A or beam splitters 2100a, 2100b, or 2100c shown in FIGS. 21B-21D).

In some embodiments, each gate includes one or more beam splitters.

In some embodiments, the photonic device includes one or more single-photon sources (e.g., a photon source configured to attempt provision of only a single photon at a time).

It will also be understood that, although the terms first, second, etc. are, in some instances, used herein to describe various elements, these elements should not be limited by these terms. These terms are only used to distinguish one element from another. For example, a first edge could be termed a second edge, and, similarly, a second edge could be termed a first edge, without departing from the scope of the various described implementations. The first edge and the second edge are both edges, but they are not the same edge unless explicitly stated as such.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, a qubit refers to a particle in a particular physical state referred to as a quantum state. Typically, the physically state of the qubit can be used to encode quantum information, which can then be processed by one or more quantum gates, a process referred to herein as quantum computing. For example, the qubits can be particles, such as atoms, ions, and nuclei. In another example, the qubits can be photons. In yet other examples, the quantum systems can be other engineered quantum systems such as flux qubits, phase qubits, or charge qubits (e.g., formed from a superconducting Josephson junction), topological qubits (e.g., Majorana fermions), or spin qubits formed from vacancy centers (e.g., nitrogen vacancies in diamond).

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. A method, comprising:
obtaining a fault-tolerant quantum cluster state with a plurality of entangled qubits represented by a lattice structure, the lattice structure including a plurality of contiguous lattice cells, a particular lattice cell including ten distinct vertices that include a first vertex, a second vertex, a third vertex, a fourth vertex, a fifth vertex, a sixth vertex, a seventh vertex, an eighth vertex, a ninth vertex, and a tenth vertex, wherein:
the first vertex and the second vertex are coupled by a first edge of the lattice cell;
the second vertex and the third vertex are coupled by a second edge of the lattice cell;
the fifth vertex and the sixth vertex are coupled by a third edge of the lattice cell;
the sixth vertex and the seventh vertex are coupled by a fourth edge of the lattice cell;

the eighth vertex and the ninth vertex are coupled by a fifth edge of the lattice cell;

the ninth vertex and the tenth vertex are coupled by a sixth edge of the lattice cell;

the first vertex and the fifth vertex are coupled by a seventh edge of the lattice cell;

the third vertex and the seventh vertex are coupled by an eighth edge of the lattice cell;

the fourth vertex and the ninth vertex are coupled by a ninth edge of the lattice cell;

the second vertex and the fourth vertex are coupled by a tenth edge of the lattice cell;

the fifth vertex and the eighth vertex are coupled by an eleventh edge of the lattice cell;

the seventh vertex and the tenth vertex are coupled by a twelfth edge of the lattice cell;

the first edge, the second edge, the third edge, the fourth edge, the fifth edge, the sixth edge, the seventh edge, the eighth edge, the ninth edge, the tenth edge, the eleventh edge, and the twelfth edge are distinct from one another;

the first vertex, the second vertex, the fourth vertex, the ninth vertex, the eighth vertex, and the fifth vertex define a first face;

the second vertex, the third vertex, the seventh vertex, the tenth vertex, the ninth vertex, and the fourth vertex define a second face;

the first vertex, the second vertex, the third vertex, the seventh vertex, the sixth vertex, and the fifth vertex define a third face;

the fifth vertex, the sixth vertex, the seventh vertex, the tenth vertex, the ninth vertex, and the eighth vertex define a fourth face; and the first face, the second face, the third face, and the fourth face are distinct from one another.

2. The method of claim 1, wherein:
each lattice cell of the plurality of contiguous lattice cells has a shape that corresponds to the particular lattice cell.

3. The method of claim 1, wherein:
the particular lattice cell does not have a shape of a convex polyhedron.

4. A method, comprising:
obtaining a fault-tolerant quantum cluster state with a plurality of entangled qubits represented by a lattice structure, the lattice structure including a plurality of contiguous lattice cells, a particular pair of adjacent lattice cells having fourteen distinct vertices that include a first vertex, a second vertex, a third vertex, a fourth vertex, a fifth vertex, a sixth vertex, a seventh vertex, an eighth vertex, a ninth vertex, a tenth vertex, an eleventh vertex, a twelfth vertex, a thirteenth vertex, and a fourteenth vertex, wherein:

the first vertex and the second vertex are coupled by a first edge;

the second vertex and the third vertex are coupled by a second edge;

the fifth vertex and the sixth vertex are coupled by a third edge;

the sixth vertex and the seventh vertex are coupled by a fourth edge;

the eighth vertex and the ninth vertex are coupled by a fifth edge;

the ninth vertex and the tenth vertex are coupled by a sixth edge;

the first vertex and the fifth vertex are coupled by a seventh edge;

the third vertex and the seventh vertex are coupled by an eighth edge;

the fourth vertex and the ninth vertex are coupled by a ninth edge;

the second vertex and the fourth vertex are coupled by a tenth edge;

the fifth vertex and the eighth vertex are coupled by an eleventh edge;

the seventh vertex and the tenth vertex are coupled by a twelfth edge;

the third vertex and the eleventh vertex are coupled by a thirteenth edge;

the fourth vertex and the twelfth vertex are coupled by a fourteenth edge;

the twelfth vertex and the thirteenth vertex are coupled by a fifteenth edge;

the tenth vertex and the fourteenth vertex are coupled by a sixteenth edge;

the thirteenth vertex and the fourteenth vertex are coupled by a seventeenth edge;

the eleventh vertex and the thirteenth vertex are coupled by an eighteenth edge;

the first edge, the second edge, the third edge, the fourth edge, the fifth edge, the sixth edge, the seventh edge, the eighth edge, the ninth edge, the tenth edge, the eleventh edge, the twelfth edge, the thirteenth edge, and the fourteenth edge are distinct from one another;

the first vertex, the second vertex, the fourth vertex, the ninth vertex, the eighth vertex, and the fifth vertex define a first face;

the second vertex, the third vertex, the seventh vertex, the tenth vertex, the ninth vertex, and the fourth vertex define a second face;

the first vertex, the second vertex, the third vertex, the seventh vertex, the sixth vertex, and the fifth vertex define a third face;

the fifth vertex, the sixth vertex, the seventh vertex, the tenth vertex, the ninth vertex, and the eighth vertex define a fourth face;

the second vertex, the third vertex, the eleventh vertex, the thirteenth vertex, the twelfth vertex, and the fourth vertex define a sixth face;

the fourth vertex, the twelfth vertex, the thirteenth vertex, the fourteenth vertex, the tenth vertex, and the ninth vertex define a sixth face;

the third vertex, the eleventh vertex, the thirteenth vertex, the fourteenth vertex, the tenth vertex, and the seventh vertex define a seventh face; and the first face, the second face, the third face, the fourth face, the fifth face, the sixth face, and the seventh face are distinct from one another.

5. The method of claim 4, wherein:
a respective pair of vertices of the fourteen vertices corresponds to a respective vertex of a cube.

6. A method, comprising:
obtaining a fault-tolerant quantum cluster state with a plurality of entangled qubits represented by a lattice structure, the lattice structure including a plurality of contiguous lattice cells, a particular lattice cell including fourteen distinct vertices that include a first vertex, a second vertex, a third vertex, a fourth vertex, a fifth vertex, a sixth vertex, a seventh vertex, an eighth vertex, a ninth vertex, a tenth vertex, an eleventh vertex, a twelfth vertex, a thirteenth vertex, and a fourteenth vertex, wherein:

the first vertex and the second vertex are coupled by a first edge of the lattice cell;
the second vertex and the third vertex are coupled by a second edge of the lattice cell;
the third vertex and the fourth vertex are coupled by a third edge of the lattice cell;
the fourth vertex and the fifth vertex are coupled by a fourth edge of the lattice cell;
the fifth vertex and the sixth vertex are coupled by a fifth edge of the lattice cell;
the sixth vertex and the seventh vertex are coupled by a sixth edge of the lattice cell;
the seventh vertex and the eighth vertex are coupled by a seventh edge of the lattice cell;
the eighth vertex and the ninth vertex are coupled by an eighth edge of the lattice cell;
the ninth vertex and the tenth vertex are coupled by a ninth edge of the lattice cell;
the tenth vertex and the first vertex are coupled by a tenth edge of the lattice cell;
the first vertex and the eleventh vertex are coupled by an eleventh edge of the lattice cell;
the eleventh vertex and the twelfth vertex are coupled by a twelfth edge of the lattice cell;
the twelfth vertex and the thirteenth vertex are coupled by a thirteenth edge of the lattice cell;
the thirteenth vertex and the fourteenth vertex are coupled by a fourteenth edge of the lattice cell;
the fourteenth vertex and the sixth vertex are coupled by a fifteenth edge of the lattice cell;
the first edge, the second edge, the third edge, the fourth edge, the fifth edge, the sixth edge, the seventh edge, the eighth edge, the ninth edge, the tenth edge, the eleventh edge, the twelfth edge, the thirteenth edge, the fourteenth edge, and the fifteenth edge are distinct from one another;
the first vertex, the second vertex, the third vertex, the fourth vertex, the fifth vertex, the sixth vertex, the seventh vertex, the eighth vertex, the ninth vertex, and the tenth vertex define a first face;
the first vertex, the second vertex, the third vertex, the fourth vertex, the fifth vertex, the sixth vertex, the fourteenth vertex, the thirteenth vertex, the twelfth vertex, and the eleventh vertex define a second face that is distinct from the first face; and
the first vertex, the tenth vertex, the ninth vertex, the eighth vertex, the seventh vertex, the sixth vertex, the fourteenth vertex, the thirteenth vertex, the twelfth vertex, and the eleventh vertex define a third face that is distinct from the first face and the second face.

7. The method of claim 6, wherein:
each lattice cell of the plurality of contiguous lattice cells has a shape that corresponds to the particular lattice cell.

8. The method of claim 6, wherein:
the particular lattice cell does not have a shape of a convex polyhedron.

9. A method, comprising:
obtaining a fault-tolerant quantum cluster state with a plurality of entangled qubits represented by a lattice structure, the lattice structure including a plurality of contiguous lattice cells, a respective set of contiguous lattice cells having eight sets of vertices, each set of vertices of the eight sets of vertices having one or more vertices,
a first set of vertices the eight sets of vertices coupled to a second set of vertices of the eight sets of vertices,
the second set of vertices coupled to a third set of vertices of the eight sets of vertices,
the third set of vertices coupled to a fourth set of vertices of the eight sets of vertices,
the fourth set of vertices coupled to the first set of vertices,
a fifth set of vertices of the eight sets of vertices coupled to a sixth set of vertices of the eight sets of vertices,
the sixth set of vertices coupled to a seventh set of vertices of the eight sets of vertices,
the seventh set of vertices coupled to an eighth set of vertices of the eight sets of vertices,
the eighth set of vertices coupled to the fifth set of vertices,
the first set of vertices coupled to the fifth set of vertices,
the second set of vertices coupled to the sixth set of vertices,
the third set of vertices coupled to the seventh set of vertices,
the fourth set of vertices coupled to the eighth set of vertices,
the first set of vertices, the second set of vertices, the third set of vertices, and the fourth set of vertices defining a first face,
the fifth set of vertices, the sixth set of vertices, the seventh set of vertices, and the eighth set of vertices defining a second face that is distinct from the first face,
the first set of vertices, the second set of vertices, the sixth set of vertices, and the fifth set of vertices defining a third face that is distinct from the first face and the second face,
the second set of vertices, the third set of vertices, the seventh set of vertices, and the sixth set of vertices defining a fourth face that is distinct from the first face, the second face, and the third face,
the third set of vertices, the fourth set of vertices, the eighth set of vertices, and the seventh set of vertices defining a fifth face that is distinct from the first face, the second face, the third face, and the fourth face, and
the fourth set of vertices, the first set of vertices, the fifth set of vertices, and the eighth set of vertices defining a sixth face that is distinct from the first face, the second face, the third face, the fourth face, and the fifth face,
wherein at least one of the following is satisfied:
at least one set of vertices of the eight sets of vertices has two or more vertices; and
the eight sets of vertices define one or more additional faces that are distinct from the first face, the second face, the third face, the fourth face, the fifth face, and the sixth face.

10. The method of claim 9, wherein:
the eight sets of vertices define a seventh face that is distinct from the first face, the second face, the third face, the fourth face, the fifth face, and the sixth face; and
at least one set of vertices of the eight sets of vertices has two or more vertices.

11. The method of claim 10, wherein:

the seventh face is defined by the first set of vertices, the second set of vertices, the fourth set of vertices, the sixth set of vertices, the seventh set of vertices, and the eighth set of vertices.

12. The method of claim 10, wherein:

each set of vertices of the eight sets of vertices has two or more vertices.

13. The method of claim 9, wherein:

the eight sets of vertices define:
- a seventh face that is distinct from the first face, the second face, the third face, the fourth face, the fifth face, and the sixth face;
- an eighth face that is distinct from the first face, the second face, the third face, the fourth face, the fifth face, the sixth face, and the seventh face; and
- a ninth face that is distinct from the first face, the second face, the third face, the fourth face, the fifth face, the sixth face, the seventh face, and the eighth face; and at least one set of vertices of the eight sets of vertices has two or more vertices.

14. The method of claim 13, wherein:

at least one set of vertices of the eight sets of vertices has three or more vertices.

15. The method of claim 13, wherein:

each set of vertices of the eight sets of vertices has two or more vertices.

16. The method of claim 9, wherein:

the eight sets of vertices define four or more additional faces that are distinct from the first face, the second face, the third face, the fourth face, the fifth face, and the sixth face; and/or at least one set of vertices of the eight sets of vertices has four or more vertices.

* * * * *